United States Patent
Kanarellis et al.

(10) Patent No.: US 11,462,934 B2
(45) Date of Patent: Oct. 4, 2022

(54) PREMISES SECURITY SYSTEM WITH POWER OVER ETHERNET HAVING AN UNINTERRUPTIBLE POWER SUPPLY AND UNINTERRUPTIBLE INTERNET CONNECTIVITY

(71) Applicant: BTU RESEARCH LLC, Houston, TX (US)

(72) Inventors: Michael Kanarellis, Houston, TX (US); Charles I. McAndrew, Magnolia, TX (US); John Drier, Sarasota, FL (US); Kenny Swatzel, Magnolia, TX (US)

(73) Assignee: BTU RESEARCH LLC, Houston, TX (US)

( * ) Notice: Subject to any disclaimer, the term of this patent is extended or adjusted under 35 U.S.C. 154(b) by 62 days.

(21) Appl. No.: 16/821,778

(22) Filed: Mar. 17, 2020

(65) Prior Publication Data
US 2020/0235607 A1    Jul. 23, 2020

Related U.S. Application Data

(63) Continuation of application No. PCT/US2018/052309, filed on Sep. 21, 2018.

(51) Int. Cl.
| | | |
|---|---|---|
| *H02J 9/06* | (2006.01) | |
| *G01R 19/165* | (2006.01) | |
| *G01R 19/25* | (2006.01) | |
| *G06F 13/40* | (2006.01) | |
| *G06F 13/42* | (2006.01) | |
| *H02J 7/02* | (2016.01) | |
| *H04B 7/185* | (2006.01) | |
| *H04L 12/10* | (2006.01) | |
| *H04L 41/0654* | (2022.01) | |

(Continued)

(52) U.S. Cl.
CPC ........ *H02J 9/061* (2013.01); *G01R 19/16528* (2013.01); *G01R 19/2513* (2013.01); *G06F 13/4068* (2013.01); *G06F 13/4247* (2013.01); *H02J 7/02* (2013.01); *H04B 7/18582* (2013.01); *H04B 7/18597* (2013.01); *H04L 12/10* (2013.01); *H04L 41/0672* (2013.01); *H04L 43/0811* (2013.01); *H04L 43/0817* (2013.01)

(58) Field of Classification Search
CPC ... G06F 1/30; G06F 1/266; G06F 1/26; G06F 13/4068; G06F 13/4247; H04N 5/63; H02J 9/061
See application file for complete search history.

(56) References Cited

U.S. PATENT DOCUMENTS

| | | | | |
|---|---|---|---|---|
| 9,438,845 | B2* | 9/2016 | Herzel | H04N 5/63 |
| 9,735,618 | B2* | 8/2017 | Kanarellis | H04L 12/10 |
| 10,916,965 | B2* | 2/2021 | Kanarellis | H02J 9/061 |

(Continued)

FOREIGN PATENT DOCUMENTS

| | | |
|---|---|---|
| EP | 2801972 A1 | 11/2014 |
| RU | 119918 U1 | 8/2012 |

*Primary Examiner* — Raymond N Phan
(74) *Attorney, Agent, or Firm* — Craft Chu PLLC; Andrew W. Chu

(57) ABSTRACT

The mill for spice products, in particular such as cinnamon sticks, houses a reservoir for storing the spice product. The reservoir communicates through a passage, with a grinding mechanism. The reservoir includes a mechanism for fragmenting the spice product. The mechanism for fragmenting are defined by a crusher of the spice product.

16 Claims, 15 Drawing Sheets

(51) Int. Cl.
    *H04L 43/0811*     (2022.01)
    *H04L 43/0817*     (2022.01)

(56) References Cited

U.S. PATENT DOCUMENTS

| | | | | |
|---|---|---|---|---|
| 2005/0229016 | A1* | 10/2005 | Addy | G06F 1/30 323/205 |
| 2006/0133368 | A1* | 6/2006 | Tolliver | H04L 12/44 370/389 |
| 2008/0114997 | A1* | 5/2008 | Chin | H04L 12/10 713/321 |
| 2012/0287774 | A1 | 11/2012 | Hinkle et al. | |
| 2014/0313882 | A1 | 10/2014 | Rucker et al. | |
| 2015/0215131 | A1* | 7/2015 | Paul | H04L 12/10 713/300 |
| 2018/0013319 | A1* | 1/2018 | Kanarellis | H02J 7/0024 |
| 2019/0013696 | A1* | 1/2019 | Kanarellis | H02J 9/061 |
| 2020/0096550 | A1* | 3/2020 | Goergen | G01R 31/11 |
| 2020/0235605 | A1* | 7/2020 | Kanarellis | H02J 9/061 |

\* cited by examiner

TRANSPORTATION ENVIRONMENT – AIR TRAVEL 800

Parking 802
entry/exit gates
ticket dispensing
payment kiosks
vehicle (license) detection and tracking
Lighting
autonomous vehicles
[UPoE]

Passenger Check-in 808
flight information
kiosks
bag drop terminal
boarding pass scanner
bag drop scale
conveyor sensing
[UPoE]

Passenger & crew Boarding 812
gate door lock/unlock
boarding pass scanner
gate terminal
agent communication
flight status screen
tagging carry on at the gate (checking it)
[UPoE]

Passenger Security Screening 810
passport / ID scanning device
agent communications
x-ray scanner
xray, terminal, operator communication, conveyer
metal detector pass-through
body scanner
hand-held metal detector
secondary scans (explosives, etc) and terminals
[UPoE]

In-flight 814
PoE reduces in-flight weight
Flight surfaces control – weather/water proof
Landing gear sensing
loads more sensing, etc
Cabin lighting
In-seat lighting
In-seat airflow
In-seat power
[UPoE]

Terminal access 804
passengers
staff
crew
[UPoE]

Air traffic control 816
Communications
Ground traffic sensors
Radar
[UPoE]

Secure area access 806
badge scan
door lock/unlock
people sensors (# through the door)
crew
Staff
facial recognition
[UPoE]

PREMISES SECURITY SYSTEM WITH POWER OVER ETHERNET HAVING AN UNINTERRUPTIBLE POWER SUPPLY AND UNINTERRUPTIBLE INTERNET CONNECTIVITY

CROSS-REFERENCE TO RELATED APPLICATIONS

See Application Data Sheet.

STATEMENT REGARDING FEDERALLY SPONSORED RESEARCH OR DEVELOPMENT

Not applicable.

THE NAMES OF PARTIES TO A JOINT RESEARCH AGREEMENT

Not applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable.

STATEMENT REGARDING PRIOR DISCLOSURES BY THE INVENTOR OR A JOINT INVENTOR

Not applicable.

BACKGROUND OF THE INVENTION

1. Field of the Invention

The present invention relates to systems and methods for supplying uninterruptible power to a Power over Ethernet (PoE) device. More particularly, the present invention relates to a PoE backup system with a wireless internet backup.

2. Description of Related Art Including Information Disclosed Under 37 CFR 1.97 and 37 CFR 1.98

A "Power over Ethernet" device is a powered device that works on electrical power supplied by an Ethernet cable. Power over Ethernet ("PoE") describes a technique to deliver electrical power via Ethernet cabling. A single cable transmits data and electrical power to devices, such as IP security cameras, network webcams, wireless access points, VoIP phones, network routers and others. There is no need for a separate power source for the PoE device. IEEE PoE standards set signaling standards for power source equipment, the actual power source, and the powered device, so that the powered devices and power source equipment can communicate. The power source equipment and powered device detect each other and regulate the amount of power supplied to the PoE device. By IEEE PoE standards, there is only a limited power transmission available through an Ethernet cable.

An uninterruptible power supply "("UPS"), or uninterruptible power source, provides emergency power to a powered device when the main power source is disrupted. The UPS is an immediate and generally instantaneous alternative power supply available as soon as the main power source fails. In contrast, a standby or emergency system is a separate power source, which must be activated and then switched over to supply the powered device. The immediacy and lack of delay are important for sensitive electronic equipment and continuous data processing.

The UPS protects powered devices from loss of data, loss of status information related to the powered device, and the subsequent costs associated with repair and resetting of the powered device. Those extra costs avoided can include delays in data processing, sending technicians off site to the location of the powered device, and loss of revenue from downtime of the system. UPS also prevents disruption of the software of a powered device. An unexpected loss of power may necessitate a re-boot or restart of the system, causing more delay and downtime beyond the downtime caused by the disruption of power.

An unexpected loss of power may also disrupt internet connectivity. The powered devices providing internet connectivity can lose power and sever the internet connection because of the unexpected loss of power. Wireless internet backup protects the internet-dependent powered devices or any powered device using internet connectivity at the time of a power outage. Wireless internet backup can prevent loss of data, loss of status information, and the subsequent costs associated with re-establishing internet connectivity.

These and other objectives and advantages of the present invention will become apparent from a reading of the attached specifications.

BRIEF SUMMARY OF THE INVENTION

Disclosed in this document is a system and method for supplying an uninterruptible PoE injection device comprising a rechargeable power supply that automatically provides power to connected devices on the DC side in the event of a loss of primary power to the system. The system may include capabilities for self-controlled power management, network routing and switching, network (e.g., Internet) connectivity (including maintenance of connectivity in case of loss of power), redundancy, security system integration, and load support expandability in a wide range of form factors (e.g., modular, system, board, environmentally sealed, waterproof, and the like), configurations (e.g., parallel, daisy-chained, serial, mesh networked, and the like) and performance levels (e.g., providing various levels of output power, various response times to outage events, and the like). The capabilities, form factors, configurations and/or performance levels, or other parameters, may, in embodiments, be user configured. In embodiments, the device includes a wireless networking capability (e.g., cellular) that automatically provides Internet connectivity to the connected devices in the event of a loss of wired Internet connectivity to the system, such as resulting from a power failure or other loss of network connection.

An embodiment of the present invention includes a method of uninterruptible PoE and Internet connectivity. The method includes: providing a power over Ethernet injector device configured to receive power from at least one of a rechargeable power supply and a primary power source; detecting variations in the primary power source voltage and generating a primary power fault signal when the variation exceeds a primary power validity voltage range; redirecting power provided to the Ethernet injection device from the primary power source to the rechargeable power supply based on the primary power fault signal; detecting variation in Internet connectivity to at least one device served by the Ethernet injection device and generating an Internet connectivity fault signal when the variation in Internet connectivity exceeds a connection fault threshold; and automatically providing Internet connectivity to devices connected to the Ethernet injection device responsive to at least one of the primary power fault signal and the Internet connectivity fault signal.

Another embodiment of the present invention includes a system of uninterruptible power over Ethernet and backup Internet connectivity. The system comprises: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; an Internet connectivity monitoring circuit that detects variation in Internet connectivity of the system and generates an Internet connectivity fault signal when the variation in Internet connectivity exceeds a connection fault threshold; and an Internet wireless connectivity device that automatically provides Internet connectivity to devices connected to the injection device responsive to at least one of the primary power fault signal and the Internet connectivity fault signal.

In some embodiments, the power control circuit that redirects power comprises hardware-only circuits that redirect the power independent of device firmware executing on a processor of the system. The Internet connectivity monitoring circuit and the Internet connectivity device can receive power from at least one of the primary power provided to the system and the rechargeable power supply power based on the primary power fault signal. The Internet connectivity monitoring circuit can monitor an Internet connection wired to the system. The Internet connectivity monitoring circuit can monitor Internet activity over a Local Area Network Internet connection wired to the system, Internet activity over a Controller Area Network Internet connection wired to the system, Internet activity over a Metropolitan Area Network Internet connection wired to the system, Internet activity over a Wide Area Network Internet connection wired to the system, or Internet activity over a trunk port Internet connection wired to the system. The system can automatically provide Internet connectivity through a satellite communication interface that is activated responsive to at least one of the primary power fault signal and the Internet connectivity fault signal. The system can automatically provide Internet connectivity through a cellular communication interface that is activated responsive to at least one of the primary power fault signal and the Internet connectivity fault signal. The system can also automatically provide Internet connectivity through an optical network terminal communication interface that is activated responsive to at least one of the primary power fault signal and the Internet connectivity fault signal. The system can automatically provide Internet connectivity through a WiFi communication interface that is activated responsive to at least one of the primary power fault signal and the Internet connectivity fault signal.

Embodiments of the present invention includes a system of backup power over Ethernet and Internet connectivity, comprising: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a backup power source circuit that enables the Ethernet injection device to provide power to devices connected to the Ethernet injection device from the rechargeable power supply based on a primary power fault signal; an Internet connectivity monitoring circuit that detects variation in Internet connectivity of the system and generates an Internet connectivity fault signal when the variation in Internet connectivity exceeds a connection fault threshold; and an Internet wireless connectivity device that automatically provides Internet connectivity to devices connected to the injection device responsive to at least one of the primary power fault signal and the Internet connectivity fault signal.

In some embodiments, the Internet connectivity monitoring circuit and the Internet connectivity device can receive power from at least one of the primary power provided to the system and the rechargeable power supply power based on the primary power fault signal. The Internet connectivity monitoring circuit can monitor an Internet connection wired to the system. The Internet connectivity monitoring circuit can also monitor Internet activity over a Local Area Network Internet connection wired to the system, Internet activity over a Controller Area Network Internet connection wired to the system, Internet activity over a Metropolitan Area Network Internet connection wired to the system, Internet activity over a Wide Area Network Internet connection wired to the system, or Internet activity over a trunk port Internet connection wired to the system. The system can automatically provide Internet connectivity through a satellite communication interface that is activated responsive to at least one of the primary power fault signal and the Internet connectivity fault signal, Internet connectivity through a cellular communication interface that is activated responsive to at least one of the primary power fault signal and the Internet connectivity fault signal, Internet connectivity through an optical network terminal communication interface that is activated responsive to at least one of the primary power fault signal and the Internet connectivity fault signal, or Internet connectivity through a WiFi communication interface that is activated responsive to at least one of the primary power fault signal and the Internet connectivity fault signal.

Embodiments of the present invention include a system of uninterruptible power over Ethernet and uninterruptible Internet connectivity, comprising: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; an Internet connectivity monitoring circuit that monitors primary Internet connectivity of the system and switches from the primary Internet connection to a secondary Internet connection when the Internet connectivity monitoring circuit detects a fault in the primary Internet connection that exceeds an Internet connection fault threshold.

In some embodiments, the Internet connectivity monitoring circuit, the primary Internet connection and the secondary Internet connection can receive power from at least one of the primary power provided to the system and the rechargeable power supply power based on the primary power fault signal. The Internet connectivity monitoring circuit can monitor an Internet connection wired to the system. The Internet connectivity monitoring circuit can also monitor Internet activity over a Local Area Network Internet connection wired to the system, Internet activity over a Controller Area Network Internet connection wired to the system, Internet activity over a Metropolitan Area Network Internet connection wired to the system, Internet activity over a Wide Area Network Internet connection wired to the system, or Internet activity over a trunk port Internet connection wired to the system. The secondary Internet connection can occur through a satellite communication interface that is activated responsive to at least one of the primary power fault signal and the Internet connectivity fault signal, through a cellular communication interface that is activated responsive to at least one of the primary power fault signal and the Internet connectivity fault signal, through an optical network terminal communication interface that is activated responsive to at least one of the primary power fault signal and the Internet connectivity fault signal, or through a WiFi communication interface that is activated responsive to at least one of the primary power fault signal and the Internet connectivity fault signal.

In another embodiment, a system of uninterruptible power over Ethernet and backup network connectivity, comprises: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; a network connectivity monitoring circuit that detects variation in network connectivity of the system and generates a network connectivity fault signal when the variation in network connectivity exceeds a connection fault threshold; and a plurality of wireless connectivity devices, wherein at least one of the plurality wireless connection devices automatically provides network connectivity to devices connected to the injection device responsive to at least one of the primary power fault signal and the network connectivity fault signal.

In some embodiments of this version, the network connectivity monitoring circuit monitors an Internet connection wired to the system. The network connectivity monitoring circuit can monitor Internet activity over a Local Area Network Internet connection wired to the system, Internet activity over a Controller Area Network Internet connection wired to the system, Internet activity over a Metropolitan Area Network Internet connection wired to the system, Internet activity over a Wide Area Network Internet connection wired to the system, or Internet activity over a trunk port Internet connection wired to the system.

The plurality of wireless connectivity devices can comprise a WiFi device, a satellite device, an optical network terminal device, and a cellular device; and the at least one of the plurality of wireless devices that automatically provides network connectivity is the cellular device, the satellite device, the WiFi device or the optical network terminal device.

Still another embodiment includes a system of uninterruptible power over Ethernet and backup streaming data storage, comprising: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; a data storage facility configured to receive data based on the primary fault signal from at least one device connected to the Ethernet injection device that was streaming data through an Ethernet connection between the device and the system temporal to generating the primary power fault signal. At least one device connected to the Ethernet injection device receives power over Ethernet from the system based on the primary power fault signal.

Another embodiment includes a system of uninterruptible power over Ethernet and multi-cellular connection backup network connectivity, comprising: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; a network connectivity monitoring circuit that detects variation in network connectivity of the system and generates a network connectivity fault signal when the variation in network connectivity exceeds a connection fault threshold; and a cellular connection circuit that is configured to receive a plurality of cellular SIM modules, wherein at least one of the plurality of cellular SIM modules is automatically activated to initiate a cellular network connection that provides network connectivity to devices connected to the injection device responsive to at least one of the primary power fault signal and the network connectivity fault signal.

Yet another embodiment includes a system of uninterruptible power over Ethernet, backup Internet connectivity and network switching, comprising: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; a network switch that facilitates switching data communications among devices connected to the Ethernet injection device; an Internet connectivity monitoring circuit that detects variation in Internet connectivity through the network switch and generates an Internet connectivity fault signal when the variation in Internet connectivity exceeds a connection fault threshold; and an Internet wireless connectivity device that automatically provides Internet connectivity to devices connected to the injection device through the switch responsive to at least one of the primary power fault signal and the Internet connectivity fault signal.

In this embodiment, the Internet connectivity monitoring circuit and the Internet connectivity device can receive power from at least one of the primary power provided to the system and the rechargeable power supply power based on the primary power fault signal. The Internet connectivity monitoring circuit can monitor an Internet connection wired to the system. The Internet connectivity monitoring circuit can also monitor Internet activity over a Local Area Network Internet connection wired to the system, Internet activity over a Controller Area Network Internet connection wired to the system, Internet activity over a Metropolitan Area Network Internet connection wired to the system, Internet activity over a Wide Area Network Internet connection wired to the system, or Internet activity over a trunk port Internet connection wired to the system. The system can automatically provide Internet connectivity via the switch through a satellite communication interface that is activated responsive to at least one of the primary power fault signal and the Internet connectivity fault signal. Alternatively, the system can automatically provide Internet connectivity via the switch through a cellular communication interface that is activated responsive to at least one of the primary power fault signal and the Internet connectivity fault signal, via the switch through an optical network terminal communication interface that is activated responsive to at least one of the primary power fault signal and the Internet connectivity fault signal, or via the switch through a WiFi communication interface that is activated responsive to at least one of the primary power fault signal and the Internet connectivity fault signal.

Yet another embodiment of the present invention includes a system of uninterruptible power over Ethernet, backup Internet connectivity and user configurable network switching, comprising: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; a network switch that facilitates switching data communications among devices connected to the Ethernet injection device; an Internet connectivity monitoring circuit that detects variation in Internet connectivity through the network switch and generates an Internet connectivity fault signal when the variation in Internet connectivity exceeds a connection fault threshold; an Internet wireless connectivity device that automatically provides Internet connectivity to devices connected to the injection device through the switch responsive to at least one of the primary power fault signal and the Internet connectivity fault signal; and a user interface that enables a user of the user interface to configure at least one of the primary power validity voltage range and the Internet connection fault threshold.

Another alternate embodiment includes a system of uninterruptible power over Ethernet, backup Internet connectivity and user configurable network switching, comprising: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; a network switch that facilitates switching data communications among devices connected to the Ethernet injection device; a primary Internet connection; an Internet connectivity monitoring circuit that detects variation in Internet connectivity of the primary Internet connection through the network switch and generates an Internet connectivity fault signal when the variation in Internet connectivity exceeds a connection fault threshold; an Internet wireless connectivity device that automatically provides Internet connectivity to devices connected to the injection device through the switch responsive to at least one of the primary power fault signal and the Internet connectivity fault signal; and a user interface that enables a user of the user interface to configure Internet connectivity of the system as using at least one of the primary Internet connection and the wireless internet connectivity device based on the primary power fault signal.

The system of uninterruptible power over Ethernet, backup Internet connectivity and user configurable network switching includes the Internet connectivity monitoring circuit and the Internet connectivity device receiving power from at least one of the primary power provided to the system and the rechargeable power supply power based on the primary power fault signal. The primary Internet connection can be wired to the system and can be over a Local Area Network Internet connection wired to the system, a Controller Area Network Internet connection wired to the system, a Metropolitan Area Network Internet connection wired to the system, a Wide Area Network Internet connection wired to the system, or a trunk port Internet connection wired to the system.

Still another embodiment includes a system of uninterruptible power over Ethernet, backup Internet connectivity, network switching and SFP port, comprising: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; a network switch that facilitates switching data communications among devices connected to the Ethernet injection device; a small form factor pluggable transceiver port that auto-negotiates a connection when a device connection is detected thereto; an Internet connectivity monitoring circuit that detects variation in Internet connectivity through the network switch and generates an Internet connectivity fault signal when the variation in Internet connectivity exceeds a connection fault threshold; and an Internet wireless connectivity device that automatically provides Internet connectivity to devices connected to the injection device through the switch responsive to at least one of the primary power fault signal and the Internet connectivity fault signal.

The embodiment of the system of uninterruptible power over Ethernet, backup Internet connectivity, network switching and SFP port, includes the small form factor pluggable transceiver port comprising a SFP+ device, or a SFP28 device. The small form factor pluggable transceiver port can be configured as a 100 Gigabit data rate port or as 4 independent 25 Gigabit data rate ports.

Another embodiment includes a system of uninterruptible power over Ethernet, backup Internet connectivity, network switching and auto negotiation port, comprising: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; a network switch that facilitates switching data communications among devices connected to the Ethernet injection device; an auto-negotiation circuit that auto-negotiates a connected when a device connection to the system is detected; an Internet connectivity monitoring circuit that detects variation in Internet connectivity through the network switch and generates an Internet connectivity fault signal when the variation in Internet connectivity exceeds a connection fault threshold; and an Internet wireless connectivity device that automatically provides Internet connectivity to devices connected to the injection device through the switch responsive to at least one of the primary power fault signal and the Internet connectivity fault signal.

Still another embodiment includes a system of uninterruptible power over Ethernet and ONT connectivity, comprising: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; an Optical Network Terminal (ONT) port; and a network switch that facilitates switching data communications among devices connected to the Ethernet injection device and with data communicated over the ONT port. The ONT port and the network switch receive power from at least one of the primary power provided to the system and the rechargeable power supply power based on the primary power fault signal.

In a different embodiment, a system of uninterruptible power over Ethernet and an updatable firmware, comprises: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; an Ethernet connection through which the Ethernet injection device provides power to devices connected thereto; and a processor controlling at least a portion of the system by executing device firmware, wherein power delivery through the Ethernet connection continues uninterrupted while device firmware is updated over the Ethernet connection. For the system of uninterruptible power over Ethernet and an updatable firmware, the at least a portion of the system being controlled by the processor comprises system shutdown based on detection of a power delivery via the Ethernet port fault. The at least a portion of the system being controlled by the processor comprises system shutdown based on detection of a power demand through the Ethernet connection that exceeds a power capacity of the system. The at least a portion of the system being controlled by the processor comprises system shutdown and restart based on detection of a power delivery fault. The at least a portion of the system being controlled by the processor comprises system shutdown and attempting restart up to a configurable number of attempts.

In another embodiment, a system of uninterruptible power over Ethernet and processor synchronizing operation with other systems, comprises: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; an Ethernet connection through which the Ethernet injection device provides power to devices connected thereto; and a processor communicating with at least one other system of uninterruptible power over Ethernet and via the Ethernet connection and coordinating synchronization of power maintenance and shutdown modes thereof.

In another embodiment, a system of uninterruptible power over Ethernet with expandable backup power supply, comprises: an expandable rechargeable power supply configured to support a plurality of power capsules; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; an Ethernet connection; and a processor executing device firmware thereby managing operation of the plurality of power capsules including at least one of activating and deactivating individual power capsules.

For the embodiment of the system of uninterruptible power over Ethernet with expandable backup power supply, the processor communicates device data through the Ethernet connection via a Simple Network Management Protocol. The processor can maintain a Management Information Base (MIB) of device data through the Ethernet connection, the MIB further accessible through a Simple Network Management Protocol. The power capsules in the plurality of power capsules can be disposed in a chained configuration or a stacked configuration. The device firmware causes the processor to execute a configurable sequence of charging of the plurality of power capsules. Each of the plurality of power capsules can comprise a processor executing power capsule firmware that causes the processor to at least one of activate, deactivate, charge, and report status of its corresponding power capsule. Each of the plurality of power capsules includes an individually addressable connection via the Ethernet interface.

In still another embodiment, a system of uninterruptible power over Ethernet and shutdown control of individual connected devices, comprises: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; an Ethernet connection through which the Ethernet injection device provides power to devices connected thereto; and a processor controlling at least a portion of the system by executing device firmware and communicating with the devices connected to the system via the Ethernet connection, wherein the processor controls shutdown of individual connected devices.

For the system of uninterruptible power over Ethernet and shutdown control of individual connected devices, the processor controls shutdown of individual connected devices based on power needs of the connected devices, an amount of power remaining in the rechargeable power supply, or at least one of a rule, policy and threshold. The processor can control shutdown of individual connected devices using Simple Network Management Protocol.

In yet another embodiment, a system of uninterruptible power over Ethernet and shutdown control of individual connected devices via a user interface, comprises: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; an Ethernet connection through which the Ethernet injection device provides power to devices connected thereto; a processor controlling at least a portion of the system by executing device firmware and communicating with the devices connected to the system via the Ethernet connection, wherein the processor controls shutdown of individual connected devices; and a user interface through which a user of the user interface controls shutdown of individual devices, configures shutdown schedules, and configures at least one of shutdown rules, policies and thresholds.

Another embodiment includes a system of uninterruptible power over Ethernet in a sealed enclosure, comprising: an enclosure sealed and resistant to the elements. The enclosure comprises: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; an Ethernet connection through which the Ethernet injection device provides power to connected devices, wherein the Ethernet connection is configured to provide a connection to devices that is sealed and resistant to the elements; and a power source control circuit that redirects power provided to the Ethernet injection device from primary power to the rechargeable power supply based on the primary power fault signal. The system of uninterruptible power over Ethernet in a sealed enclosure, can be waterproof or even operate when submerged in water.

In another embodiment of the present invention includes a system of uninterruptible power over Ethernet with small power supply, comprising: a rechargeable power supply configured as a set of components mounted to a circuit board, the mounted components and circuit board being no thicker than 0.25 inches; a power over Ethernet injection device attached to the rechargeable power supply; a primary power monitoring circuit that detects variation in primary power voltage provided to the system and generates a primary power fault signal when the variation exceeds a primary power validity voltage range; and a power source control circuit that redirects power provided to the Ethernet injection device from primary power to the rechargeable power supply based on the primary power fault signal.

In still another embodiment, a system of uninterruptible power over Ethernet with security system, comprises: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; an Ethernet interface through which the Ethernet injection device delivers power to a user authentication and access control system; and a processor executing device firmware and coordinating activities of the user authentication and access control system over the Ethernet interface. For the system of uninterruptible power over Ethernet with security system, at least one of the activities of the user authentication and access control system comprises operating magnetic locks or detection and lock activation based thereon.

In another embodiment, a system of uninterruptible power over Ethernet with lighting system, comprises: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; an Ethernet interface through which the Ethernet injection device delivers power to a lighting system; and a processor executing device firmware and coordinating operation of the lighting system over the Ethernet interface. For the system of uninterruptible power over Ethernet with lighting system, the lighting system can be an emergency LED lighting system and the operation of the emergency LED lighting system is based on the primary power fault signal.

In another embodiment, a system of uninterruptible power over Ethernet with external switch, comprises: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; and an Ethernet interface through which the Ethernet injection device delivers power to a rack mounted network switch.

In still another embodiment, a system of uninterruptible power over Ethernet with external injector, comprises: a rechargeable power supply; an interface to an external power over Ethernet injection device; a primary power monitoring circuit that detects variation in primary power voltage provided to the system and generates a primary power fault signal when the variation exceeds a primary power validity voltage range; and a power source control circuit that directs power through the interface to the eternal power over Ethernet injection device from the rechargeable power supply based on the primary power fault signal.

In another embodiment of the present invention a system of uninterruptible power over Ethernet with conversational agent, comprises: a rechargeable power supply; a power over Ethernet injection device attached to the rechargeable power supply; a primary power monitoring circuit that detects variation in primary power voltage provided to the system and generates a primary power fault signal when the variation exceeds a primary power validity voltage range; a power source control circuit that redirects power provided to the Ethernet injection device from primary power to the rechargeable power supply based on the primary power fault signal; an Ethernet interface through which the Ethernet injection device delivers power to connected devices; and a conversational agent interface that performs authentication of users of the agent interface and facilitates authorized users to control the system via voice commands.

In another embodiment, a system of the present invention comprises: an injection device for providing uninterruptible PoE to a plurality of connected electronic premises security system devices upon detection of loss of primary power; a rechargeable power supply that automatically provides power to connected devices in the event of a loss of primary power; a primary power input port with input loss detection; and a wireless device that automatically provides network connectivity to the connected devices in the event of loss of wired network connectivity. For this system, the wireless device can provide network connectivity by at least one of a cellular network, a Bluetooth™ network, an 802.11 WiFi network, and an orbital satellite, and the wireless device can comprise at least one of a removable internal card and a pluggable external adapter. In some embodiments of the system, the system includes a network switch that facilitates routing at least a portion of the connected devices to at least one of other connected devices, the wireless device, and a primary wired external network port. The system can also have an interface by which a user is enabled to configure the system. a pluggable transceiver port, an Optical Network Terminal interface, or a processor operated by system firmware, wherein the system firmware can be reprogrammed without interrupting automatically providing power to connected devices. The pluggable transceiver port can be comprised of at least one of compact SFP, SFP, SFP+, and SFP28. The system may also include a daisy-chain interface that facilitates synchronizing power maintenance and shutdown modes of the system with systems connected to the daisy-chain or an interface that facilitates connecting a plurality of processor-controlled power capsules that provide a user-configurable amount of backup power available to the connected devices.

These and other systems, methods, objects, features, and advantages of the present disclosure will be apparent to those skilled in the art from the following detailed description of the preferred embodiment and the drawings.

All documents mentioned herein are hereby incorporated in their entirety by reference. References to items in the singular should be understood to include items in the plural, and vice versa, unless explicitly stated otherwise or clear from the text. Grammatical conjunctions are intended to express any and all disjunctive and conjunctive combinations of conjoined clauses, sentences, words, and the like, unless otherwise stated or clear from the context.

BRIEF DESCRIPTION OF THE SEVERAL VIEWS OF THE DRAWINGS

The disclosure and the following detailed description of certain embodiments thereof may be understood by reference to the following figures.

FIG. 8 depicts a block diagram of an airport environment and related electronic systems for deploying uninterruptible PoE via an injection device.

FIG. 16 depicts a user interface that facilitates a user controlling a system for providing uninterruptible PoE.

DETAILED DESCRIPTION OF THE INVENTION

The continuous flow of both power and data are vital to certain PoE devices in real world environments. When emergency and essential services are dependent on these PoE devices, a supply of power and connectivity for data are both important to maintain baseline functioning. Power disruptions and service disruptions affect the PoE devices due to the connections to both a primary power supply and a primary network interface. The present invention incorporates a UPS with coordination between the power supply and the powered device and an uninterruptible connectivity. The PoE device can have uninterruptible power and internet.

Figure 1:
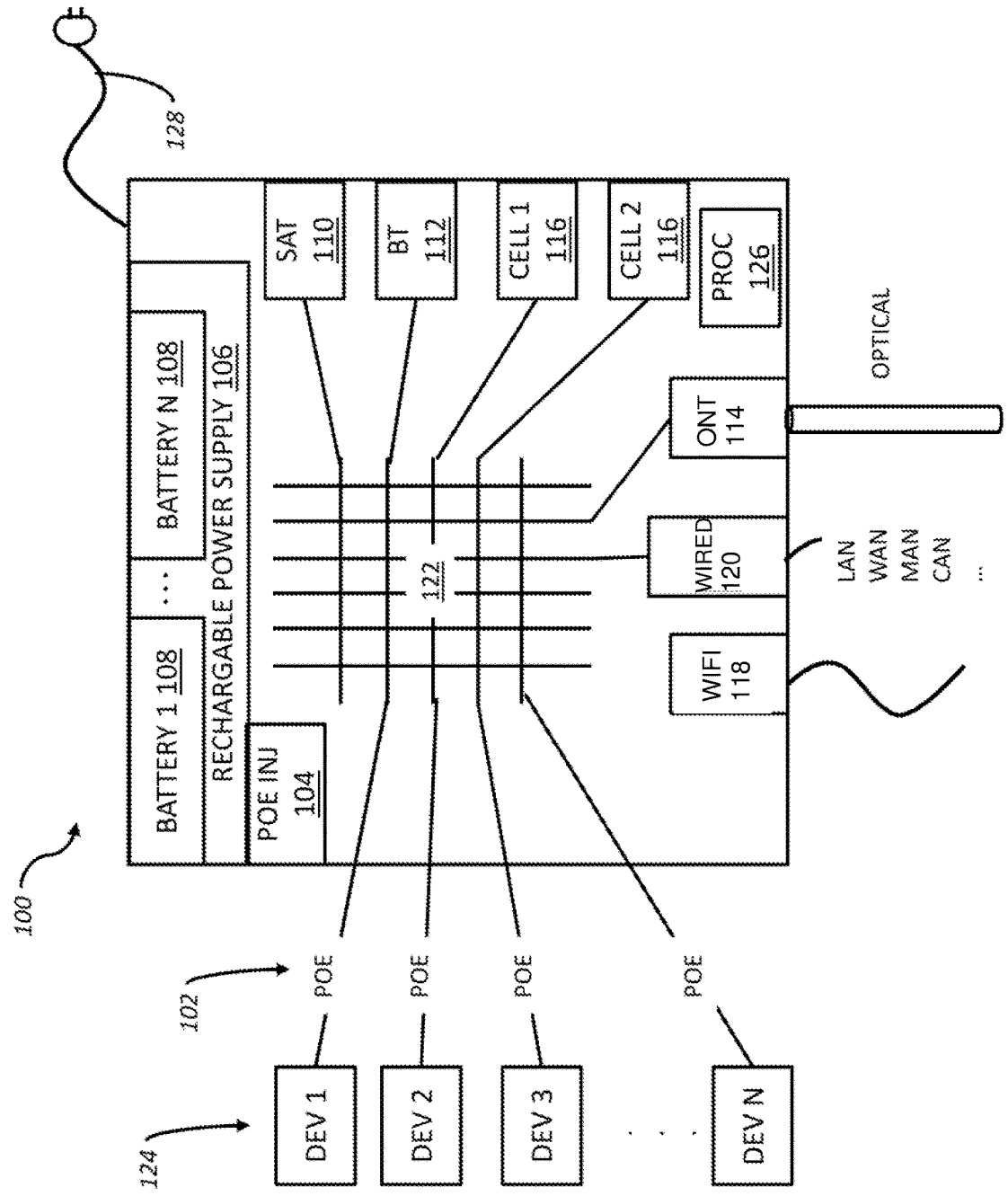
FIG. 1 depicts a system for providing uninterruptible PoE via an injection device with rechargeable power supply, Optical Network Terminal (ONT) interface, wireless port interfaces, wired network interface, and data switch functionality.

Referring to FIG. 1, a power and communication backup system 100 is depicted that facilitates providing uninterruptible Power over Ethernet (PoE) 102. The power and communication backup system 100 may operate to provide PoE via an injection device 104, such as an injection device with rechargeable power supply 106 that may be based on one or more batteries 108. The power and communication backup system 100 may include satellite interface 110, Bluetooth interface 112, Optical Network Terminal interface 114, wireless port interfaces such as cellular interfaces 116 and WiFi interfaces 118, wired network interface 120, and data switch functionality 122.

In an aspect of the methods and systems of PoE backup, a system, such as power and communication backup system 100 depicted in FIG. 1 may be configured to facilitate supplying uninterruptible PoE via an injection device. The system may comprise a rechargeable power supply 106 that automatically provides power to connected devices 124, such as a powered device, such as any of the devices described herein, such as networking devices (e.g., routers, access points and switches, among others, computing devices, lighting devices, security devices, emergency devices (e.g., alarms), and many others), such as on the DC side in the event of a loss of primary power 128 to the system. The system may also comprise a device or component that automatically provides network (e.g., Internet) connectivity to various devices, including the aforementioned types of powered devices, in the event of a loss of wired Internet connectivity to the system. Network connectivity may be provided by various types of wireless networking devices, such as via cellular-type connectivity devices 116, such as 2G, 3G, 4G, LTE, 4.xG, 5G and the like or other types of connectivity, such as satellite network connectivity devices 110, WiFi connectivity devices 118, mesh network connectivity, personal area network connectivity, wide area network connectivity, local area network connectivity, metropolitan area network connectivity, and the like. The cellular-type wireless connection 116 may include access to a plurality of cellular providers, such as by supporting multiple simultaneous provider-specific SIM cards. Multiple cellular provider connectivity may be configured with a primary provider and a secondary provider, wherein the secondary provider may be activated due to primary provider connection-related trouble (e.g., loss of connection, unreliable connection, slow connection and the like). Multiple cellular provider logical interfaces may facilitate greater redundancy than a single cellular provider for backup of wired Internet connectivity. In embodiments, wired Internet connectivity may be provided by a first Internet service provider who may also provide a cellular Internet connectivity service. In such embodiments, the first Internet service provider's cellular connection may be made primary so that it is selected for use when primary power 128 disrupts the wired Internet service.

Network connectivity may alternatively or in addition be provided by Bluetooth 112, such as by connecting a plurality of BT devices in a BT mesh network with at least one access point that facilitates connection to the Internet. Internet connectivity may alternatively or in addition be provided by the wireless device via an orbital satellite link device 110. Each of these wireless Internet connectivity capabilities may be provided as needed or as preferred based on user preferences, system demand versus provider constraints (e.g., bandwidth constraints that are too low for a given application need, and the like), availability, cost of connection, and the like.

In embodiments, control of each wireless port may be coordinated so that power, activation, utilization, security, and the like can be factored into providing a range of backup options for wireless connectivity. In embodiments, the system 100 may be configured with a processor 126 that facilitates control of at least a portion of the wireless ports. Power to the wireless ports (e.g., Bluetooth™, cellular, satellite, and the like) may be managed, such as by the processor 126 controlling the power supply 106 and the like to enable balancing the need for high speed switching when a primary Internet connection fails (e.g., due to primary power 128 loss) with overall power consumption and security considerations. In embodiments, the Bluetooth™ port hardware 112 may be powered up and communicating with an external network while one or more of the cellular 116 and satellite ports 110 are not powered up. In such embodiments, when an urgent loss of external network connection occurs, such as due to a loss of primary power 128, communication may be first directed to the active Bluetooth™ wireless port 112. The other backup wireless ports may be powered on and/or activated when primary power loss is detected; however, providing external network access through these other backup wireless ports may take up to a few seconds or longer to become active. In embodiments, at least one cellular wireless port 116 may be powered on and active even while primary power 128 is present, while other wireless ports, such as other cellular wireless ports 116, Bluetooth™ 112, satellite 110 and the like may remain powered off until a loss of primary power is detected. In embodiments, two different types of wireless port (e.g., Bluetooth™ and satellite) may be powered on and active while primary power is still available (so that an instantaneous, "live" backup is always available in case of unanticipated interruption of power or network connection) and other wireless ports may be powered off until needed. In such embodiments determining which connected devices are routed through the powered up wireless ports may be based on, for example, a bandwidth requirement for communicating with the connected devices. A connected device that requires high bandwidth communications may be routed to the active satellite port. Connected device(s) that have lower communication bandwidth demand may be routed through the active Bluetooth™ wireless port. Additional wireless ports that are available may be powered on and activated upon detection of loss of primary power to facilitate distributing bandwidth demand if needed or desired, and the like.

One or more of the backup wireless ports may be tested while primary power is available to ensure they can be successfully used when primary power is lost. Port testing may include powering on a wireless backup port, and communicating through it with an external resource, such as a web server accessible over the Internet and the like.

In embodiments, a physical or wireless port (e.g., Bluetooth™, cellular, satellite, and the like) of the system for providing uninterruptible PoE may access an external network. Such an external network may be a Local Area Network (LAN), a Campus Area Network (CAN) (such as for a hospital, school, any complex of buildings or the like), a Metropolitan Area Network (MAN) (such as for a city, neighborhood, region, county, zip code, and the like), a Wide Area Network (WAN), a mesh network, an enterprise network, the Internet and the like. Access to external resources, such as the Internet, may be provided through various Internet Service Providers (ISPs), such as Spectrum™, Brighthouse™, Compass™, Xfinity™, Verizon™, and the like. Access points for such providers may be powered by the system for providing uninterruptible PoE (e.g., may be a connected device, powered device and the like) to facilitate continued access to the ISP's network, resources and the like that are still accessible when primary power to a system is lost. In embodiments, such access points may receive primary power through a different port than its Ethernet port, so that detection of loss of primary power prompts the powered device (e.g., the access point as described herein) to switch from a primary power port to its Ethernet port for receiving power.

In embodiments, the range of wireless ports made available by the system for providing uninterruptible PoE may provide connection via a wireless port based on detection of lack of network activity over a primary (e.g., wired external) network port. This may be provided even when primary power is not lost and/or backup PoE is not activated. This type of system may facilitate maintaining access to external networks, the Internet, external resources and the like when network activity is disrupted. In this way, such embodiments provide power-backup, network-backup, data backup, and the like without requiring that primary power be lost. Detection of loss of communication through a network connection may be based on an activity monitor function that monitors network activity, throughput, and the like at least while primary power is available. In embodiments, network activity may be based on a heartbeat or echo-type function that sends network communication to at least one external networked resource and listens for a reply from the external resource. If a reply is received within an echo-type time limit, wireless backup access ports may be deactivated, remain deactivated, placed on ready-standby and the like. If a reply is not received as expected, a validation protocol may be activated that sends network validation communications (e.g., a burst of echo-type communications) and waits for an echo from the external resource over a period of time, such as a few seconds (e.g., approximately one second, two seconds, three seconds, five seconds, ten seconds, thirty seconds, one minute, or the like, depending on the desired user configuration and the requirements of the situation). If a proper echo response is not received, the validation protocol may optionally be repeated. If this repeated validation protocol also fails, one or more of the wireless access ports may be activated to replace the failed primary port so that communications that were being passed through the primary port will be passed through the activated wireless port. The wireless port may be activated prior to detection of a problem with communication over the primary port. The wireless port may be activated when an echo-type time limit expires. The wireless port may be activated when the first validation protocol is performed and/or when it fails. Optionally the wireless port may be activated when the repeated validate protocol is performed and/or when it fails.

In embodiments, any or all of the wireless ports described herein (e.g., Bluetooth™, cellular, satellite and the like) may be powered by the system providing uninterruptible PoE at all times, even when primary power is available. In embodiments, the wireless ports may be powered by the uninterruptible PoE system via an Ethernet connection or via a connection that is independent of an Ethernet connection to the wireless port. For embodiments of the wireless port being integrated with the system for uninterruptible PoE, power may be provided from a rechargeable backup power source directly to the wireless port, such as when the wireless port is a mezzanine card, comprises one or more directly mounted components, is externally connected through other than an Ethernet connection, and the like.

One or more of the wireless ports may be powered on temporarily when primary power is available, such as to validate access through the wireless port to external resources. One or more of the wireless ports may be powered on continuously when primary power is available to facilitate seamless switchover when primary power is lost. In embodiments, a cellular wireless port may be powered on, while a Bluetooth™, second cellular, and/or satellite wireless port may be unpowered or operated only in low power/standby mode while primary power is available. In such embodiments, a wireless port that is already powered on and active when primary power is lost may become the primary backup access port for connected devices and the like. As other wireless ports are powered-up and/or activated (e.g., brought out of standby mode) communication through one or more of these other wireless ports may commence.

In embodiments, the system may provide connection to the Internet via wired connection 120 that may operate while primary power is available. The Internet connection may be switched by the device to the wireless connection when, for example, primary power fails. The wireless device may be activated to establish a connection via cellular, satellite or the like upon loss of primary power to the system. In embodiments, the connection via cellular, satellite or the like may be established prior to loss of primary power to the system to facilitate switching the Internet connection from the wired link to the wireless link. In embodiments, the system may be in digital data communication with multiple wired devices, such as via a switch or router-like functionality that may include providing power to at least a portion of the devices via an Ethernet-like connection between the system and each of the devices.

As depicted in FIG. 1, a power and communication backup system 100 for supplying uninterruptible PoE via an injection device 104 may include a rechargeable power supply 106 that automatically provides power to connected devices 124 on the DC side in the event of a loss of primary power 128 to the system. It may also include, as described above, a cellular wireless device 116 that automatically provides Internet connectivity to the connected devices 124 in the event of a loss of wired 120 Internet connectivity to the system 100. In embodiments, the system 100 may also integrate a wireless 118 802.11 access point to share (or to augment or replace) the cellular wireless Internet access to connected devices. In embodiments, the wireless 118 802.11-compatible access point may facilitate wireless Internet connection to powered devices 124 that, for example due to a loss of primary power 128 no longer have access to the Internet. The 802.11-compatible access point 118 may be integrated into the system 100 that provides the uninterruptible PoE 102 so that upon loss of primary power 128, the 802.11 access point 118 begins to operate as an Internet access point, such as broadcasting network ID and related information to enable powered devices 124 being backed up to utilize this access point 118. Powered devices 124 may be configured with both wired and wireless interfaces that may automatically activate based on the status of each interface. Typically, if both a wired and wireless interface is available to a powered device 124, a networking module of the powered device 124 will likely select the network interface with the highest aggregate throughput, which is often a wired interface. Therefore, when the wired interface is no longer viable (e.g., due to a loss of primary power), the powered device, now being powered by the injection device 104, may logically switch to the wireless interface being provided by the uninterruptible PoE injection device. Internet connectivity may be provided directly by the uninterruptible PoE interface device 100 via its cellular 116, Bluetooth 112, and satellite 110 Internet connectivity features. In an embodiment, a powered device 124 may be communicating over a wired connection when its source of power is lost. The wired connection may be through a third-party device that may or may not be connected with the uninterruptible PoE device 100. Upon loss of primary power, the powered device 124 may continue to operate because it may receive power through an Ethernet connection between it and the uninterruptible PoE device 100/104. However, a device through which it accesses the Internet via a wired connection may not be able to provide that access, such as due to the loss of primary power. The powered device 124, now operating on PoE 102, may begin to communicate with the 802.11 compatible access point 118 operating in the uninterruptible PoE device 100, thereby getting access to the Internet or the like without access to a primary power source 128.

Referring again to FIG. 1, in embodiments, a power and communication backup capable system 100 for supplying uninterruptible PoE via an injection device may include a rechargeable power supply 106 that automatically provides power to connected devices 124 in the event of a loss of primary power to the system, a network switch 122, and a wireless device that automatically provides Internet connectivity to the connected devices in the event of a loss of wired Internet connectivity to the system. The system may include a network switch 122 that facilitates communication among a plurality of connected devices 124 and further facilitates communication from the devices to an external network, such as the Internet. While primary power is available, the switch 122 may provide access to the external network, such as the Internet. In embodiments, the switch 122 may facilitate communication between the connected devices 124 and the Internet via a wired connection 120 from the switch 122 to a device that connects to the Internet or to the Internet directly. Upon primary power loss, a wired Internet connection 120 may be lost and/or may experience unacceptable service performance or interruption (e.g., networking delays that may prevent important or services of the connected devices to be provided on a timely basis, and the like).

The connected devices may be connected to the system 100 for supplying uninterruptible PoE via Ethernet cable(s) that facilitate digital communication between the switch 122 and the connected devices 124 as well as enable providing power to the connected devices from the system for supplying uninterruptible PoE. In embodiments, upon primary power loss, the switch 122 may remain active because the switch 122 may be powered by a battery back-up feature of the system for supplying uninterruptible PoE. However, because the primary powered interface to the Internet may cut out due to lack of primary power 128, the switch 122 may redirect connected device Internet traffic to a wireless access port provided by the system for supplying uninterruptible PoE. The wireless access port may provide access to external networks, such as the Internet via various wireless networks, including without limitation, Bluetooth™ 112, cellular 116 2G, 3G, 4G, 4G+, 5G, and any other type of cellular radio communication system, as well as satellite-based wireless networks. Descriptions and examples of such a wireless access port are provided elsewhere herein. The system 100 for supplying uninterruptible PoE via Ethernet cable(s) may configure the wireless access port to continue to provide the logical connections that were taking place over the wired Internet connection while primary power was still available. Data transmissions that may have been interrupted when primary power was lost may be retried through the wireless access port.

In embodiments, the wireless access port may be active and operational while primary power is still available. Communication by the switch through the wireless access port to destinations, such as network-based servers, URLs, and the like may be performed by the switch while primary power is active to ensure that switch-over from wired to wireless may be done seamlessly and without loss of data.

In embodiments, the wireless access port may comprise a plurality of distinct ports. Examples and description of a wireless access port comprising multiple ports are provided elsewhere in this application. The switch may be configured to access each distinct wireless port (e.g., Bluetooth™, cellular, satellite, and the like) separately so that each may be operated as needed to maintain external network access to the connected devices. As an example, the switch may facilitate connecting one or more of the connected devices to one or more of the wireless ports as well as to the wired external/Internet port. In these embodiments, a first portion of the connected devices receiving PoE from the uninterruptible power supply system may be logically connected via the switch to a Bluetooth™ wireless access port, a second portion of the connected devices may be routed via the switch to one or more of the cellular port(s) and a third portion of the connected devices may be routed by the switch to one or more satellite ports. In embodiments, a fourth portion of the connected may not be routed to the wireless access port, such as based on a business rule associated with the fourth portion of the connected devices. Selection of which ports to activate, which portions of connected devices to route to one or more of the ports, and the like are described elsewhere in this specification.

Referring again to FIG. 1, in embodiments a system for supplying uninterruptible PoE via an injection device may include a rechargeable power supply that automatically provides power to connected devices in the event of a loss of primary power to the system, a network switch, and a wireless device that automatically provides Internet connectivity to the connected devices in the event of a loss of wired Internet connectivity to the system. The system may be user-configurable to use either or both of wired connectivity and wireless connectivity. In embodiments, a user configurable system may enable a user to specific wireless port parameters, such as when a wireless port should be powered on, when a wireless port should be accessed, the number or selection of a group of connected devices to process through a wireless port, one or more service providers for each wireless port, routing protocols for data being communicated by a connected device through each wireless port, and the like. In an example of user configurability, a system for providing uninterruptible PoE may have two wireless ports available, a cellular port and a satellite port. A user of such a system may configure each of the two wireless ports so that when an event indicating that the wireless port(s) are to be used occurs, the user's selected configuration is employed. In the example, the user may configure the cellular port as being powered up continuously even while primary power is available and the satellite port being powered up only when primary power is detected as lost. In this example, the cellular port may be available for backup in the event that primary power is available but a primary external network connection is disrupted, whereas the satellite port may be available only when primary power is lost.

In embodiments, other user configurable parameters may include features that limit which connected devices may access which wireless ports. As an example of such features, a system may provide uninterruptible PoE to two connected devices. One of the devices may be configured to communicate with a particular third-party service, and the other device may be configured to communicate with another third-party service. Each third-party service may have communication agreements with different cellular providers. A user may configure the system to direct communications from one of the devices to its corresponding third-party service over a wireless connection provided through the cellular provider with which the third-party service has a communication agreement. In this way, communication over a wireless cellular connection during primary power loss or as a result of primary network disruption may meet certain user configuration parameters.

Figure 2:
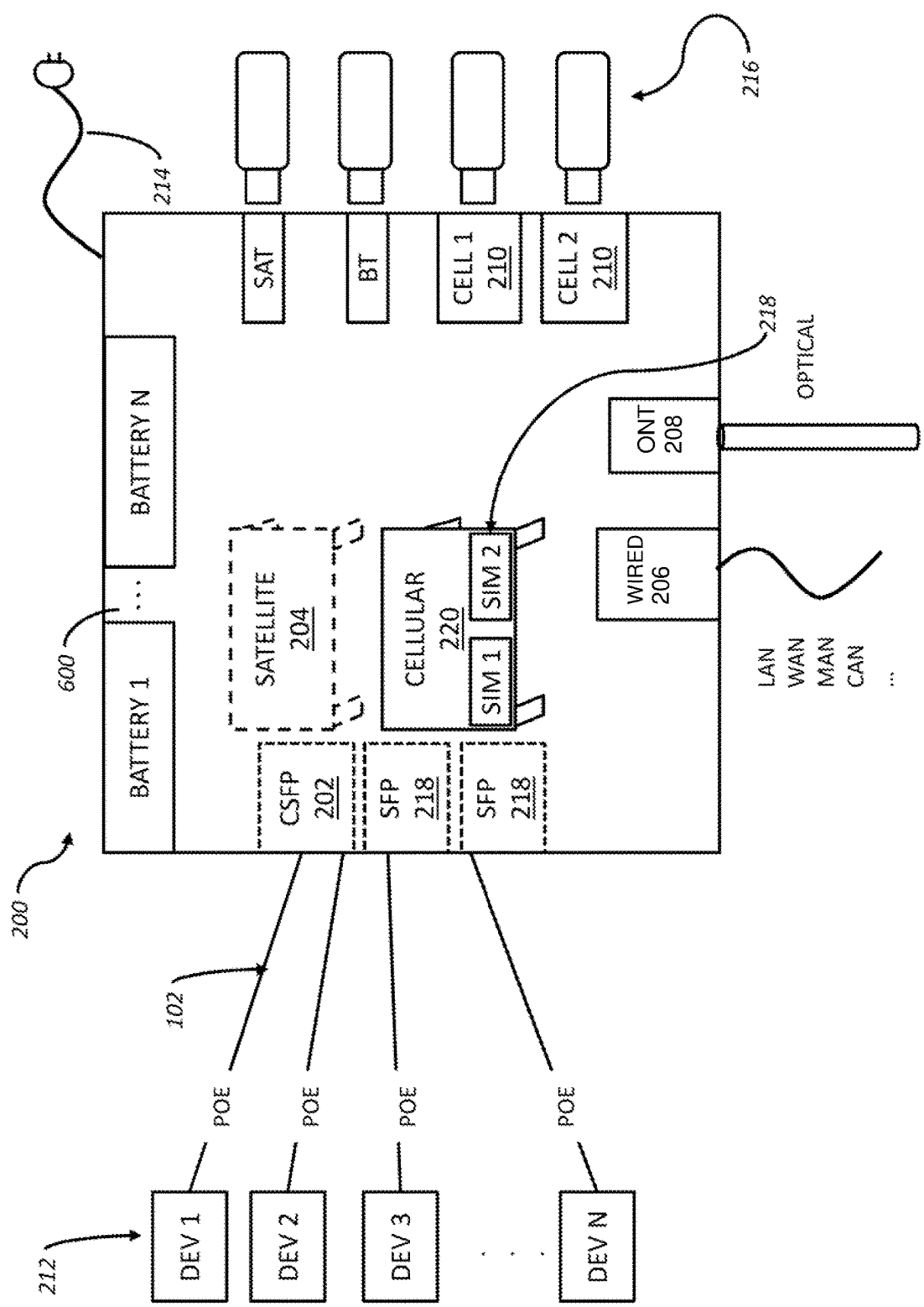
FIG. 2 depicts a system for providing uninterruptible PoE via an injection device with rechargeable power supply, (compact) small form factor ports, modular wireless network interfaces (removable card and external FOB), wired network interface, and ONT interface.

Referring to FIG. 2 a power and communication backup capable system 200 is depicted for providing uninterruptible PoE via an injection device with rechargeable power supply, (compact) small form factor ports 202, modular wireless network interfaces that may include a removable mezzanine card, such as removable satellite card 204 or an external FOB 216 that may provide cellular, Bluetooth, satellite and the like wireless interfaces, wired network interface 206, and ONT interface 208. In embodiments, a system 200 for supplying uninterruptible PoE via an injection device may include a rechargeable power supply that automatically provides power to connected devices on the DC side in the event of a loss of primary power to the system. The system may further include a cellular wireless device 210 that automatically provides Internet connectivity to the connected devices 212 in the event of a loss of wired Internet connectivity to the system, which may be due to loss of primary power 214 or simply loss of wired Internet connectivity. In embodiments, the cellular wireless device 210 may be implemented as a removable cellular card 220 that may be attached to a port, such as an internal port or via an external interface port (e.g., USB, and the like) of the injection device. In embodiments, the removable cellular card 220 may be configured to access a single cellular network provider. In embodiments, the removable cellular card 220 may be configured to access more than one cellular network provider, such as by supporting a plurality of network provider-specific SIM cards 218. The system may alternatively be configured to support multiple cellular wireless interface removable cards, such as through multiple internal ports, multiple USB ports, and the like. In embodiments, the uninterruptible PoE system is an enclosed system that incorporates the cellular interface removable card 220 internally so the enclosed system integrates cellular and uninterruptible PoE.

Referring again to FIG. 2, in embodiments, a system for supplying uninterruptible PoE via an injection device may include a rechargeable power supply that automatically provides power to connected devices in the event of a loss of primary power to the system, a network switch, and a wireless device that automatically provides Internet connectivity to the connected devices in the event of a loss of wired Internet connectivity to the system, where the system integrates a small-form factor pluggable (SFP) transceiver port 218 and auto-negotiates a connection when a device connection is detected. In embodiments, the SFP transceiver port 218 may be an SFP+ transceiver port, an SFP28 transceiver port, a compact SFP transceiver port that supports at least two physical connections, and the like.

In embodiments when a device, such as a connected device 212 or powered device as described herein is connected through an SFP transceiver port 218 to the system 200, the system 200 may automatically configure the port 218 for communicating with and providing power to the device 212 so that when primary power 214 is lost, the SFP-connected device 212 can be provided uninterruptible power over the connection through the SFP port, such as via PoE and the like. Also in embodiments, the connected device 212 and the system 200 for providing uninterruptible PoE that includes a switch 122, such as the switch depicted in FIG. 1, may automatically configure the switch 122 to facilitate routing the connected device 212 to at least one of a plurality of wireless ports to provide external network connectivity when primary power 214 is lost.

Referring again to FIG. 2, in embodiments, a system for supplying an uninterruptible power-over-networking injection device comprising a rechargeable power supply that automatically provides power to connected devices on the DC side in the event of a loss of primary power to the system, and a network switch, which supports both optical and Ethernet connections. Optical connections may include an Optical Network Terminal (ONT) interface 208 that may facilitate connection of optical networks with copper-based networks, such as coaxial cable, twisted pair, and the like connections. In embodiments, a plurality of connected devices 212 may connect to the system 200 via a cable that facilitates providing data communications and power to the connected devices. The system 200 may connect to external networking systems via an optical (e.g., fiber-based) port 208. The system 200 may further facilitate connection between the connected devices 212 and the fiber-connected external systems by operating at least in part as an Optical Network Terminal (ONT) 208. In embodiments, a connected device may connect to the system via a combination of fiber-based and copper-based Ethernet cable connections to facilitate use of the fiber for high speed data communication and the Ethernet cable for providing at least uninterruptible PoE to the connected devices.

Figure 3:
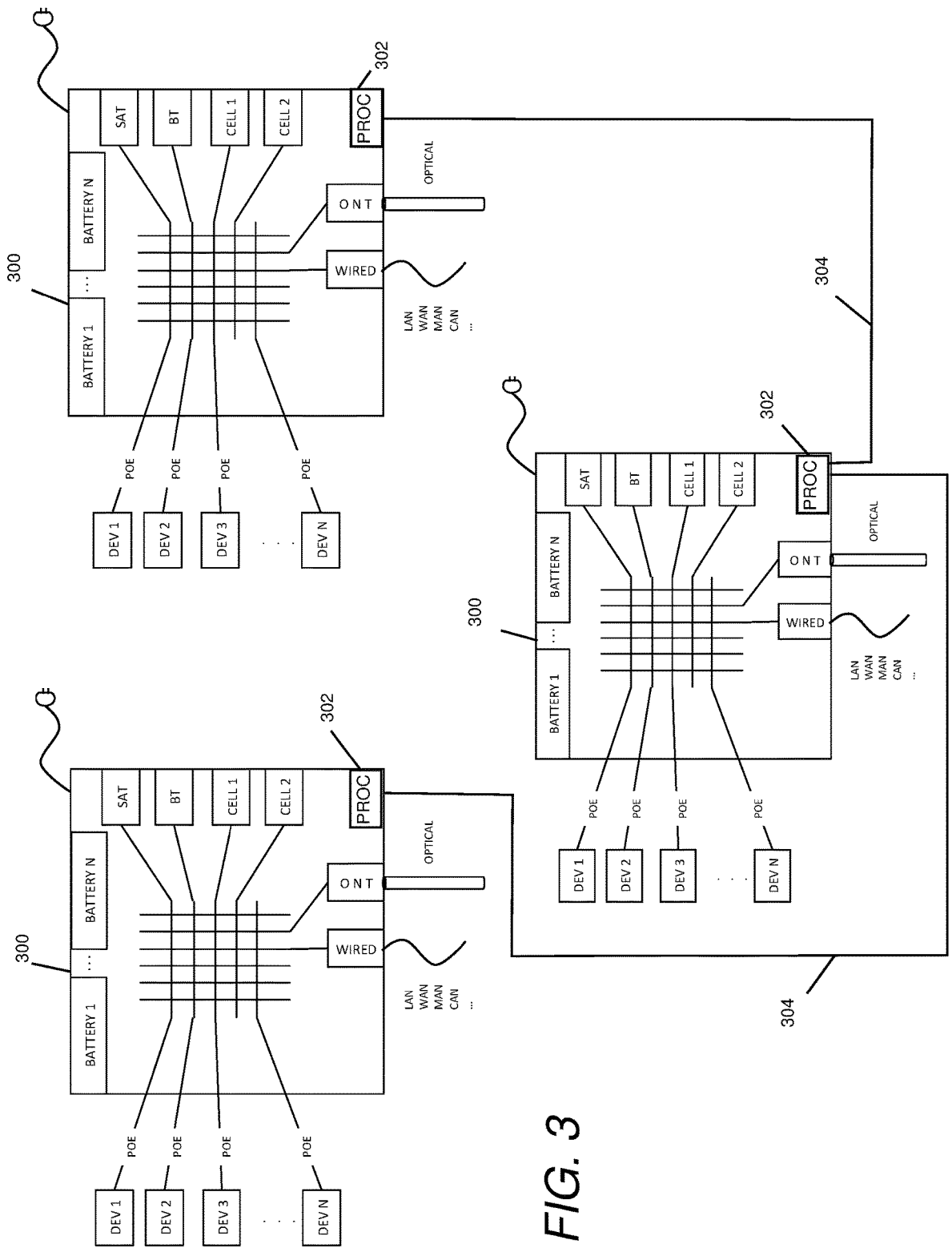
FIG. 3 depicts daisy-chained systems, where each system provides uninterruptible PoE (and optionally uninterruptible network connection) via an injection device.

Referring to FIG. 3 daisy-chained power and communication backup capable systems 300 are depicted for providing uninterruptible PoE via an injection device. In embodiments, a system 300 is provided for supplying an uninterruptible PoE injection device comprising a rechargeable power supply that automatically provides power to connected devices on the DC side in the event of a loss of primary power to the system. The system 300 integrates a microprocessor 302 operated by device firmware and connection 304, such as an Ethernet connection allowing the microprocessor 302 to communicate with other devices on the network. The microprocessor firmware for the system can be reprogrammed via the network without interrupting power delivery to the network.

Portions of the system 300 may be controlled by the processor 302 (such as a microprocessor, application specific integrated circuit (ASIC), field programmable gate array (FPGA) or the like), such as monitoring network integrity, primary power status, backup power charge and usage, powered/connected device configuration and interfacing, configuration and operation of wireless backup network ports, and the like. From time to time, firmware that the processor uses for operation may need to be configured, such as when a change occurs to one or more of the physical configurable elements (e.g., number of backup battery cells, number or type of wireless ports, and the like). In embodiments, the processor firmware may be changed, e.g., reprogrammed via a network connection of the system. The system may be configured, such as with hardware devices that facilitate maintaining PoE independently of the processor firmware being reprogrammed. In such embodiments, PoE may be provided by the system to connected devices, such as via an injection device while the firmware for a processor that may facilitate control of providing PoE may be reprogrammed via the network. In embodiments, reprogramming the firmware over the network may be performed through use of dual firmware storage facilities. The processor may execute the firmware in one of the storage facilities, which may allow the other firmware storage facility to be reprogrammed, such as over the network. In embodiments, the firmware may be reprogrammed over the same network connection through which PoE is being provided. In other embodiments, the processor may execute firmware that is provided over the network without interrupting power delivery to the network. Executing firmware over the network may facilitate reprogramming processor firmware, such as firmware locally accessible by the processor, without disrupting operation of the processor and therefore without interrupting power delivery to the network.

In embodiments, multiple systems may be daisy-chained logically over the network for coordination of providing PoE, power maintenance, shutdown modes and the like. Multiple systems connected together via a common Ethernet connection that also connects at least one device for receiving PoE, may use the data communication capabilities of the network to coordinate activity, such as coordinating when each daisy-chained device should provide PoE via the common Ethernet connection. Processor firmware for coordinating operation on the systems may facilitate a first system providing a data signal over the common Ethernet connection to the other daisy-chained system that indicates the first system is providing PoE. The other daisy-chained systems may respond in acknowledgement. Coordination among the daisy-chained systems may enable the systems to coordinate use of their uninterruptible power sources (e.g., batteries) to extend the duration of backup power by allowing each system to provide as much PoE as it can before one of the other daisy-chained systems provides the PoE. With multiple systems, each system may, in turn, provide PoE while primary power is lost. Coordination may include determining an order of systems to provide PoE, a timing for switching providing PoE from one system to another, timing of systems shutting down due to backup power sources being depleted, and the like.

In embodiments, daisy-chained systems may coordinate operation, such as operation when primary power is lost, while providing PoE to distinct sets of connected devices. Each system may provide power to a separate set of connected devices, while coordination among the systems may facilitate communicating battery backup status and the like that may be further communicated to the connected devices. In an example, an array of connected devices may perform load sharing among them. The array of connected devices may be divided into two or more groups for providing PoE from two or more daisy-chained uninterruptible PoE systems. Coordination among the two or more daisy-chained systems may enable the devices performing load balancing to adjust their load balancing algorithm to ensure that power consumption from each of the PoE systems is also balanced, so that each group of the array of devices can continue to operate as long as possible. Without at least some aspect of this coordination, one or more of the groups of arrays may consume much more power than another of the groups, thereby causing power to the higher consuming group to be depleted prematurely compared to other groups. When a group of devices can no longer receive backup PoE, they may have to shut down and load balancing among the devices is further impacted.

In embodiments, firmware that facilitates communicating with other backup power sources and to synchronize with their power maintenance and shutdown modes, may enable a system for providing uninterruptible PoE via an injection device to schedule providing backup power even when primary power is not lost, such as during power maintenance procedures, and the like.

Figure 4:
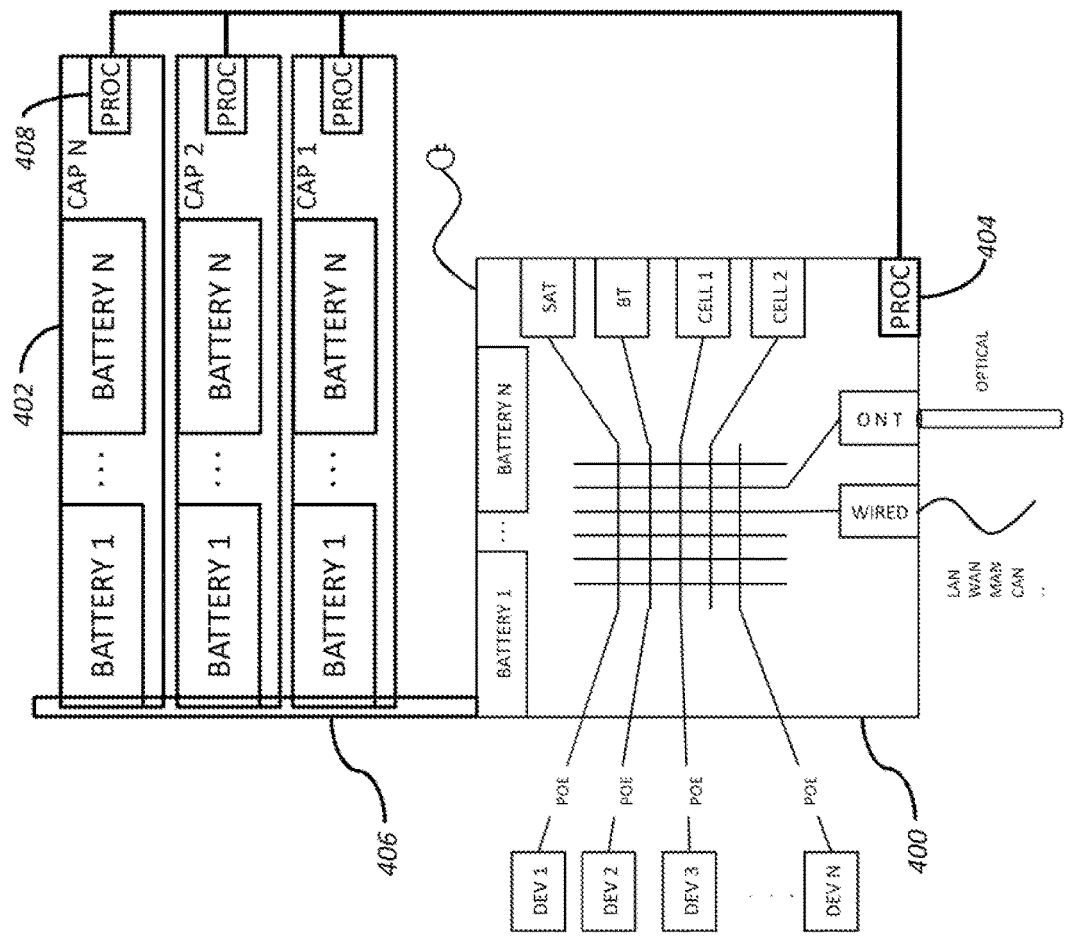
FIG. 4 depicts multiple power capsules for expanding a system for providing uninterruptible PoE (and optionally uninterruptible network connection) via an injection device.

Referring to FIG. 4, multiple power capsules 402 are depicted for expanding a system for providing uninterruptible PoE via an injection device 400. In embodiments, a system for supplying an uninterruptible PoE injection device 400 may include a rechargeable power supply that automatically provides power to connected devices on the DC side in the event of a loss of primary power to the system. The system may also integrate a processor 404 (such as a microprocessor, application specific integrated circuit (ASIC), field programmable gate array (FPGA) or the like) operated by device firmware and an Ethernet connection allowing the processor to communicate with other devices on the network. The processor firmware may be configured to allow multiple systems to be daisy-chained and may be configured to communicate with other backup power sources and to synchronize with their power maintenance and shutdown modes.

In embodiments, a system for supplying an uninterruptible PoE injection device 400 may comprise a rechargeable power supply that automatically provides power to connected devices, such as on the DC side, in the event of a loss of primary power to the system. The system may integrate a processor 404 (such as a microprocessor, application specific integrated circuit (ASIC), field programmable gate array (FPGA) or the like) operated by device firmware, and an extended battery cover 406 with one or more additional power capsules 402 to extend the amount of backup power that can be provided. Each power capsule/battery pack 402 may integrate a processor 408 capable of reporting battery status, monitoring recharge, enabling/disabling the battery circuit, and the like. Each of the power capsule processors 408 may communicate with a system processor 404 to facilitate coordination of use of the extended battery packs to provide backup PoE. In an example, each power capsule processor 408 may communicate its recharge status so that the system processor 404 may estimate how much backup time is available from each power capsule 402. By processing the recharge status of each power capsule 402, a total amount of backup time available from the system may be calculated, such as based on an anticipated demand for backup power that the system must provide. In embodiments, the capsule processors 408 and the system processor 404 may communicate battery status, recharge state, and the like to facilitate optimizing the use of available battery backup capacity, such as to meet a service requirement of a portion of the connected devices that are receiving PoE from the system for providing uninterruptible PoE.

In embodiments, the system processor 404 may communicate with the power capsule processors 408 to coordinate operation of each capsule 402, such as when each capsule should be activated and/or deactivated. This may be based on one or more rules (which may be application-specific, such as based on the needs of a connected device or powered device) or may, in embodiments, be user-configured. The processor for each capsule 408 may activate and/or deactivate the corresponding backup battery in response to receiving such a command from the system processor 404. Alternatively, the processors for a plurality of the capsules 408 may communicate with each other to enable/disable the corresponding battery circuits to provide PoE.

Figure 5:
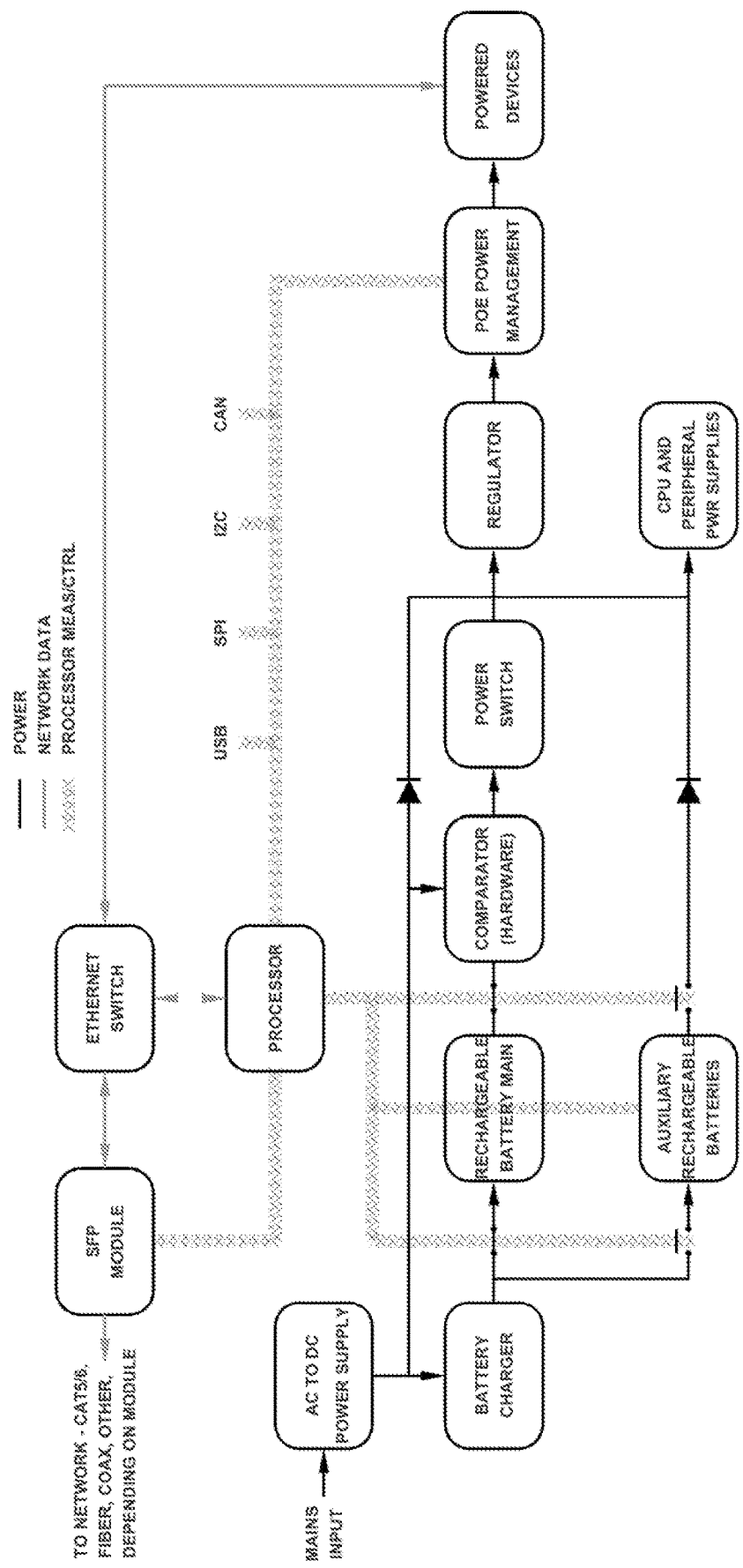
FIG. 5 depicts a block diagram of interconnected components for an embodiment of a device for providing uninterruptible PoE and uninterruptible network connectivity.

FIG. 5 depicts a block diagram of interconnected components for an embodiment of a device for providing uninterruptible PoE and uninterruptible network connectivity. Referring to FIG. 5, a system for providing uninterruptible PoE 500 may include a rechargeable power supply 502 that automatically provides power to connected devices (such as a powered device 504 as described herein) on the DC side in the event of a loss of primary power to the system. The system may include a small-form-factor port (SFP) module 510 that may facilitate communication between the connected devices and external pluggable networks that use wired interfaces such as CAT5/6, Fiber, Coax, and the like.

The SPF module 510 may provide direct support for a range of interfaces including those above. Other interfaces may similarly be supported through an interface-specific SFP module 510. The SFP module may also support communicating with multiple external networks through, for example, a compact SFP module. External network types can include, without limitation, LAN, MAN, CAN, WAN and the like.

The system may further include a switch, such as an Ethernet switch 506 that may facilitate communicating among powered devices over Ethernet, between powered devices and through the SFP module 510 to an external network, between a processor 512 that may control the system and either the powered devices, the SFP module 510 and the like. The Ethernet switch 506 may further connect to a wireless port of the system (not shown) that may facilitate access to external networks, such as those described above, when communication through the SFP module is not possible (e.g., due to primary power loss, network interruption, and the like).

In embodiments, the system 500 may include a processor communication/control channel 514 that may facilitate communication among the processor, SFP module, various peripheral ports (e.g., ports for USB, SPI, I2C, CAN and other protocol communications and/or power, and the like), and battery backup modules (e.g., power capsules) that may provide power to the connected devices even when primary power that may be received through a Mains Input, such as feeding an AC to DC power supply, is lost. Power management may be at least partially controlled by firmware executed by the processor. In embodiments, the processor 512 may communicate with other processors that directly control individual power capsules, such as processors that provide direct control for one or more rechargeable batteries, one or more auxiliary rechargeable batteries, and the like. The rechargeable batteries may be configured to provide continuous PoE to powered devices. The auxiliary rechargeable batteries 516 may be configured to provide power to the processor, peripherals 518, one or more wireless ports that may be used to provide external network connectivity when the SFP module can no longer communicate over one of its wired connections, and the like.

In embodiments that include multiple backup battery sources, such as when the system is configured to support adding power capsules and the like or when multiple systems can be daisy-chained, communication from the processor to battery-based power sources may include management of timing of activation/deactivation, shutdown, testing, recharge, and the like of each of the multiple backup battery sources. The backup battery sources may be charged by a battery charger 520, such as fed by the AC to DC power supply 522, when power is available, such as from the Mains Input.

In embodiments, peripheral devices that may receive uninterrupted power even when the Mains Input is lost may include one or more wireless ports, such as a Bluetooth™ port, one or more cellular ports (e.g., Verizon™, AT&T™, and the like), one or more satellite ports, and the like. The auxiliary rechargeable batteries may also continuously power the Ethernet switch when Mains Input is lost.

In an example of system operation when Mains Input is lost, the processor 512 may communicate with a PoE management module 524 to ensure that power is continuously supplied to powered devices by energizing the powered devices via the power delivery aspects of Ethernet (e.g., PoE). The processor may communicate with the auxiliary rechargeable batteries to ensure that peripherals, computing resources, data backup resources and the like that are not powered over Ethernet are properly maintained in an operational state even when the Mains input is lost.

The processor may communicate with the Ethernet switch to reconfigure it so that data communications between the powered devices and external networks is maintained (e.g., by routing communication to an alternate/backup wireless port of the system rather than the SFP module). The processor may also communicate with the SFP module to detect (independent of Mains input being lost), if access through the SFP module to the external networks is adequate for the demands of the powered devices. If Mains input power is lost or the SFP module cannot communicate acceptably to external networks, the processor may reconfigure the Ethernet switch to route traffic that was destined to/from the SFP module to an alternate module, such as a wireless port as described herein to ensure that communication is seamlessly maintained through network-based or Mains input-based disruptions.

In embodiments, electronic premises security systems, such as life safety system and the like may be configured with a power delivery system that automatically and instantly switches power sources from a main source of power to an available source of backup power based on a detection of insufficient main power source signal (e.g., a voltage drop and the like). The power delivery system may provide PoE, such as via an injection device. In embodiments, a power delivery system, such as a module backup power delivery system for providing PoE via an injection device may be integrated with or into an electronic premises security system. In embodiments, such a power system may automatically activate power delivery over Ethernet via an injection device upon detection of a complete loss of mains power or when mains power cannot reliably meet the required demand of the electronic premises security system components.

In embodiments, electronic premises security systems configured to operate via power provided over Ethernet may be configured with an auto-negotiation PoE injection device that actively adjusts among multiple power input sources so that a power demand of the electronic premises security system is met independent of any one power source being insufficient to meet the electronic premises security system demand. In embodiments, an auto-negotiation PoE via an injection device power system may be integrated with or into the electronic premises security system. Such a power delivery system may monitor power being received from a mains power source and the like as well as power being provided over Ethernet to the electronic premises security system devices. When mains power falls below an operational threshold (e.g., 85% of a standard main power voltage), a backup power source, such as one or more batteries (e.g., rechargeable batteries and the like), may be activated and used to supplement or replace the mains power as a source of power for providing PoE to the electronic premises security system devices. In embodiments, an auto-negotiation module of the power system may operate to ensure that power levels output as PoE meet a required demand of the electronic premises security system devices being powered over Ethernet by the power system.

Additionally, a power system for an electronic premises security system, such as the PoE via an injection device power delivery system described herein may include signal generation sub-systems or components that can complement and/or replace signals generated by mains-only powered signal generation equipment, such as portion(s) of an electronic premises security system, during mains-fault conditions. A signal generation sub-system may also receive signals or conditions that indicate a signal should be generated for conditions other than a mains-power fault. The signal generation sub-system may apply logic and optionally machine learning to signal data from such signal sources thereby learning about prioritization that may facilitate performing risk analysis of which signals to propagate during a mains-fault. The signal generation sub-system may use a ranking scheme that may adapt a priority order for signal propagation based on certain conditions, such as a duration of mains-fault or compete loss of mains power, urgency of response associated with the other signal sources, and the like. In an example, a signal source that indicates a premises exterior door is closed but unlocked may present a risk that a risk analysis algorithm may suggest being allocated a higher priority than a mains-fault condition if the mains-fault condition is being fully covered by the backup power system, such as by delivering PoE, and the like. In another example, a signal source that indicates a premises door is closed but unlocked may present a risk that a risk analysis algorithm may suggest being allocated a lower priority than a mains-fault condition if the backup power system cannot or will soon not be able to ensure sufficient power to monitor the door closed condition.

In embodiments, a system for providing PoE via an injection device may be integrated with or into a premises security system, such as a life safety system and the like and may communicate via radio frequency signals in accordance with radio frequency device standards, such as those associated with cellular communication, WiFi, Bluetooth and the like. Use of radio frequency signal communication may be provided as a backup for wired or other communication means that become disabled or incapable of proper operation due to a mains power loss and/or fault and the like. Premises security systems and the like that communicate via low power radio communications may automatically be redirected to the power system's low power radio communications circuits upon mains power loss or fault.

In embodiments, a PoE via an injection device system may be embodied as a communication switch, router, and the like for signals being communicated among sub-systems of the electronic premises security system, including external communication sub-systems such as wireless signal transmitters and receivers, wired signal transmitters and receivers, and the like. When mains power faults or fails, the communication switch/router and the like may remain operational due to the availability of backup power provided by the PoE device. The communication switch/router may automatically change routing of signals that are destined for external devices to communication resources that receive PoE, such as a cellular transmitter and the like that may be integrated into or with the PoE via an injection device system; thereby facilitating nearly continuous communications between resources of the electronic premises security system and external devices, such as web servers and the like.

In embodiments, a power supply system for use with a premises security system, such as a life safety system and the like, may be integrated with or have integrated there into a secondary power supply sub-system that automatically provides energy to the security system in the event of primary power total loss or when primary power voltage level is insufficient for proper functionality of the security system components. In embodiments, such a power supply system may provide PoE to the premises security system components, such as when there is a mains loss or fault. The power supply system may detect the mains loss or fault and respond by providing PoE in as little as a few hundred milliseconds thereby ensuring power is provided to security system devices that produce signals such that these devices may continue to produce the signals without loss. Additionally, the power supply may dynamically provide PoE based on mains fault conditions without automatically transmitting an alarm for the mains fault condition. Alarm generation may be provided based on detection of conditions beyond mains fault, such as if the mains fault persists longer than a configurable duration of time, and the like.

In embodiments, a mains-fault detection and backup power system, such as a system for providing PoE via an injection device may be integrated with or into a premises security system. The backup power system may further be configured with a modular backup battery chassis that can be configured with a plurality of backup power capsules that can be configured into a unified power delivery system. Such as power delivery system may be configured with any number of capsules and any number of chasses, all of which may be controlled by a power management system processor to ensure that demand required for continued operation of the premises security system for at least 4 hours is provided. The power deliver system may further ensure alarm generation of a premises security system is provided when a mains power fault is detected and for at least 15 minutes or more beyond the continued operation of the premises security system. Such a module power delivery system can be configured to provide not only battery activation-time management to maximize a duration of power being supplied, but it can also manage load support, activating one or more batteries as needed to ensure sufficient demand is met. Such a backup power delivery system may manage battery activation so that sufficient power is reserved for at least 15 minutes of alarm generation independent of the amount of demand required to operate the premises security system. In this way, the premises security system will remain active for as long as possible while ensuring sufficient reserve for continued alarm generation.

In embodiments, a backup power delivery system, such as a system for providing PoE via an injection device described herein and in the documents filed with this application may be integrated with or into a premises security system and may provide for adaptable control while ensuring power demand parameters associated with operating the premises security system are met for each installation. Therefore, the PoE system may be configured with sufficient power reserves (e.g., backup batteries and the like) to ensure that a premises security system continues to meet a required level of performance while being powered during a mains-fault condition and the like. Required performance of a premises security system may include connectivity to external systems. In such an embodiment, the PoE system described herein may facilitate continued communication through dedicated wireless communication devices, such as cellular, and the like that may be activated when mains power fault is detected and allocated to provide communication services that may be interrupted due to a mains power fault.

In embodiments, a modular backup power delivery system, such as a system for providing PoE via an injection device described herein may be integrated with or into a premises security system and may further be configured with power modules that can be disconnected while ensuring continuity of power delivery from the remaining modules or from the mains power because each power module can be computer controlled to be deactivated, effectively removing the module from the power distribution channels. Additionally, by providing PoE when a mains power fault or failure is detected, disconnecting the output of the backup power system (e.g., disconnecting the Ethernet cable(s) that connect the backup power system with the premises security system) is safely accomplished because the backup system can be configured to prevent energizing the PoE signals at any time.

In embodiments, a module backup power delivery system, such as a system for providing PoE via an injection device may be integrated with or into a premises security system and may be configured to provide mains-fault detection and powering of premises security system components while further monitoring operation of the backup power sources, such as rechargeable batteries and the like. In embodiments, each power module may be configured with a processor and battery sensing circuits that detect battery voltage and the like. When a supply of energy is available for charging such a battery, the processor may execute a battery charging algorithm and control the battery to be charged as needed. The battery charging algorithm may monitor the battery sensors and may detect when the battery is no longer charging or not charging at a minimum rate. Such detection may be communicated to the backup power supply system (e.g., via a communication bus or signal that propagates between the backup system and the backup battery) so that a battery charging trouble signal or alarm or the like can be generated.

In embodiments, a power delivery system, such as a system for providing PoE via an injection device may be integrated with or into a premises security system. The PoE delivery system integrated with or into the premises security system may perform its functions, such as without limitation power distribution, management, backup switch over, mains reconnection, and the like automatically. Operation of the power delivery system during full mains supply or when mains is faulty or lost may ensure that the operation of any powered devices, such as those for a premises security system may operate without interfering with power for alarms, lighting, elevators, building control and the like. A power delivery system for providing PoE via an injection device may optionally provide power to alarms, lighting, building control, life safety systems and the like while also providing power to a premises security system. In embodiments, PoE connections may be dedicated for some devices, such as alarms, lighting, elevators, building control and the like; thereby ensuring that power distribution and/or consumption issues with separately connected devices does not interfere with power distribution to other separately connected devices.

In embodiments, a power delivery system, such as a system for providing PoE via an injection device that may be integrated with or into a premises security system may be constructed to operate under a range of operating conditions, such as conditions that the premises security system may be required to meet including, without limitation operation when a main power input is compromised and does not provide sufficient voltage, such as when the main power input is faulty and/or when there is a complete loss of mains power, even for extended periods of time, such as 4 or more hours. Other exemplary operating conditions that may be met by a PoE Ethernet via an injection device include operating temperatures from below 0 degrees centigrade to over 50 degrees centigrade, relative humidity of at least 85 percent at ambient temperatures at or below 30 degrees centigrade.

In embodiments, a power delivery system, such as a system for providing PoE via an injection device that may be integrated with or into a premises security system may be used to power a low-power radio system or device of the premises security system. Such as low-power radio device may be primarily powered by a dedicated source of power, such as a battery (e.g., a dry cell) or by the power delivery system, such as through an Ethernet connection that facilitates use of PoE injection device. In embodiments, a PoE injection device may be integrated with or into the low-power radio device as a backup to the primary power source (e.g., a dry battery and the like). The PoE injection device may be configured to control and operate one or more backup batteries that can be activated automatically when the primary power source no longer provides sufficient voltage to ensure proper operation of the low-power radio device, such as when an output of a dry cell battery used as a primary power source is below a depletion threshold. The PoE injection device system may monitor the primary power, thereby automatically detecting when it is below the depletion threshold. In embodiments, the PoE injection device may be alerted, such as by a signal generated by the primary power source, when the primary power source is near or below the depletion threshold. Upon detection of a primary power source output being below a depletion threshold, the PoE via an injection device system may additionally generate one or more alerts, such as an audible signal and the like to distinctively identify the affected low-power radio device. Embodiments in which a PoE via an injection device system is integrated with or into a low-power radio portion of a premises security system may be configured so that the low-power radio portion is powered constantly above a battery depletion threshold for at least one year.

In embodiments, a PoE via an injection device integrated with or into a low-power radio device and the like may be configured to facilitate detection of removal of the low-power device, such as when the device is moved from an installed location. The PoE via an injection device may be configured with a physical port that is monitored by a processor of the device to detect the presence of a signal on the port. Such a signal may be generated through connection to a reference element of the installation, such as a physical output of the low-power radio device. Upon removal of the low-power radio device, the processor may no longer detect the signal on the port, which may trigger generating an alert, such as transmission of a signal that indicates the removal of the individual low-power ratio device.

Figure 6:
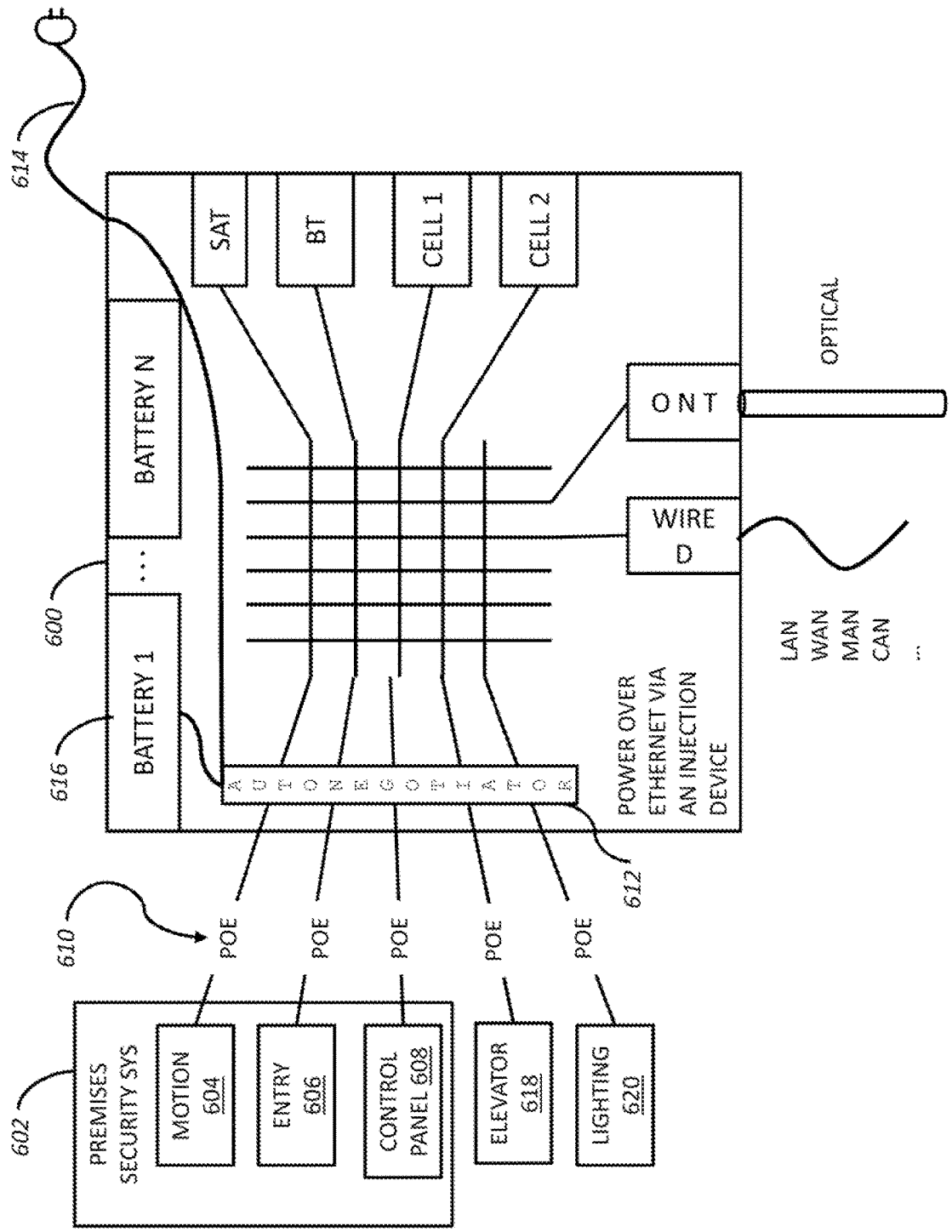
FIG. 6 depicts a block diagram of a system for providing uninterruptible PoE via an injection device integrated with a premises security system.

In embodiments, FIG. 6 depicts a Power over Ethernet (PoE) via injection device system 600 that provides power and communication backup functionality integrated with an electronic premises security system 602 that includes security devices, such as motion sensors 604, entry sensors 606, a control panel 608 and the like being powered over Ethernet 610 by the injection device. The PoE via injection device system 600 exemplarily includes an auto-negotiation module 612 that monitors input power sources, such as primary AC power 614 and battery module 616 and also monitors power output over Ethernet 610 to ensure power meeting the requirements of the premises security system 602 is provided. The system 600 may further provide at least one of primary and backup power over Ethernet to other systems associated with a premises security system, such as an elevator 618, facility lighting 620, and the like. Features of the PoE system 600 not described in this portion of the specification may be described elsewhere herein and at least in the portion that describes the embodiment of an uninterruptible PoE system 100 with comparable elements that is depicted in FIG. 1.

Figure 7:
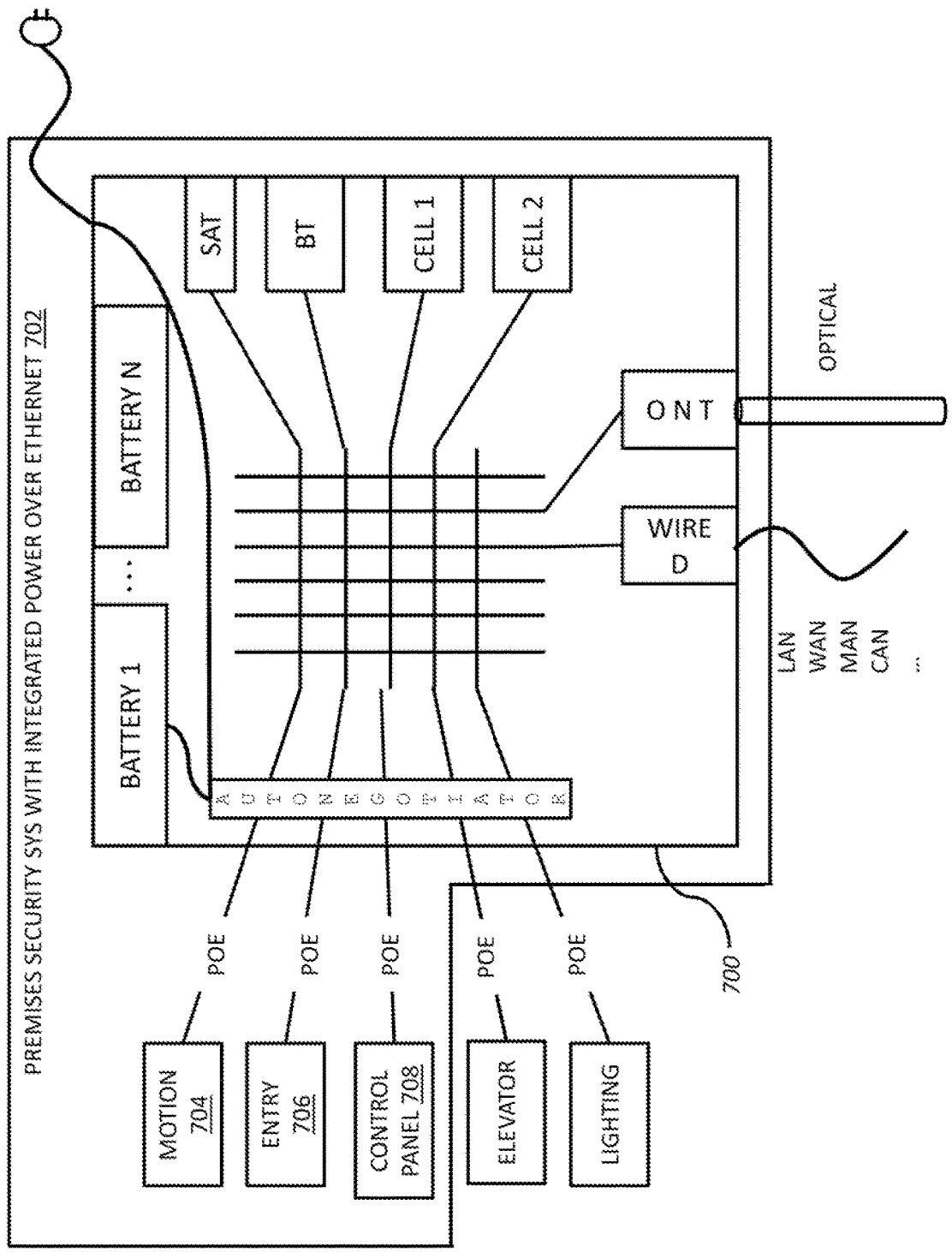
FIG. 7 depicts a block diagram of a system for providing uninterruptible PoE via an injection device integrated into a premises security system.

In embodiments, FIG. 7 depicts a variation of the embodiment of FIG. 6 in which a PoE via an injection device system

700 that provides power and communication backup functionality and is substantially similar to system 600 is integrated into an electronic premises security system 702 that includes security devices, such as motion sensors 704, entry sensors 706, a control panel 708 and the like being powered over Ethernet by the injection device.

Figure 14:
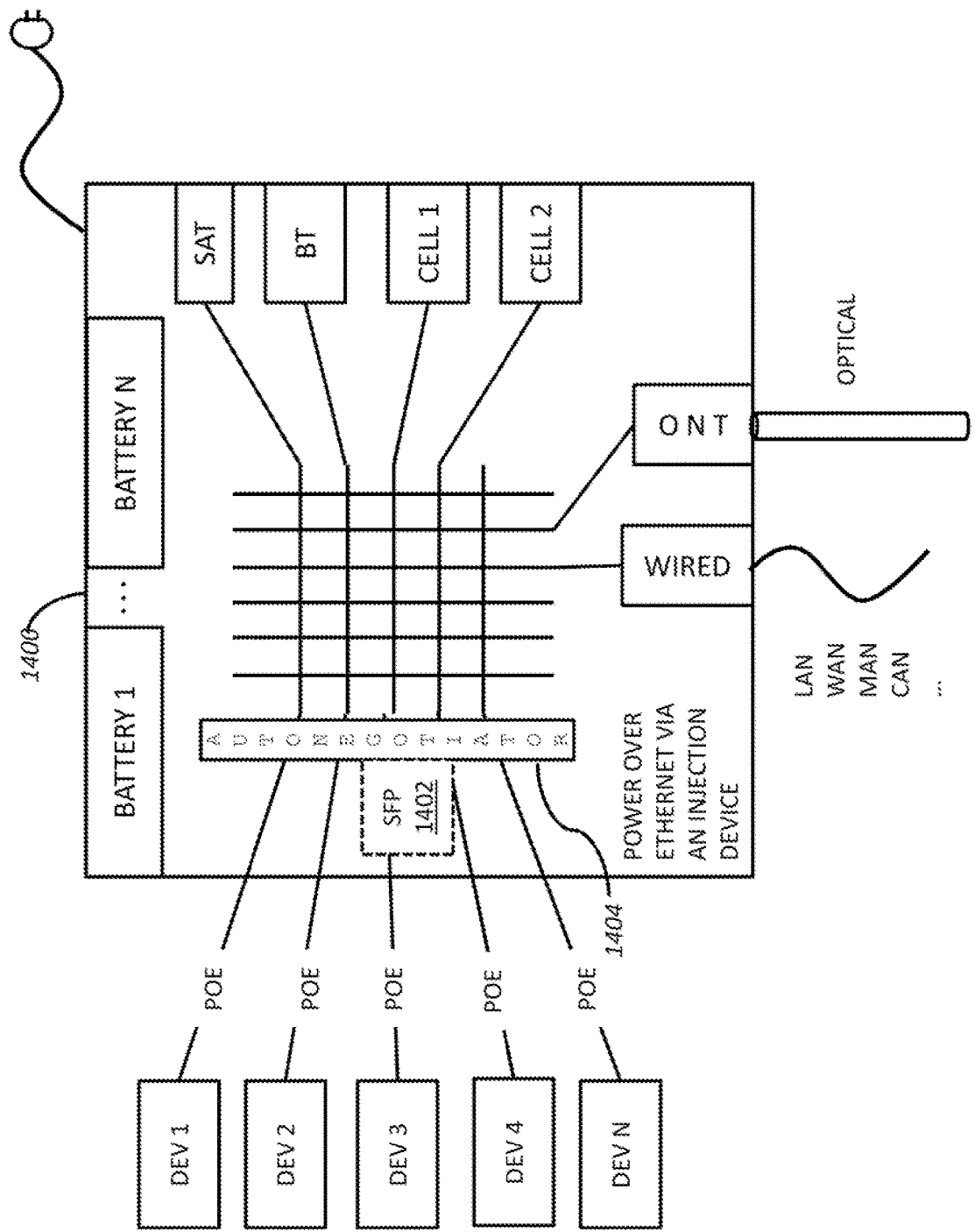
FIG. 14 depicts a block diagram of an auto-negotiating configuration of a system for providing uninterruptible PoE.

Referring to FIG. 14, in embodiments, a system for supplying uninterruptible power-over-Ethernet via an injection device 1400 may include a rechargeable power supply that automatically provides power to connected devices in the event of a loss of primary power to the system, a network switch, and a wireless device interface that automatically provides Internet connectivity to the connected devices in the event of a loss of wired Internet connectivity to the system, a network switch that facilitates communication among connected devices and with the wireless device interfaces, a small-form factor pluggable (SFP) transceiver port 1402 and auto-negotiator 1404 that auto-negotiates a connection when a device connection is detected. In embodiments, the SFP transceiver port may be an SFP+ transceiver port, an SFP28 transceiver port, a compact SFP transceiver port that supports at least two physical connections, and the like.

In embodiments when a device, such as a connected device or powered device as described herein is connected through an SFP transceiver port to the system, the system may automatically configure the port for communicating with and providing power to the device so that when primary power is lost, the SFP-connected device can be provided uninterruptible power over the connection through the SFP port, such as via power-over-Ethernet and the like. Also in embodiments, the connected device and the system for providing uninterruptible power-over-Ethernet that includes a switch may automatically configure the switch to facilitate routing the connected device to at least one of a plurality of wireless ports to provide external network connectivity when primary power is lost.

Figure 15:
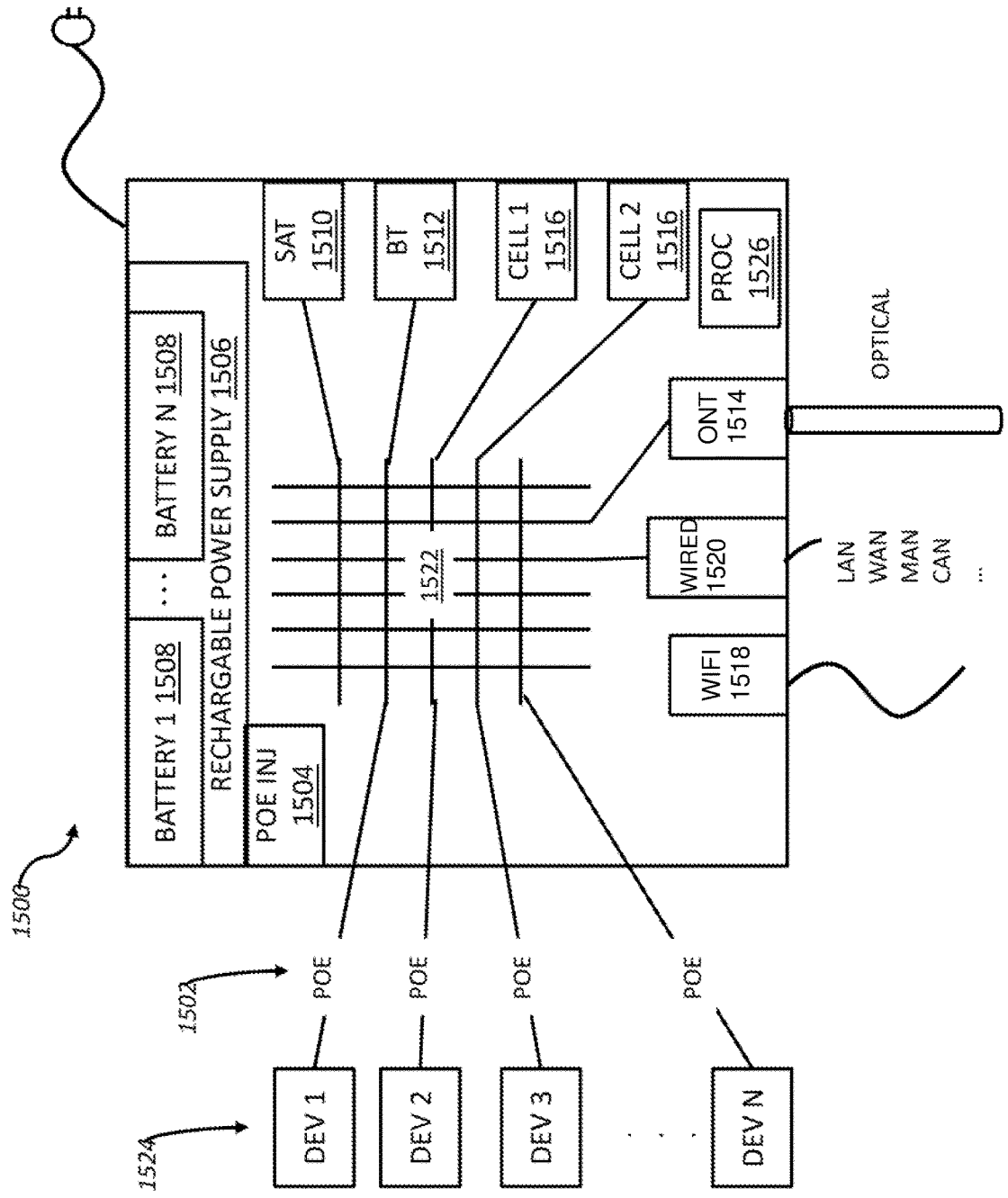
FIG. 15 depicts a block diagram of an embodiment of a system for providing uninterruptible PoE including a processor for controlling the system.

Referring to FIG. 15, a power and communication backup system 1500 is depicted that facilitates providing uninterruptible Power over Ethernet (PoE) 1502. The power and communication backup system 1500 may operate to provide PoE via an injection device 1504, such as an injection device with rechargeable power supply 1506 that may be based on one or more batteries 1508. The power and communication backup system 1500 may include wireless communication interfaces, such a satellite interface 1510, Bluetooth interface 1512, Optical Network Terminal interface 1514, cellular interfaces 1516 and WiFi interfaces 1518, a wired network interface 1520, optional data switch functionality 1522, and a processor 1526.

In an aspect of the methods and systems of PoE backup, a system, such as power and communication backup system 1500 depicted in FIG. 15 may be configured to facilitate supplying uninterruptible PoE via an injection device. The system may comprise a rechargeable power supply 1506 that automatically provides power to connected devices 1524, such as a powered device, such as any of the devices described herein, such as networking devices (e.g., routers, access points and switches, among others, computing devices, lighting devices, security devices, emergency devices (e.g., alarms), and many others), such as on the DC side in the event of a loss of primary power 128 to the system. In embodiments, the system 1500 may be configured with a processor 1526 that facilitates control of at least a portion of the system 1500, such as the injection device 1504, the rechargeable battery sub-system 1506, communication over the Ethernet port(s) with connected devices and with other comparable backup power systems, and the like. In an example of use of the processor 1526, power to the wireless ports (e.g., Bluetooth™, cellular, satellite, and the like) may be managed, such as by the processor 1526 controlling the power supply 1506 and the like to enable balancing the need for high speed switching when a primary Internet connection fails (e.g., due to primary power loss) with overall power consumption and security considerations.

In embodiments, a system for providing uninterruptible power-over-Ethernet via an injection device may include a processor that is operationally configured, such as by executing firmware accessible by the processor to manage shutdown of internal resources and external devices for managing power consumption in response to a primary power loss or disruption. In embodiments, a system is provided for supplying an uninterruptible power-over-Ethernet injection device comprising a rechargeable power supply that automatically provides power to connected devices on the DC side in the event of a loss of primary power to the system. The system integrates a microprocessor operated by device firmware and an Ethernet connection allowing the microprocessor to communicate with other devices on the network, such as connected devices. In embodiments, the processor may communicate with other devices, such as over the Ethernet connection to initiate and manage proper and/or scheduled shutdown of attached equipment in advance of a backup power source being depleted. Configurable parameters related to the backup power source may be referenced to determine which device (s) to shutdown, the order and timing of the device(s), actions to take prior to and as a result of shutdown of a device, and the like. In an example, a plurality of data storage devices may be connected to the system and receiving backup power over Ethernet from the system. One or more of the data storage devices may be shutdown based on a percent of backup source power remaining available for use until only one of the data storage devices remains active. As each data storage device is shutdown, a signal indicating some information, such as archive information stored on the shutdown data storage devices may not be available until power is restored.

In embodiments, a system for providing uninterruptible power-over-Ethernet via an injection device may include a processor that is operationally configured, such as by executing firmware accessible by the processor to facilitate storing information provided by attached devices in a storage module configured with the system in response to a primary power loss or disruption. In embodiments, a system is provided for supplying an uninterruptible power-over-Ethernet injection device comprising a rechargeable power supply that automatically provides power to connected devices on the DC side in the event of a loss of primary power to the system. The system integrates a microprocessor operated by device firmware and an Ethernet connection allowing the microprocessor to communicate with other devices on the network, such as connected devices. In embodiments, the processor may communicate with other devices, such as over the Ethernet connection to facilitate storing information provided by attached devices, such as a digital streaming camera and the like. When a primary power loss is detected, the processor may activate a storage module, such as a non-volatile storage device to capture information from externally connected devices. Alternatively, the system may be configured to store information from connected devices independent of a primary power loss. In an example, a plurality of streaming devices may be connected to the system. The streaming devices may be powered by backup power provided by the system in response to a loss of primary power. The loss of primary power may cause one or more interruptions in a streaming data path, such as an Internet connection, a connection to a data storage facility and the like. In response to detecting a primary power loss, the processor of the UPoE system may logically reconfigure the streaming device, such as by updating a destination parameter for the streamed data to direct streamed data to the backup system. The processor of the backup system may facilitate storage of the streamed data in a data storage module that is controlled by the processor of the backup system. In this way, the streaming of data may continue uninterrupted from the streaming device, even though the streaming device no longer has connection to its primary destination (e.g., the Internet and the like). The data storage module may be configured and operated so that the streamed data may be stored and made accessible to one or more connected devices once primary power is restored.

In embodiments, a daisy-chained power and communication backup capable system may facilitate providing uninterruptible PoE via an injection device while enabling daisy-chaining of multiple such backup capable systems to enhance backup power distribution and management. In embodiments, a system is provided for supplying an uninterruptible PoE injection device comprising a rechargeable power supply that automatically provides power to connected devices on the DC side in the event of a loss of primary power to the system. The system integrates a microprocessor operated by device firmware and a connection, such as an Ethernet connection allowing the microprocessor to communicate with other devices, such as daisy chained devices including additional backup PoE systems.

In embodiments, a system for supplying an uninterruptible PoE injection device may comprise a rechargeable power supply that automatically provides power to connected devices, such as on the DC side, in the event of a loss of primary power to the system. The system may integrate a processor (such as a microprocessor, application specific integrated circuit (ASIC), field programmable gate array (FPGA) or the like) operated by device firmware, and an extended battery cover with one or more additional power capsules to extend the amount of backup power that can be provided. Each power capsule/battery pack may be controlled by the system processor to facilitate reporting battery status, monitoring recharge, enabling/disabling the battery circuit, and the like. Each of the power capsules may be configurable by the system processor, such as to facilitate coordination of use of the extended battery packs to provide backup PoE. In an example, each power capsule may be monitored by the system processor for its recharge status to facilitate estimating how much backup time is available from each power capsule. In embodiments, by controlling activation and use of each of the plurality of power capsules, the system may provide backup power for at least a day or more. By processing the charge status of each power capsule, a total amount of backup time available from the system may be calculated, such as based on an anticipated demand for backup power that the system must provide. In embodiments, the system processor may calculate overall battery status, recharge state, and the like to facilitate optimizing the use of available battery backup capacity, such as to meet a service requirement of a portion of the connected devices that are receiving PoE from the system for providing uninterruptible PoE.

In embodiments, the system processor may communicate with the power capsules to coordinate operation of each capsule, such as when each capsule should be activated and/or deactivated. This may be based on one or more rules (which may be application-specific, such as based on the needs of a connected device or powered device) or may, in embodiments, be user-configured. The system processor may activate and/or deactivate the corresponding backup battery in response to determining a need for complying with advanced power management.

In embodiments, the uninterruptible PoE system may maintain an inventory of available (e.g., attached) power sources (e.g., battery capsules and the like) and estimate the power availability of each on a periodic cycle, such every 10 seconds. In embodiments, the uninterruptible PoE system may communicate via a protocol, such as Simple Network Management Protocol (SNMP) with end user terminals (e.g., an app on the user's mobile device and the like) to allow end users to check health of devices, such as devices powered from the uninterruptible PoE system, the uninterruptible PoE system itself and the like. The uninterruptible PoE system may configure and/or maintain a Management Information Base (MIB) that an end user can access, such as by downloading it via SNMP and the like to facilitate checking status of all uninterruptible PoE systems that are accessible over the Internet. An end user can configure the SNMP communication system to check status of one, two, or many of the uninterruptible PoE devices thusly configured and accessible over the Internet and the like periodically, such as every 10 seconds, every second, fractions of a second and the like. In embodiments, the MIB may be updated continuously with records of energy (e.g., voltage) flowing into and out of each battery pack in each batter capsule for each uninterruptible PoE system and the like. The information in this MIB and the like may be used to adjust power management for one or more uninterruptible PoE systems, so that critical components being provided backup power may continue to be acceptably powered as long as possible. This may be facilitated by a system-wide power management algorithm that can shift logical connections among system resources, thereby shutting down some system resources while maintaining at least a minimal service quality, and the like.

In embodiments, an uninterruptible PoE system configured with battery modules for providing power over Ethernet, such as when a primary power loss is detected may include a plurality of power capsule, battery packs, batteries, battery modules, and the like that may be logically arranged and controlled to extend the amount of backup power that can be provided. The multiple battery packs, modules, and the like may be configured to provide an increased amount of power when needed and reconfigured to provide a smaller amount of power that is sustainable over a very long period of time. A microprocessor of the uninterruptible PoE system may configure and manage one or more portions of the backup battery system, such as an individual battery, a battery capsule, a group of batteries/capsules, and the like. In embodiments, the plurality of battery packs may be chained so that power from one pack may be consumed before power from another battery pack along the chain is activated; thereby extending duration of backup power through deactivation of depleted battery packs and activating other less depleted battery packs. In embodiments, multiple battery packs may be stacked to increase backup time rather than chained.

In embodiments, a system for supplying an uninterruptible PoE injection device may comprise a rechargeable power supply that automatically provides power to connected devices, such as on the DC side, in the event of a loss of primary power to the system. The system may integrate a processor operated by device firmware, and an extended battery cover with one or more additional power capsules to extend the amount of backup power that can be provided. The system may apply a configurable sequence when charging the power capsules, such as when charging additional batteries and/or battery packs. The configurable sequence may be based on factors, such as number of charge/recharge cycles that a battery has experienced, location in a chain of batteries, location in a stack of batteries, power density of the battery, total time to fully recharge the battery, and the like. The configurable sequence may be biased to ensure that the greatest number of batteries can be recharged in the shortest time, so that fully charged batteries are available when a primary power loss occurs. The configurable sequence may be biased so that the largest capacity batteries are charged before other lesser capacity batteries. In embodiments, the system, such as through the processor executing firmware may monitor and maintain a charge to one or more of the recharged batteries over time independent of the system activating the batteries to provide backup power over Ethernet.

In embodiments, a system for supplying an uninterruptible PoE injection device may comprise a rechargeable power supply that automatically provides power to connected devices, such as on the DC side, in the event of a loss of primary power to the system. The system may integrate a processor operated by device firmware, and an extended battery cover with one or more additional power capsules to extend the amount of backup power that can be provided. In embodiments, the individual batteries, battery capsules, power capsules and the like may be individually addressable over a network. The individually addressable modules may be accessed for configuration, status monitoring, recharging, activation/deactivation and the like over the network, such as by a controller that facilitates control of a plurality of uninterruptible PoE systems. An example of such a configuration may include a test configuration in which a plurality of multi-battery uninterruptible PoE systems are connected to a common Ethernet connection for testing or the like. A test controller may also be connected to the common Ethernet connection and may address each of the individually addressable battery modules to perform functions, such as activation, deactivation, and the like during a production or other test. Other configurations may include accessing individual battery modules over the Internet. In such a configuration, all battery modules that are connected to the Internet (e.g., through their host uninterruptible PoE system and the like) may be individually accessed to perform functions, such as updating firmware on the battery modules, interrogating the modules for performance information and the like.

In embodiments, a system for providing uninterruptible power-over-Ethernet via an injection device may include a processor that is operationally configured, such as by executing firmware accessible by the processor to selectively shutdown some connected devices for managing power consumption in response to a primary power loss or disruption. In embodiments, a system is provided for supplying an uninterruptible power-over-Ethernet injection device comprising a rechargeable power supply that automatically provides power to selected connected devices on the DC side in the event of a loss of primary power to the system. The selected device to be provided power may be based on a configurable power management scheme that ranks connected devices in importance of operation when primary power is lost or inadequate. The system integrates a microprocessor operated by device firmware and an Ethernet connection allowing the microprocessor to communicate with the other devices on the network, such as connected devices to configure select devices to automatically switch to power over Ethernet when primary power to the connected device is lost. In embodiments, the processor may communicate with other devices, such as over the Ethernet connection to initiate and manage select shutdown of attached equipment in advance of a backup power source being depleted. Configurable parameters related to the backup power source may be referenced to determine which individual device(s) to shutdown, the order and timing of the individual device(s), actions to take prior to and as a result of shutdown of an individual device, and the like.

In embodiments, a system for providing uninterruptible power-over-Ethernet via an injection device may include a processor that is operationally configured, such as by executing firmware accessible by the processor to shut down one or more connected devices in response to detecting primary power loss based on power needs of the devices. In an example, a connected device may require more power to properly operate than can be provided over an Ethernet connection. Such a device may be selected to be shutdown. In another example a group of connected devices may consume, in total, more power than the uninterruptible PoE system can provide over Ethernet. Select devices may be shutdown rather than powered over Ethernet to ensure that the power provided over Ethernet maintains an acceptable level of performance (e.g., a minimum voltage) throughout a primary power loss. The processor may execute an algorithm that monitors available backup power and further shuts down connected devices based on the individual devices power needs.

In embodiments, the processor may execute an algorithm that applies at least one of a rule, policy or threshold to determine individual device(s) to shut down. Exemplary aspects of an algorithm may include the algorithm processing a rule, such as a power demand rule that ensures power is provided to at least a select subset of connected devices for a minimum amount of time. The select subset may be based on a policy, such as a life safety policy, a quality of service policy, a data integrity policy and the like. The algorithm may receive a total power consumption threshold value as an input that is used in a formula that determines, for example, a combination of devices and duration of time powering the devices (e.g., a total power consumed over a time duration) and facilitates adjusting at least one of the combination of devices, the total number of devices, the duration of time and the like that produces a power consumption that meets the threshold value.

In embodiments, a system for providing uninterruptible power-over-Ethernet via an injection device may include a graphical interface enables users to actively shut down devices, configure schedules, policies and/or thresholds for orderly shutdown of devices, and to view diagnostic information for the system. The system graphical interface may be configured with one or more non-overlapping panels that enable access to different information and control of the system. In an example, such as the example depicted in FIG. 16, a graphical interface 1600 may include a primary power status panel 1602, a backup power status panel 1604, a connected device status and control panel 1606, a system alert panel 1608, communication status and control panel 1610, an operator chat panel 1612, and the like.

In embodiments, a system for providing uninterruptible power-over-Ethernet via an injection device may include a processor that is operationally configured, such as by executing firmware accessible by the processor to selectively shutdown some connected devices for managing power consumption in response to a primary power loss or disruption by communicating with the connected devices using Simple Network Management Protocol (SNMP). In embodiments, a system is provided for supplying an uninterruptible power-over-Ethernet injection device comprising a rechargeable power supply that automatically provides power to selected connected devices on the DC side in the event of a loss of primary power to the system. The selected device to be provided power may be based on a configurable power management scheme that ranks connected devices in importance of operation when primary power is lost or inadequate. The system integrates a microprocessor operated by device firmware and an Ethernet connection allowing the microprocessor to communicate via SNMP with the other devices on the network, such as connected devices to configure select devices to automatically switch to power over Ethernet when primary power to the connected device is lost. In embodiments, the processor may communicate with other devices, such as over the Ethernet connection to initiate and manage select shutdown of attached equipment in advance of a backup power source being depleted by use of SNMP to facilitate notifying devices to be shut down.

In embodiments, a system for supplying uninterruptible power-over-Ethernet via an injection device comprising a rechargeable power supply that automatically provides power to connected devices on the DC side in the event of a loss of primary power to the system may be contained in an enclosure that is ruggedized and sealed to be resistant to the elements and suitable for outdoor mounting. The enclosure may be sized to support a system with a single power capsule, with stacked and/or chained power capsules, with or without backup wireless communication features, with a processor that facilitates monitoring of primary power to connected devices and the like. The system enclosure may provide external connections, such as an Ethernet connection for providing power over Ethernet and the like that are ruggedized and resistant to the elements. In embodiments, the uninterruptible PoE system enclosure is IP67-rated and protects the system to continue to operate when completely submerged in a liquid, such as fresh water.

In embodiments, the uninterruptible PoE system may comprise a first circuit board for hosting a processor, power control circuitry and the like as well as at least one second circuit board comprising a backup power supply, such as a power capsule as described herein that connects to the first circuit board to automatically provide power to connected devices in the event of a loss of primary power. The second circuit board with backup power supply may be no more than 0.25" thick and may mount substantially parallel and proximal to the first circuit board, such as directly below the first circuit board.

In embodiments, a system for supplying uninterruptible power-over-Ethernet via an injection device comprising a rechargeable power supply that automatically provides power to connected devices on the DC side in the event of a loss of primary power to the system may be configured to shut down power to connected devices when a fault that puts the system or the connected devices at risk is detected. In embodiments, an exemplary fault is detecting the power draw of the connected devices and/or of the connected devices and auxiliary devices exceeds the power capacity of the system. The system may be configured with power monitoring circuits that sense power draw through the injector device. When such a power monitoring circuit detects that the power draw exceeds a power delivery threshold, such as the power capacity of the system, the system may respond to the detection by disabling the injector device. Such a condition may be caused by a fault external to the system, such as one of the connected devices drawing excessive power over the Ethernet cable.

In embodiments, a system for supplying uninterruptible power-over-Ethernet via an injection device comprising a rechargeable power supply that automatically provides power to connected devices on the DC side in the event of a loss of primary power to the system may be configured to shut down power to connected devices when a fault that puts the system or the connected devices at risk is detected and periodically attempt to reactivate the injection device. In embodiments, the system may monitor the PoE connection to via the Ethernet interface for fault conditions, such as a low impedance to ground and the like. Independent of such a condition being detected, the system may reactivate the PoE injection device while monitoring power draw. If the fault condition persists and the power drawn exceeds the power capacity of the system, the injection device may again be disabled. Repeated attempts to reactivate the PoE injector device may be made up to a configurable number of attempts. After a configurable number of attempts, the system may stop attempting to reactive the injection device.

In embodiments, a system for supplying uninterruptible power-over-Ethernet via an injection device comprising a rechargeable power supply that automatically provides power to connected devices on the DC side in the event of a loss of primary power to the system may be configured to shut down power to connected devices when a fault that puts the system or the connected devices at risk is detected. In embodiments, switchover from primary power to rechargeable power may be performed by hardware circuits without intervention by a processor executing a program. Hardware circuits may be configured, such as by a processor executing a switchover configuration program, to monitor primary power. However, when the circuits monitoring primary power detect a switchover condition, the switch from primary power to battery backup power may proceed without further processor intervention.

In embodiments, a system for supplying uninterruptible power-over-Ethernet via an injection device comprising a rechargeable power supply that automatically provides power to connected devices on the DC side in the event of a loss of primary power to the system may be configured with a processor configured with firmware that when executed by the processor facilitates coordination of the activities of a user authentication and access control system. In embodiments, a user authentication and access control system may be physical access control system, such as physical access to a building and the like. Integration of an uninterruptible PoE system with such a user access control system may include configuring electronic systems that operate access points, such as doors, windows, and the like with an uninterruptible PoE system to facilitate delivery of power to the access point operation systems independent of the quality or existence of primary power. Electronic systems for user (e.g., human) access points may include card key sensors, cameras, facial recognition systems, proximity monitors, bio-authentication devices (e.g., retinal scanners, fingerprint scanners, and the like), electronic door locks, magnetic door locks, electronic entry sensors (e.g., door/window open detectors, glass break detectors, and the like). In an example, a magnetic door lock may be controlled by a user access control system that only provides an electrical signal to the magnetic door lock to release the magnet. Therefore, when power that is required to provide the electrical signal is not available (e.g., a primary source of power for the electrical signal is faulty), the door will remain locked. While this may generally be a desirable outcome for security purposes, access by emergency personnel and the like may be impaired. Therefore, by ensuring that power to generate the electrical signal to release the door magnetic lock is uninterrupted, security can be maintained throughout a primary power loss while permitting authenticated access through the magnetically locked door. A magnetic door lock control system configured with an uninterruptible PoE system may provide both security and life safety for personnel in the building.

In embodiments, a system for supplying uninterruptible power-over-Ethernet via an injection device comprising a rechargeable power supply that automatically provides power to connected devices on the DC side in the event of a loss of primary power to the system may be configured with a processor configured with firmware that when executed by the processor facilitates coordination of the activities of a user authentication and access control system. In embodiments, a user authentication and access control system may include detection of physical intrusion into a building and the like. Uninterrupted power can be provided to the intrusion detection system, such as by integrating an uninterruptible PoE system with an intrusion detection system so that the intrusion detection system continues to detect intrusions independent of primary power availability. An intrusion detection system configured with an uninterruptible PoE system that provides uninterrupted power to the intrusion detection system may generate intrusion signals to a user authentication and access control system to, for example, activate locks on doors and the like when an intrusion is detected even when primary power is insufficient.

In embodiments, a system for supplying uninterruptible power-over-Ethernet via an injection device comprising a rechargeable power supply that automatically provides power to connected devices on the DC side in the event of a loss of primary power to the system may be configured with a switch that sends signals to activate emergency lighting, such as emergency LED lights responsive to the loss of primary power. In embodiments, emergency lighting, such as emergency LED lights may be integrated with an uninterruptible PoE system that provides power to the emergency LED lights independent of primary power availability. Such an integrated system may be configured as independent mountable products that only require a form of communication that can receive a signal indicating that primary power to a facility served by the mounted emergency lights has been lost. In embodiments, a plurality of LED emergency lighting modules each configured with an uninterruptible PoE system that includes wireless communication may be disposed throughout a facility. The uninterruptible PoE systems may automatically configure a network among them to ensure timely delivery of power disruption indicator signals to activate the emergency lights. Additionally, each LED emergency lighting module may comprise a lighting sub-module that receives power and activation signals via an Ethernet connection to an uninterruptible PoE module.

In embodiments, a system for supplying uninterruptible power-over-Ethernet via an injection device comprising a rechargeable power supply that automatically provides power to connected devices on the DC side in the event of a loss of primary power to the system may be configured to provide at least 60 Watts of power to each connected device. In embodiments, at least one connected device is an Ethernet switch. In embodiments, a plurality of the connected devices also connects to the Ethernet switch and can receive at least 60 Watts of power each from the uninterruptible PoE system. In embodiments, a plurality of devices is connected to the Ethernet switch via one or more Ethernet cables. The uninterruptible PoE system is configured to provide enough power to the Ethernet switch to enable delivery of at least 60 W to each of the plurality of devices connected to the Ethernet switch.

In embodiments, a system for supplying uninterruptible power-over-Ethernet comprising a rechargeable power supply that automatically provides power to connected devices on the DC side in the event of a loss of primary power to the system may be configured to supply power to a multi-port PoE injector device without interruption in the event of the loss of primary power. In embodiments, the multi-port PoE injector device may be integrated into the uninterruptible PoE system. In embodiments, the multi-port PoE injector device may be connected to but separate from the uninterruptible PoE system. In embodiments, the multi-port PoE injector device may be a rack mountable module and the like. In embodiments, the system and separate multi-port PoE injector may be configured to be rack mountable as individual modules and/or as a composite module and the like.

In embodiments, a system for supplying uninterruptible power-over-Ethernet comprising a rechargeable power supply that automatically provides power to connected devices on the DC side in the event of a loss of primary power to the system may be configured to supply power to a multi-port PoE injector device without interruption in the event of the loss of primary power. The system may further be configured to connect, such as via Ethernet, to a remote speaker and microphone (e.g., a combined speaker/microphone or separate speaker and microphone) that communicates electronically with the system. Commands for controlling the system may be spoken into the remote microphone that may send an electrical version of the commands to the system via an Ethernet connection by which the speaker and microphone are powered. The spoken voice commands may be followed by the system, such as by performing one or more backup power related functions (e.g., activate backup power, disable one or more connected devices, set primary power fault thresholds, and the like). Responses to the voice commands may be generated and delivered to the remote speaker for delivery of an audible version of the response through the speaker.

In embodiments, a system for supplying uninterruptible power-over-Ethernet comprising a rechargeable power supply that automatically provides power to connected devices on the DC side in the event of a loss of primary power to the system may be configured to connect, such as via Ethernet, to a remote speaker and microphone (e.g., a combined speaker/microphone or separate speaker and microphone) that communicates electronically with the system. The system may further be configured with a conversational agent interface that performs authentication of a user through voice and audio interactions with the user. The conversational agent interface may engage in a natural language conversation with a user to validate the user is authorized to control the system. The conversational agent may ask the user to provide responses to authentication questions that facilitate validating the user. The conversational agent interface may use voice recognition as at least one portion of user validation. Commands for controlling the system may be spoken into the remote microphone by an authenticated user.

In embodiments, a system for supplying uninterruptible power-over-Ethernet comprising a rechargeable power supply that automatically provides power to connected devices on the DC side in the event of a loss of primary power to the system may be configured with a processor that operates device firmware to communicate over a network via an Ethernet connection with other devices, such as servers and the like on the network. In embodiments, the firmware is configured so that a processor executing the firmware communicates over the network with a remote server on a periodic basis using a secure communication protocol to report, among other things a status of primary power, diagnostics of the system, configuration of the system, connectivity and state of attached devices and the like. When data from a plurality of uninterruptible PoE systems is processed by the remote server, system conditions and symptoms indicative of an impending primary power fault may be identified thereby facilitating anticipating primary power events that may require activating a source of backup power, such as backup power over Ethernet as described herein.

In embodiments, Uninterruptible Power over Ethernet Supply (UPoES) may provide primary and/or backup power for electrically powered systems in transportation deployments, such as air travel. Air travel deployments include demands for a range of electronic passenger, staff, and crew services, access controls, and the like. Because security impacts the full air travel lifecycle including, without limitation land-based transport arrivals and departure, terminal access, in-terminal passenger screening and services, in-flight services and operation and the like, providing uninterrupted power may be crucial for passenger comfort, safety and regulatory compliance. Security and related devices that span the air travel lifecycle may communicate with each other and servers, such as through networks based on standard technologies including without limitation Ethernet and the like. Redundancy of communication, which may be provided by an uninterruptible PoE module at least responsively to a disruption in one or more of the networks, such as when power to a networking component is lost or is insufficient for proper operation, or a network signal is lost and the like provides a crucial function to enable uninterrupted air travel-related security. Communication services for air travel may include personal/passenger access (e.g., Internet Service Provisioning), special purpose networking (e.g., business operations, security transactions, security monitoring, private networks, and the like), and the like. Air travel security device technology encompasses portable powered devices, fixed infrastructure devices, temporary use devices, networking, servers, and the like.

In embodiments, FIG. 8 depicts to an air travel embodiment 800 of a transportation environment. An air travel transportation environment may be characterized by several areas of air traveler interaction, each of which may have several electronic touch points. Traveler interaction and touch point areas may include parking 802, terminal access 804, secure area access 806, passenger check-in 808, passenger security screening 810, passenger and crew boarding 812, in-flight 814, and air traffic control 816. Passenger and crew parking 802 may include electronic systems that are dependent on reliable power and communications for entering and exiting a parking facility, dispensing tickets during entry, payment of parking fees at kiosks and the like, vehicle detection and tracking throughout the parking facility, parking facility and traveler walkway lighting and the like. These electronic systems work cooperatively with each other and with external systems (e.g., for credit card payment and the like) to provide safe and reliable parking facilities. Loss of primary power and/or communications with any of these electronic systems may result in problems in all aspects of the traveler parking experience. While air travel is exemplary depicted in FIG. 8, any parking facility whether commercial or private may rely on comparable electronic systems and face similar problems when communications and/or power is unreliable. An uninterruptible PoE configured to provide power via an injection device and at least backup communication functions for devices connected to a common Ethernet cable may be a foundational step to ensuring uninterrupted parking facility operations and the accompanying safety of reliable parking.

Referring to FIG. 8, an air travel embodiment 800 may include electronic systems for facilitating terminal access, such as security doors, moving walk ways, escalators, elevators, and the like for passengers, crew, and flight staff. An uninterruptible PoE system may be integrated with or into these terminal access systems to ensure reliable operation even when primary power is lost or insufficient.

In embodiments, air travel embodiment 800 may further include electronic systems for accessing secure areas 806 of an air terminal. Security may be at least partially enforced by electronic systems that perform badge scanning, door locking/unlocking, detection of a crew member, detection of a flight staff, confirmation of a number of people passing through a secure door and the like. As with other electronic systems in such a transportation environment, utilizing configurations of an uninterruptible PoE system configured with both battery backup and communication backup at key access portals may enhance security and proper access to secure air terminal areas.

Additional electronic systems that may be found in an air travel transportation environment, such as the environment depicted in FIG. 8 may include passenger check in systems 808 that may include flight information terminals, check in kiosks, bag drop terminals, tag printers and scales, boarding pass scanners and dispensers, bag conveyors, personnel communication systems and the like. These systems may work cooperative with each other and with central reservation and ticketing systems and the like to ensure passengers are validated and documented for air travel. In addition to delays that may be encountered from any of these systems being unusable due to power and/or communication failures, in-transit transactions may be compromised further causing unforeseen problems for travelers. Therefore, among other things, uninterruptible PoE modules or systems and the like, many embodiments of which are described herein, may be integrated with or into one more instances of one or more of these types of electronic passenger check in systems so that power and/or communication faults may be bypassed through use of the backup power and wireless communication capabilities available from embodiments of an uninterruptible PoE system.

In embodiments, passenger security screening 810 systems and processes may rely on electronic systems, such as passport or other personal identification scanning systems, agent communication systems, scanners, such as x-ray, body, metal detectors, handheld scanners, secondary scanners (e.g., explosive detection and the like). Uninterruptible PoE systems, such as those described herein may be deployed with passenger security screening systems, embodiments of which are described herein to ensure uninterrupted power and communications for this crucial passenger safety operation.

Air travel transportation environments, such as the air travel embodiment depicted in FIG. 8 may also include passenger and crew boarding controls 812 that rely, yet again, on electronic systems, such as jet way gate door locks, boarding pass scanners, gate personnel consoles, agent communications, flight status screens, printing and scanning of pre-boarding carry-on luggage that is being checked for the flight, and the like. Unlike many areas of electronic systems for air travel described herein, boarding typically does not have multiples of these electronic systems; therefore, if power problems exist for a boarding pass scanner, boarding may be halted and potentially need to be moved to another gate. Therefore, simply ensuring that a primary power failure or fault by use of an uninterruptible PoE module configured to provide on-demand power backup for even a boarding pass scanner at a boarding control location 812 may provide significant benefits to passenger air travel and flight timeliness. Embodiments of an uninterruptible PoE module with one or more of these boarding control 812 electronic systems are further described herein.

In embodiments, air travel includes inflight operation 814 as well. Uninterruptible PoE systems may provide benefits for electronic inflight systems. Such systems may include, without limitation flight surface control due at least in part to uninterruptible PoE modules being available in weather/water proof configurations, landing gear sensing systems, inflight operation sensing systems, cabin lighting, in-seat lighting, airflow, power and the like. Benefits may include reduction in power, modularity of configuration, reduction in demand on vehicle wide power systems, and the like.

Air travel environments may also include interactions with air traffic control 816. While there may not be a direct touch point for passengers with air traffic control, critical portions of air travel depend on highly reliable air traffic electronic systems. Exemplary air traffic control systems, without limitation may include communications between aircraft and control towers and ground crew, radar systems in proximity to an air field, ground traffic sensors, and the like. As with many other aspect of air travel, electronic systems used for air traffic control 816 may benefit from the methods and systems of uninterruptible PoE described and depicted herein to at least provide uninterrupted power to critical air traffic control systems, some of which are identified herein.

In embodiments, air travel passengers may initially interact with powered security and service equipment when parking at an airport facility. Automated self-parking systems are typically deployed at airport parking facilities and may include entry and exit access controls, such as mechanical gates that operate responsively to parking ticketing and payment systems. Self-parking facilities may further include vehicle detection and tracking systems that may capture images of license plates and vehicles to help with vehicle location and recovery for travelers and the like. Such systems may utilize network connected vehicle sensing devices at key junctures in the facility, such as at aisle intersections and the like. Ticket dispensing kiosks at entry and exit points may need to remain active and communicate with parking payment kiosks at pedestrian access points, such as at an air terminal walkway and the like. These parking security and service systems may further be connected to other airport systems, such as security cameras, lighting, and outside systems, such as compliance, auditing, vehicle identification, vendor systems and the like. Deployment of these interconnected systems with one or more uninterruptible PoE modules may facilitate single cable connection for power and communication.

In embodiments, a parking entry/exit kiosk may include a range of semi-autonomous sub-systems including a keypad or touchscreen through which a driver may interact with the kiosk, a physical ticket dispenser, ticket physical capture port, a card reader (e.g., for reentry and the like), a card scanner (e.g., for monthly parkers), a presence detector (e.g., for detecting arrival and departure of a vehicle), a gate interface, a network or another communication interface and the like. One or more of these sub-systems may be configured with an uninterruptible PoE module that may provide reliable power (e.g., during primary power outage and the like) and may provide a means for communicating among the sub-systems (e.g., Ethernet data portion of the PoE interface), and the like. Parking entry/exit kiosks may also be subject to a range of environmental conditions, from daylong direct sun to sleet and freezing conditions. While a housing for the kiosk may facilitate isolation from the harshest of environmental conditions, providing power delivery system(s) that deliver consistently reliable power, such as with an uninterruptible PoE system as described and depicted herein may facilitate operation of parking access independent of the weather conditions.

In embodiments, parking systems, such as those contemplated to be employed for air travel vehicle parking facilities that include vehicle detection, identification and/or tracking may include image capture devices, such as digital still cameras, digital video cameras, visual scanners, motion detectors, facial recognition and the like. Any of these elements may be configured as noted throughout the garage, yet they need to effectively communicate among themselves to serve a basic vehicle tracking function. Each of these elements may be configured with or include integrated into it an uninterruptible PoE module that may provide power to connected sub-elements such as cameras, flash bulbs, processors, motion sensors, lighting, and the like that may be associated with one or more such elements. Through such a deployment, an uninterruptible PoE system may provide intra-element and intra-tracking system communication backup and power that may be reliably operated independent of any disruption in primary power or the like.

In embodiments, pedestrian accessible payment and parking information kiosks, such as those deployed at pedestrian entrances to a parking facility from an air terminal or terminal complex may be configured with a range of semi-autonomous sub-systems including a keypad or touchscreen through which a pedestrian may interact with the kiosk, a ticket physical capture and delivery port, a credit card reader (e.g., for payment), wireless device reader(s), a card scanner (e.g., for monthly parkers), a presence detector (e.g., for detecting arrival and departure of a person at the kiosk), a cash accepter, a network or other communication interface and the like. One or more of these sub-systems may be configured with an uninterruptible PoE module that may provide reliable power (e.g., during primary power outage and the like) and may provide a means for communicating among the sub-systems (e.g., Ethernet data portion of the PoE interface), and the like. Parking payment and information kiosks, especially those located in an open-air parking facility and the like, may also be subject to a range of environmental conditions, from daylong direct sun to sleet and freezing conditions. While a housing for the kiosk may facilitate isolation from the harshest of environmental conditions, providing power delivery system(s) that deliver consistently reliable power, such as with an uninterruptible PoE system as described and depicted herein may facilitate operation of parking payment independent of the weather conditions.

Uninterruptible PoE functionality may further include external connectivity replacement for network disruption that may be caused by primary power issues; thereby ensuring operation and external connection independent of primary power status. Further through use of PoE functionality in such a system, including for example a primary power and communication module, optionally with uninterrupted PoE systems at key points, such as entry and exit kiosks, payment kiosks, and the like may enable sustainable parking security, control, and service through a range of power disruption and loss scenarios. In embodiments, intelligent lighting systems in parking facilities may further enhance security and service by allowing lighting to be activated for portions of a facility that has activity, such as vehicle and pedestrian traffic entering it. Uninterruptible PoE systems may be deployed into and/or with such lighting systems to ensure that these additional security measures meet their expected performance criteria.

In embodiments, beyond parking, passengers, staff, crew, vendors, and the like require access to terminals and various security access-limited areas to access and provide services. While a passenger area of a terminal other than a portion secured by TSA and the like may have somewhat liberal security access procedures, access systems nonetheless exist and provide crucial access features, such as transport between floors (e.g., between arrival and departure, between a passenger walkway from a parking facility to arrival/departure, and the like). In embodiments, parking areas, walkways and other conveyance facilities for accessing a terminal, a passenger area of the terminal and the like may include life safety/mass notification systems, such as public address systems, mobile device broadcast systems, kiosk and travel service personnel terminals, and the like. Each of these systems may benefit from uninterruptible power and backup communications that may be provided by the various embodiments of UPoE systems described herein. In embodiments, access to terminals may also include access from ground transportation, such as public and private vehicles. In embodiments, passengers and the like may use an autonomous vehicle, such as a personal driverless car, to access a passenger terminal. Such a vehicle may transport a passenger to a ground transportation entry to a terminal and subsequently rely on sensors to find and secure a parking location nearby to await the passenger's return. In embodiments, ensuring that communication between the vehicle and airport automated parking systems is reliable and not negatively impacted by primary power loss and the like may be provided by one or more of the uninterruptible PoE systems described herein, such as without limitation a system that provides backup wireless communication and the like. Additionally, access to secure areas, such as those limited to flight crew, flight maintenance, baggage service personnel and the like may incorporate electronic-based access validation with optional human validation. Such portals may be configured with wireless and/or visual badge detection, facial recognition, headcount and the like that may demand uninterrupted operation independent of reliability of primary power. Further communication among these validation elements and other security and operation services may be necessary for passenger safety and the like. Therefore, these systems present additional opportunities for integration of uninterruptible PoE, such as at electronic gates, surveillance systems, and the like. Uninterruptible PoE may also present an opportunity to better monitor and control these access points under all primary power conditions so that access is maintained without substantially compromising security at time of power loss or inadequacy. In embodiments, semi-automatic and automatic electronic access control systems may include a range of module that work cooperatively to provide security services. Badge readers, wireless readers, head count systems, vision systems, recognition systems, presence and motion detection systems, networking/communication systems and the like may all play a role in providing terminal access controls. One or more of these systems may be configured with or include as an integrated module, an uninterruptible PoE system, such as those described and depicted herein. By continuing to provide power and/or communication functionality to terminal access control facilities, security may be enhanced while allowing for policy-based access restriction rather than merely closing down access when power is unavailable to process requests for access (e.g., when a valid badge is presented for validation to access a secure space) Configuring terminal and secure area access systems with PoE as a primary power source may further simplify installation, operation, and upgrading of systems as new functionality is embodied in next generation software releases, such as improved recognition and the like.

In embodiments, transportation systems that convey the public may have a range of electronic touch points associated with gaining access to the transport vehicle. In embodiments, air travel may include several touch points after a passenger enters an air terminal, such as flight information systems, check-in and travel reservation interface kiosks, bag drop operator terminals, boarding pass scanners, bag drop scales, conveyors, baggage sensing systems, and the like. Effective operation of so many functionally inter-related systems may involve reliable functioning and communication among them. If a flight information system cannot receive updates from flight control and planning, then passengers will be unable to use these information systems. If a bag drop scale cannot communicate with a corresponding bag drop operator terminal, checking of bags will be compromised. Therefore, at least for these basic reasons, ensuring consistent power and communications among these touch points may be crucial for smooth air terminal operation. By configuring one or more of these touch points with uninterruptible PoE modules, problems related to primary power delivery and/or networking may be seamlessly overcome so that passengers perceive no disruption. An uninterruptible PoE system that provides both uninterruptible power to a ticketing kiosk and back-up communication capabilities, such as wireless networking and the like may ensure that passenger access to these valuable air terminal resources are maintained. In embodiments, in the event of a network disruption to one or more of such kiosks and the like, an uninterruptible PoE module of the affected kiosk(s) may establish an alternate communication scheme, such as by configuring itself as a node in a mesh network of proximal uninterruptible PoE modules of, for example other kiosks in the air terminal. Such a mesh network may be configured and extended to other modules until at least one such module with external networking functionality is included in the mesh. In this way, a parallel network that relies on the wireless communication capabilities of the uninterruptible PoE module may be established and operated to overcome a primary networking system failure. Similarly, uninterruptible PoE modules at bag drop terminals, bag scanners, systems for performing bag tracking, bag drop scales, boarding pass scanners, dispensers, and the like may participate in the mesh; thereby increasing the likelihood of continued operation of the in-terminal travel-related touch point systems and communication with other systems such as central reservation systems and the like.

In embodiments, access by passengers to a secure passenger area, such as the area after a passenger passes through "security" at an air terminal also involved several interconnected systems that effectively form touch points for the passengers. Some touch points involve personal identification, such as passport/ID screening, customs and the like. Other such security touch points may involve traveler independent screening, such as an x-ray of baggage and the like. Exemplary passenger security screening systems may include initial review of a boarding pass, such as by an attendant to facilitate directing travelers to appropriate security screening queues. Here while the initial review may be manual, communications with the attendant may need to be maintained to ensure that screening is being successful and trouble free. Other passenger screening systems may include an attended kiosk at which an attendant uses a passport/ID scanner to validate and possibly record detection of a presented document, such as a passport, driver's license, and the like. A boarding pass may also be scanned here to ensure a proper match between traveler intention (e.g., travel today) and documentation (e.g., boarding pass for a flight leaving in the next several hours). Baggage to be brought onto the air craft is screened with an x-ray system that is attended by an operator. Such a system may include conveyors, x-ray machine(s), operator interfaces, and the like, all of which that must operate properly to ensure passenger safety measures are taken. Additional passenger security touch points while moving through air travel security screening include metal and full body scans, hand-held metal detectors, secondary scans (e.g., explosive detectors and the like) along with accompanying operator terminals. While each of these systems performs a standalone security screen, each is operated cooperatively either automatically or with at least partial human intervention. Therefore, to maintain smooth operations in this critical passenger "bottleneck", uninterrupted operation may be crucial. An uninterruptible PoE system configured with one or more of these systems, either collectively at a given queue location or individually at several such touch points may provide greater reliability of operation that can be at least partially independent of disruptions in primary power and/or communications that may occur. Additionally, such systems may stand idle for long periods of time based on flight scheduling and/or staffing, but may be required to be operated with almost no notice. Therefore, a flexible power delivery and control system that ensures operation of each touch point, and potentially for several sub-systems at each touch point may be beneficial. Some touch points in this regime, such as passport checking devices may rely on high availability of communication with other, potentially external systems, such as government passport validation systems and the like. Ensuring access to and security of communication for such purposes may benefit from a system such as an uninterruptible PoE system as described and depicted herein that may provide primary power, backup power, backup communications, and the like for connected devices. Other screening systems, such as facial recognition and the like may be employed at a passenger security screen area, and optionally elsewhere in an air terminal, such as at baggage claim, terminal entry and exit, at parking payment kiosks, at the gate, and the like. Uninterruptible PoE systems may be incorporated into or with facial recognition screening systems to ensure this crucial passenger travel safety component remains enabled and effective independent of primary power loss and/or primary communication channel loss, and the like.

In embodiments, an uninterruptible PoE system that incorporates power delivery and communications may be configured with a communication device of an attendant at a key security location, such as when screening passengers. By incorporating location detection with such as system, as may be configured into an uninterruptible PoE system as described herein, unexpected movement of the attendant from the location may be detected and an alert may be generated. Additionally, use of an uninterruptible PoE system may enable a device to remain powered and active, even if the device is inadvertently powered on for longer than its built-in dry cell battery may allow, such as when the device is stolen or lost. This may enhance the security and facilitate locating and control of the device remotely.

Once through security, passenger safety and comfort may be impacted by a range of additional electronic devices, such as Point-Of-Sale systems, and the like. These systems may provide services, such as communication, electronics charging, shopping, and the like. At least some of these services may ensure passenger comfort and safety that should not be substantively diminished due to primary power loss and the like. In embodiments, a personal electronic charging station may need power to properly restrict access to personal electronics docked for charging. When power is lost, not only may the personal electronic device fail to properly charge, but access to an individual dock may be compromised when primary power is lost (e.g., a user may not be able to access his personal electronic device or docks may automatically unlock when power is lost). Therefore, ensuring at least continuous secure access to a personal electronic device charging dock may be provided by an uninterruptible PoE system as described herein.

In embodiments, passenger and crew access to transportation, such as to an aircraft may further include electronic touch points that further restrict access, so that, for example only passengers with valid boarding passes for a given flight may enter the aircraft. These passenger and flight crew aircraft access touch points may include electronic security scanning systems, such as boarding pass scanners, badge or other crew identity validation measures, and the like. These and related systems may interface with physical security devices, such as electronic door locks and the like to facilitate limited access. Additionally, an agent, such as a gate attendant may be positioned and interact with a networked terminal at the aircraft jet way entry to facilitate changes and special passenger conditions. The agent may have a form of personal communication, such as phone or other wireless device as well as communicate via the terminal with other transportation systems, such as baggage, reservations, other terminal(s) at the gate, and the like. In embodiments, larger aircraft may be boarded through parallel agents and therefore require multiple boarding pass scanners operating cooperatively during the boarding process. A familiar feature at terminal gates is a flight identification and status indication board that may be electronically connected to other systems including, without limitation, the flight status system, air traffic control, airline business systems, and the like. From time to time, gate personnel may also perform baggage tagging and collection activities, such as when carry-on space on flights is overbooked. Therefore, ticket and baggage tag printers and scanners may be used at an airport terminal gate. As with most other touch points associated with air travel, smooth operation and security is paramount; therefore, equipment reliability, including availability of proper power and communication is crucial. Air terminal gate touch points, including without limitations boarding pass scanners, boarding pass printers, baggage tag printers, gate electronic terminals, jet way door locks, crew identification validation systems, flight display boards, and the like may therefore benefit from integration with an uninterruptible power source, such as an uninterruptible PoE that may provide consistent power independent of primary power status as well as provide ongoing communications among touch points and to external systems, such as reservation systems and the like.

In embodiments, each boarding pass scanner at an air terminal gate may be configured with one or more uninterruptible PoE modules to provide power throughout a boarding process. A boarding pass scanner may include an adaptable illumination element, a scanning element, a communication element, an audio/visual indicator element, and the like and may be housed in a transportable enclosure to facilitate ready placement where and when needed. Such a modular system may benefit from an uninterruptible PoE module as described herein for both power backup and system configuration by use of a single power-capable Ethernet cable (or other type of connection) Each such element must communicate with each other element so that its automatic operation that may include detecting a boarding pass being presented, properly illuminating the boarding pass, which may be dependent on how the boarding pass is presented (e.g., paper or smart phone), scanning the boarding pass (e.g., bar and/or matrix code), validating the boarding pass (e.g., by communicating with a reservation system, and the like), alerting the agent of the result of validation (e.g., by flashing a red/green light with accompanying audible alert), and communicating with any other systems, such as a gate terminal, another gate boarding pass scanner and the like, can be performed properly. Without uninterruptible power, such as may be provided by an uninterruptible PoE module as described herein, if power to one of the boarding pass scanners were to fail, boarding may be halted while the problem is diagnosed and fixed. However, through the use of an uninterruptible PoE module, even if primary power was temporarily lost for the scanner, normal boarding operation may continue with little or no interruption, while the power disruption can be detected and an alert can be generated and communicated to system controllers.

In embodiments, once on-board an aircraft, a passenger, flight attendants and crew may encounter additional transportation-related electronic touch points that impact flight safety, operation, passenger comfort, and the like. While these electronic touch points further enhance the in-flight experience, each one may need to connect to others and may present opportunities for increasing net weight of the aircraft. In embodiments, aircraft operation involves many electro-mechanical systems; however, some exemplary systems may include flight surface control, landing gear operation, and the like. Other exemplary systems may include cabin lighting, in-seat lighting, emergency sign and pathway illumination, in-seat power, in-seat airflow, in-seat touch screen information/entertainment display, WiFi, and the like. Some compartments, such as first-class may include electronic seat positioning, personal climate control, seat heating/cooling, and the like. Integrating uninterruptible PoE rechargeable modules with the various touch points may substantively increase the ease of modularity of the various component of the aircraft while further reducing weight and ensuring power is available to these touch points throughout the flight. In embodiments, a coach passenger seat may be modularly constructed with in-seat power provided from an uninterruptible PoE module, touch screen power and communications may be provided with an uninterruptible PoE module that further provides external communication and the like. In embodiments, a row of seats, or any group of seats may be configured to operate with a common uninterruptible PoE module that provides power and communications over a single Ethernet connection that may be modularly wired as the sole connection to each seat in the row/group.

In embodiments, aircraft operation, such as operation of air surfaces and the like may benefit from use of embodiments of uninterruptible PoE modules as described and depicted herein by taking advantage of their light weight, environmental tolerance (e.g., water and temperature resilient, and the like), and modularity.

In embodiments, public and many transportation systems utilize traffic controls for safe operation in a given space, such as along roadways, railways and in the air. Air travel may rely on air traffic control systems that combine a wide range of electronic powered systems with human assisted procedures. Some exemplary air traffic control systems may include, without limitation, communication systems between aircraft and land-based operational centers, aircraft emergency beaconing systems, radar and other aircraft detection and imaging systems, airport ground traffic sensors, visual beaconing, airstrip lighting, and many others. Ensuring that these traffic control systems communicate with each other and operate properly and continuously in all environmental and weather conditions poses a challenge to any power delivery system. In embodiments, an uninterruptible PoE system, such as those embodiments described and depicted herein may be integrated with or into one or more of the traffic control sub-systems for control of air traffic thereby providing an uninterrupted source of power that is independent of primary power loss or sufficiency. Uninterruptible PoE systems as described herein may include embodiments that provide weather and environmental resistance, such as water proofing, high and low temperature operation, and the like that may be suitable for use by traffic control elements, such as radar systems, air field and air strip lighting, vehicle mounted sensors, signal generators, beacons, and the like. In embodiments, a rechargeable uninterruptible PoE module integrated into an air field direction indicator, such as an air strip identification display may provide continuous uninterrupted power to the display. Further integration with a solar collector may facilitate operation without requiring a powered connection to a main line of power. The uninterruptible PoE module could work cooperatively with the solar collector, which may be mounted directly onto the display housing to recharge uninterruptible PoE battery packs when solar energy is available and to use the stored energy from the battery packs during times of little or no solar activity, such as at night.

In embodiments, embodiments of an uninterruptible PoE system may be combined with systems deployed throughout a transportation environment, such as an air-travel environment, and the like. The uninterruptible PoE systems may be configured in many different embodiments, including without limitation, circuit board level embodiments, multi-level circuit boards, plug-in blade embodiments, rack-mountable embodiments, modular embodiments, pluggable embodiments, sealed enclosure embodiments, interconnected component embodiments, stackable embodiments, daisy-chained embodiments, and the like. Electronic systems, such as those described herein and generally known to be deployable in air travel environments, such as pre-flight parking, passenger check-in and baggage drop, securing screening, jet way gate access, a in-flight operations and the like may be configured with any of the embodiments of uninterruptible PoE systems as described herein. In an example, a parking facility access system may include a parking facility entry system that captures images of a vehicle and license place and dispenses a ticket for later payment. The entry system may be configured with a driver interaction interface electronic system into which a circuit board embodiment uninterruptible PoE system may be integrated. In another example, a ventilation system of the parking facility may be configured with an electronic control system with which a daisy-chained uninterruptible PoE system may be integrated to, for example, provide greater and longer-lasting backup power that is enabled through daisy-chaining multiple uninterruptible PoE systems. In yet another example, an electronic control for a passenger flight check-in kiosk need to be provided with uninterrupted power to facilitate smooth and timely passenger check in. An airport may have a large number of check-in kiosk; therefore, a modular uninterruptible PoE system may be integrated with the kiosk electronic controls to facilitate ease of maintenance and assembly. Combinations of uninterruptible PoE embodiments are also possible, such as a sealed enclosure, stackable embodiment. An application, such as flight surface controller of an aircraft in-flight may require an uninterruptible PoE that is both sealed and provides long-lasting backup power to ensure power is provided to the air surface controller under severe weather conditions (e.g., rain, wind, freezing cold, and the like). While specific combinations of transportation systems and uninterruptible PoE systems are disclosed, a product designer may select different uninterruptible PoE systems based on other factors, such as cost, weight, size, availability, power density and the like. In embodiments, a designer of a transportation system may adapt a design of one or more transportation-related electronic systems to more readily accept a wider range of uninterruptible PoE system embodiments.

In embodiments, outdoor operations, such as mining, excavating, construction and the like rely on powered devices to perform many operational, safety, and security activities. These and other outdoor operations may face infrastructure challenges that may limit the degree to which a consistent, reliable, and sufficient source of power can be ensured for all powered uses. Challenges include environmental conditions can range widely from high temperature locations to sub-zero operation along with wet conditions brought about by local weather conditions. Additional challenges include temporal and location-based factors. Access to a primary source of AC power may not exist at the job site, or may be difficult to ensure as operations progress (e.g., as excavation expands on the job site, and the like). However, most operations in mining, excavation, construction and the like rely on electrical power. Operator safety relies on safe reliable operation of worker detection, sensing, and protection devices. Security of the site and the personnel and equipment thereon requires reliable electrical power around the clock. Many devices used in such embodiments are self-powered, relying on an internal source of electricity, such as a dry cell for operation. While some such devices are low power (e.g., a proximity sensor), many make a greater demand on this source of power.

Ensuring that all electrical energy demand is met for fixed infrastructure elements, mobile elements, hand-held elements, and the like may be accomplished by an uninterruptible source of power. Such a source of power may be required to be provided in a range of embodiments that meet differing power demands, environmental demands, functionality demands, and the like. The methods and systems of uninterruptible PoE, such as via an injection device and the like as described herein may meet the requirements for electrically powered devices in outdoor operations, such as mining, excavation, construction and the like. The uninterruptible PoE systems described and depicted in the figures referenced herein may provide the power density, power capacity, functionality, environmental resilience, form factor, integration options and the like to be integrated with and/or into the powered systems on which outdoor operations rely.

Figure 9:
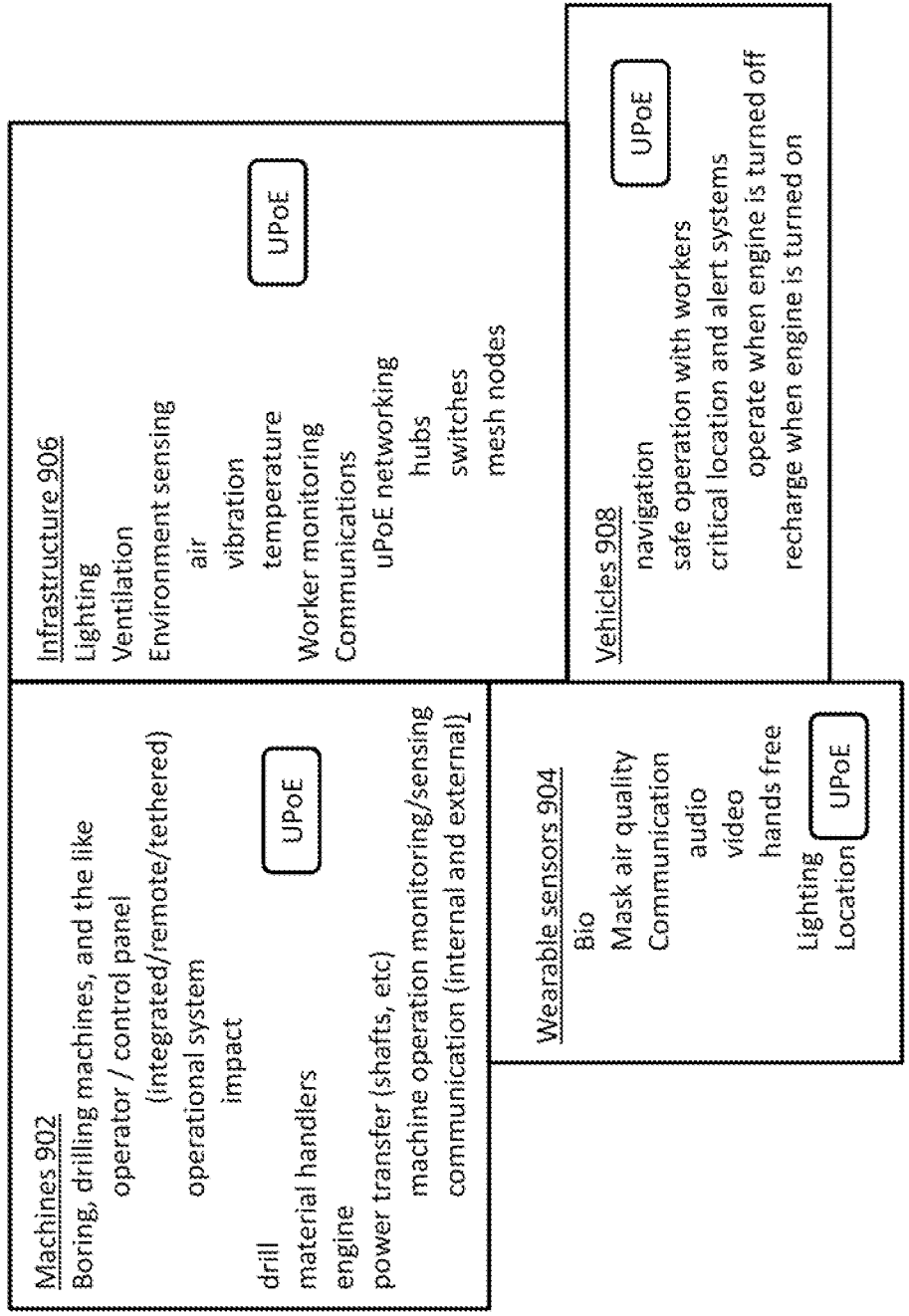
FIG. 9 depicts a block diagram of an outdoor mining environment and related electronic systems for deploying uninterruptible PoE via an injection device.

In embodiments, FIG. 9 depicts an outdoor environment for deployment of methods and systems of uninterruptible PoE via an injection device. The mining environment 900 of FIG. 9 may include a range of electronic systems that may benefit from use of an uninterruptible PoE device with optional wireless communication functionality. Electronic systems of a mining environment may include machines 902, wearable sensors 904, infrastructure 906, vehicles 908 and the like. Mining environment machines may include boring, drilling and other machines for harvesting ore. These machines may include operator panels, control panels and the like that may be integrated, remote and/or tethered. Other machines may include large full-bore drilling machines, material handlers, and the like. Machines may include subsystems, such as engines, power transfer devices (e.g., drive shafts and the like), operating sensors, communications (from subsystem to subsystem, to other machines, and to base stations, such as land-based stations and the like. The mining environment 900 may include wearable sensors 904 that may be useful for worker safety and health including biometric sensors, air quality sensors (e.g., as may be deployed in a worker's breathing mask and the like), personal lighting of a worker task area (e.g., a helmet or other worker mounted light, and the like), worker location monitoring/broadcasting, communication, such as audio, video, hands free and the like. Mining infrastructure 906 may include subterranean lighting, ventilation, environment sensing (e.g., air, vibration, temperature, etc), worker location sensing and monitoring, communications (e.g., repeater-type communication for high quality communication throughout a complex mining tunnel set). Vehicles 908 in a mining environment 900 may use electronic systems for navigation, safety, operating in poorly lit conditions, critical safety and location systems and the like. Electronic systems in a mining environment 900, such as electronic mining machines, electronic wearable devices, electronic infrastructure devices, electronic vehicle systems and the like may be deployed with one or more uninterruptible PoE modules integrated with and/or into them to provide uninterruptible power when a primary power source is unavailable, backup or primary wireless communication, and the like.

In embodiments, a mining operation may include one or more boring and/or drilling machines, lighting systems, air ventilation systems, environmental sensing systems, communication systems, worker monitoring systems, and the like. Each of these systems may include one or more sub-systems that require electrical power for proper operation. A boring or drilling machine may have an operator interface to control the primary boring/drilling subsystem. It may also have operational sub-systems, such as material handlers, operational monitoring systems (e.g., motor functions, and the like), communications systems (e.g., to communicate among the functional elements, with externals systems, with remote control panels, and the like). Such machines may be configured of a collection of modules that facilitate convenient and rapid servicing procedures, such as removal and replacement of defective or maintenance-ready modules. The entire machine may benefit from use of modules that are configured with an uninterruptible PoE power delivery and fail safe system that provides all power and communication capabilities, including primary power failure power management modularly. Such a power delivery system may be configured with each module of the machine thereby ensuring that each module can have at least its power demand requirements met without interruption even when a primary source of power is not readily available or is insufficient. Use of Ethernet to communicate among the modules of such machines can further simplify service requirements by reducing the number of connections to be made for each module, perhaps to a single power injector capable Ethernet cable. Uninterruptible PoE systems as described herein also can be integrated with and/or into machine modules while meeting stringent environmental durability requirements, including embodiments configured to comply with IPV6+ Internet communication protocols and the like standards.

In embodiments, outdoor operations, such as mining and the like may include highly stressful environments with many safety concerns for workers. Efforts to mitigate health and safety risks to workers may include maintaining reliable verbal, visual, and radio communications among workers, machine operators, management, surface personnel and the like. Additional efforts may include monitoring worker health, location, activity, and the like. In an example, simply ensuring a worker has sufficient lighting for his task, such as via a headlamp and the like, can have a positive impact on worker safety. However, each of these worker health and safety efforts involve some form of powered device; communications require at least a two-way radio, detecting and maintaining worker location requires positioning technology as well as a way to communicate the worker location in near real-time to automated equipment that may present a hazard, worker health monitoring may require wearable sensors, aspirators, safety helmets and other gear (e.g., gloves, arm guards and the like), worker lighting may merely involve ensuring a worker's personal source of light (e.g., a head lamp is properly powered). Each of these aspects of worker safety management may benefit from a source of uninterruptible power and communications, such as may be provided by an uninterruptible PoE system configured to work with highly portable systems, such as worker bio sensors, hands free communication devices, worker location detection and beaconing systems, and the like. In embodiments, mining worker safety systems, such as wearable sensors may play a crucial role in mining safety. Ensuring that these systems have uninterrupted power and reliable communications can be provided by an uninterruptible PoE module as described and depicted herein. An uninterruptible PoE module may include a durable, sealed power source, such as a rechargeable set of battery packs controlled by a digital controller that facilitates management of the supply of power to connected devices, such as heard rate monitor(s), air filtration (e.g., aspirator) status, worker location in the mine, audio and/or video communication with other workers, subterranean control centers, surface-based control centers and the like.

Each of these devices may be connected to the uninterruptible PoE module via a power injection-capable Ethernet cable that provides power and communicates to the devices. In an example, a controller for the uninterruptible PoE module may communicate via the Ethernet cable with a processor that is monitoring (e.g., via an air quality or other type of sensor) the worker's air filtration mask. If sensors in the mask indicate a dangerous level of air impurities may be reaching the worker, the uninterruptible PoE module may activate one of its wireless communication modules (e.g., WiFi, and the like) to ensure that this status is reported to the relevant health safety personnel, including the worker himself.

In embodiments, a worker uniform may be configured with sensing, communication, lighting, and the like devices that each connect through powered Ethernet to a common uninterruptible PoE module disposed in/on the worker uniform. In this way, each wearable module may be configured for lightweight operation, relying on the common uninterruptible PoE module for uninterrupted power, intra device communication, and alerting of any errant conditions via an external communication capability of the uninterruptible PoE module.

In embodiments, mining operations typically incorporate ventilation systems to ensure removal of airborne contaminants and delivery of fresh air to the subterranean work areas. Ventilation systems provide large amounts of air flow, a loss of air flow could be dangerous to mining workers; therefore, ventilation systems may include air flow sensing, motor operation sensing, air quality sensing, auxiliary fans, entry/exit fans, chamber-specific fans, and the like. Due at least to the significance of continuous operation of ventilation, ensuring devices that produce air flow and control it (e.g., louvered gates, electronic control systems, air quality and flow sensors and the like) may be configured with an uninterruptible power source. Additionally, communication among the elements, such as between a primary and backup fan, may be crucial for safe mining operations. In embodiments, a ruggedized, environmentally sealed and/or resistant uninterruptible power source, such as embodiments of an uninterruptible PoE as described and depicted herein may be integrated with or into ventilation elements, such as controllers, regulators, sensors, and the like. A light-weight, low power, sealed uninterruptible PoE module may be suitable for use with an air flow sensor. A high capacity uninterruptible PoE module may be suitable for integration with an airflow generator to ensure that the controller is provided sufficient power for proper operation of the airflow generator for several hours after loss of primary power, and the like. In embodiments, the uninterruptible PoE module may be used as a backup source of power that is automatically activated when primary power to the ventilation systems module is lost or become insufficient. Devices connected via a power providing Ethernet cable may be powered full time by the uninterruptible PoE or may receive backup power via Ethernet cable power injection only when a primary source of power fails.

In embodiments, mining operations may incorporate vehicle operations to facilitate removal of mined materials, such as ore and the like. Free moving and railed vehicles may be used throughout the mines. Basic vehicle operation may include use of proximity sensors, back up alerts, routing/mapping, payload status (empty, full, and the like), location, and the like. Each vehicle may be equipped with electronic sensing and control elements, such as those mentioned here as well as many others that are vehicle specific (e.g., a fuel gauge and the like). Many functions of each vehicle may be operated from a vehicle power system. When vehicle power is turned off, these functions may no longer be operational. In an example, locating and/or navigating around stationary, unpowered vehicles may be a use case for a backup power system, such as the uninterruptible PoE systems in various embodiments that are described herein. An uninterruptible PoE may facilitate ensuring that critical vehicle systems, such as location, proximity detection and signaling, and the like may remain operational even when the vehicle is turned off while avoiding draining a primary vehicle power source, such as the starter battery. By configuring the critical vehicle systems that may require power when the vehicle is turned off with a rechargeable integrated uninterruptible PoE system, these critical vehicle systems can be operated continuously and their energy source (e.g., a battery pack of the rechargeable uninterruptible PoE module) can be refreshed when the vehicle is turned on.

In embodiments, outdoor operations, such as mining and the like may rely on electrical powered sensors that monitor status of important aspects of the operation, such as air quality and quantity, location of devices and workers, vibration, moisture in the soil, and the like. Sensing these and other operational aspects may require arbitrary sensor placement as the mining operation progresses and/or conditions change. Therefore, modularity, independence of operation, and wireless communication with base stations and the like may be among the desirable characteristics for such sensing systems. Sensing systems may be configured with embodiments of the uninterruptible PoE modules described herein that meet the specific needs of each sensing system. In an example, an air quality sensor may be positioned at key points throughout the mine so that early warning of air quality problems can be detected and communicated to the workers and mine operations. With the harsh conditions that exist in a mine, an environmentally ruggedized uninterruptible PoE module may be preferred for such systems. An uninterruptible PoE module that includes power packs to provide power to the sensor system, built-in wireless communications, network switching and or routing to facilitate automatic communication among the sensors and other devices, such as operations terminals and the like, ruggedized enclosure that is resistant to moisture, vibration and the like, plug-n-play functionality, modular Ethernet connectivity, and the like may be used as a base onto which specific sensor systems can be configured, such as air quality, others listed above herein, and the like. Therefore, an exemplary air quality sensor system may include a networkable, uninterruptible PoE module integrated with or into an air quality sensor module configured into an environmentally suitable mounting enclosure and the like.

In embodiments, outdoor environments, such as mining, excavating and the like may utilize electronic communication, such as wireless radio-type communication among workers, among machines, devices, terminals, external systems and the like for both subterranean and ground-based systems. Establishing a communication network for various information forms, such as voice, audio, real-time data, report-based data, plans, feedback, and the like may be essential for best mining practices. An uninterruptible PoE module configured with wireless networking capability, may be useful for establishing mesh and other types of data networks in addition to providing primary power and/or backup power for electrically powered mining devices. Building on the example of configuring air quality sensors throughout a mine with uninterruptible PoE modules, each module could support more than just an air quality sensor through connection via an Ethernet cable. While an uninterruptible PoE may be configured with an integrated wireless communication capability, each air quality sensor system could also include, via the Ethernet functionality of an uninterruptible PoE, a wireless network module, such as a hub or the like. A single uninterruptible PoE module could provide power over Ethernet to the air quality sensor and to the wireless network module or hub and the like. In embodiments, a plurality of wireless communication enabled uninterruptible PoE modules could be disposed throughout the mine to establish a radio communication network that could serve to provide a reliable means of communication to workers, land-based systems, machines, devices, sensors, and the like throughout the mining operation. With a modular construction, an uninterruptible PoE disposed in a mining operation to provide networking functionality could be upgraded by connecting via an Ethernet interface, various sensors, communication devices, lighting, cameras, and the like. Because an uninterruptible PoE module may be configured to facilitate field-upgrading of battery capacity, as devices are added to each uninterruptible PoE installation, additional battery modules could also be added as needed.

In embodiments, embodiments of an uninterruptible PoE system may be combined with systems deployed in outdoor environments, such as mining, and the like. The uninterruptible PoE systems may be configured in many different embodiments, including without limitation, circuit board level embodiments, multi-level circuit boards, plug-in blade embodiments, rack-mountable embodiments, modular embodiments, pluggable embodiments, sealed enclosure embodiments, interconnected component embodiments, stackable embodiments, daisy-chained embodiments, and the like. Electronic systems, such as those described herein and generally known to be deployable in outdoor environments may be configured with any of the embodiments of uninterruptible PoE systems as described herein. In an example, a boring machine may be configured with an operator interface electronic system into which a circuit board embodiment uninterruptible PoE system may be integrated. In another example, a ventilation system may be configured with an electronic control system with which a daisy-chained uninterruptible PoE system may be integrated to, for example, provide greater and longer-lasting backup power that is enabled through daisy-chaining multiple uninterruptible PoE systems. In yet another example, an electronic control for outdoor environment lighting may need to be sealed from the elements. Therefore, a sealed enclosure uninterruptible PoE system may be integrated with a similarly sealed lighting module to provide backup power and optional automatic network configuration and operation throughout an outdoor site in which such light modules are deployed. Combinations of uninterruptible PoE embodiments are also possible, such as a sealed enclosure, stackable embodiment. An application, such as a pump for evacuating water from a construction area may require an uninterruptible PoE that is both sealed and provides long-lasting backup power to ensure power is provided to the pump under harsh weather conditions (e.g., rain storms and the like) that are likely to be occurring when the pump is needed. While specific combinations of outdoor mining and/or construction systems and uninterruptible PoE systems are disclosed, a product designer may select different uninterruptible PoE systems based on other factors, such as cost, weight, size, availability, power density and the like. In embodiments, a designer of a mining system may adapt a design of one or more mining-related electronic systems to more readily accept a wider range of uninterruptible PoE system embodiments.

In embodiments, operations performed outdoors, such as construction and the like may involve the use and coordination of a range of industrial machines, power equipment, service vehicles, survey equipment, monitoring systems, inspection systems, site and worker security measures, worker safety and communication systems and the like. Each of these aspects of outdoor construction may involve use of electrically powered devices, machines, vehicles, and the like. Outdoor construction sites typically do not provide centralized power, so each working unit or device typically provides its own source of power or relies on a local source of power, such as an internal combustion-based electrical generator. Additionally, environmental conditions at outdoor construction sites can vary based on geographic location, season, time of day, weather patterns and the like. Therefore, ensuring that operating devices and the like can be properly operated under a wide range of environmental conditions may be a basic requirement for efficient and cost effective construction operations. Embodiments of uninterruptible PoE systems deployed for use with an outdoor construction operation are described below. Benefits from use of uninterruptible PoE in such a deployment include form factor options, ability to be environmentally sealed/resistant, rechargeability, continuous supply of power independent of the lack of a primary source of power, data communication functionality, and others.

Figure 10:
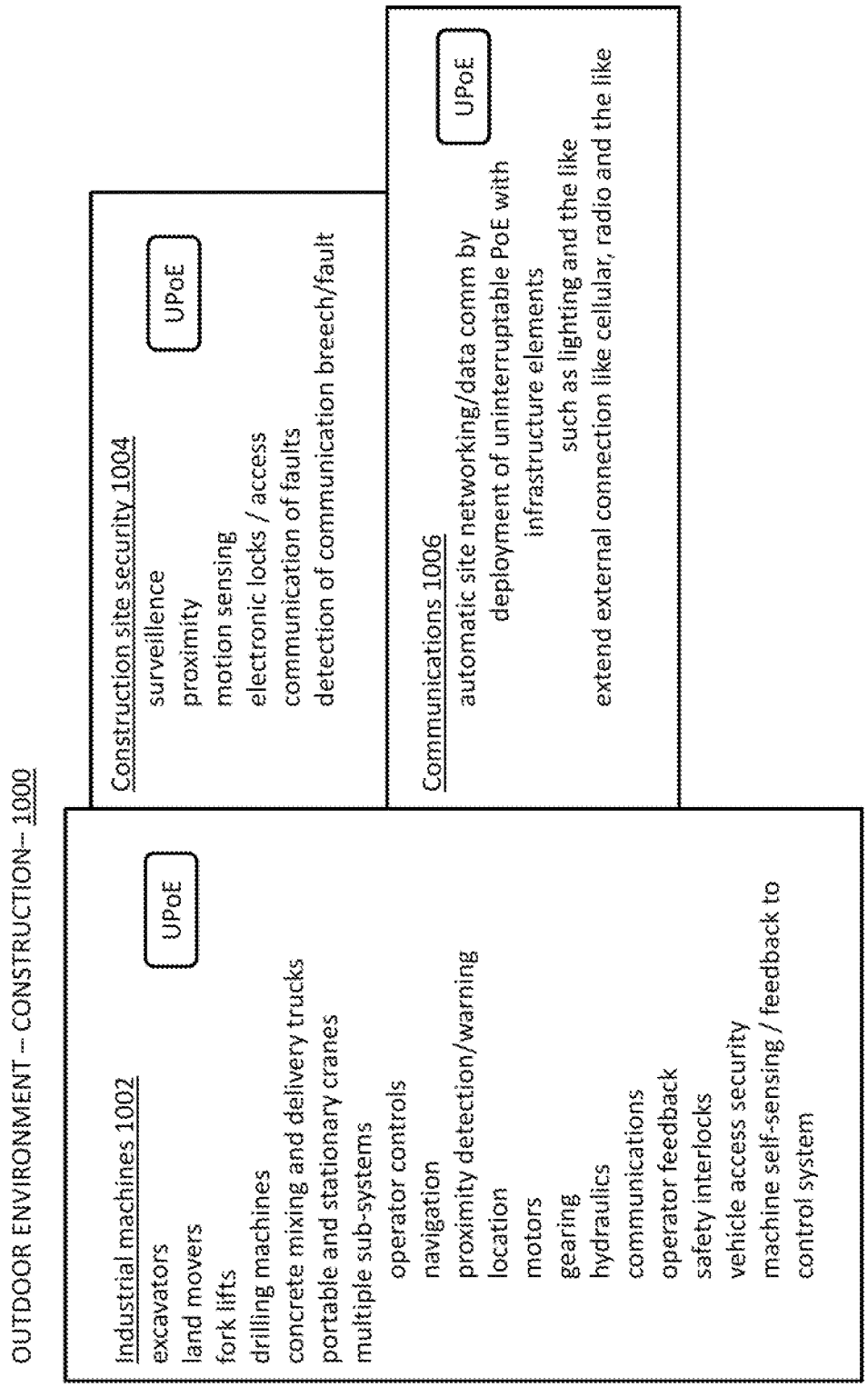
FIG. 10 depicts a block diagram of an outdoor construction environment and related electronic systems for deploying uninterruptible PoE via an injection device.

In embodiments, FIG. 10 depicts an outdoor environment for deployment of methods and systems of uninterruptible PoE via an injection device. A construction environment 1000 may include electronic systems that may benefit from use of an uninterruptible PoE system may include industrial machines 1002, construction site security systems 1004, communication systems 1006 and many others. Industrial machines 1002 may include, without limitation excavators, land movers, fork lifts, drilling machines, materials movers, concrete mixers, cranes (e.g., portable and/or fixed location) and the like. Construction site security 1004 may rely on electronic systems, such as surveillance (visual, infrared, audio and the like), proximity detection, motion sensing, electronic locks and access authentication, communications to confirm a site is secured. Use of uninterruptible PoE modules for construction site security 1004 devices may enable and facilitate improving and reliability of electronic security systems by ensuring uninterrupted power and backup electronic communications. Construction site communication 1004 by nature is based on electronic systems (radios, and the like). Such systems may be combined with construction site infrastructure to provide communication throughout a construction site. Combining lighting with a wireless communication uninterruptible PoE module may enable establishing a communication network throughout the site that is resistant to power outages, variation, and the like while ensuring that lighting throughout the site is provided power when needed, independent of a good quality source of site-wide power.

In embodiments, construction operations may include use of industrial machines, such as excavators, land movers, fork lifts, drilling machines, concrete mixing and delivery trucks, portable and stationary cranes, and the like. Most if not all of these machines have several interconnected sub-systems that provide for control and functioning of the machine. Sub-systems include, without limitation operator controls, navigation, proximity detection/warning, location, motors, gearing, hydraulics, communications, operator feedback, safety interlocks, vehicle access security and the like. Ensuring that each of these systems receive the power, particularly the electrical power that they demand requires careful planning and design of a machine. Uninterruptible power systems may play a crucial role in ensuring that electrical power is provided as needed for the use of industrial machines, such as in outdoor construction operations. Machine performance may be impacted by something seemingly benign as a loss of power to an articulated arm feedback sensor. The methods and systems described herein for providing uninterruptible power over Ethernet may fill the role of ensuring that power is provided to industrial machine sub-systems, such as those that may be described herein and elsewhere. In the example of using of an industrial machine with an articulated arm and corresponding feedback sensor at an outdoor construction site, the sensor may facilitate providing information to an operator of the machine when using it to load a pallet of construction material from a transport flatbed to a point of use of the construction material, such as a newly constructed floor of a building. Failure of the sensor from lack or insufficiency of primary power could cause the machine to incorrectly compensate for the load being placed on the arm, which may result damage to the vehicle, the material, the newly constructed building, the operator and/or other workers. While power may not fully fail, temperature and other factors may prevent proper power levels (e.g., a proper voltage) from being present on the sensor. An uninterruptible PoE module integrated with or into the sensor would ensure to provide power to the sensor when proper power levels could not be provided from the vehicle power system and the like.

In embodiments, construction sites typically employ security measures that may include physical security through the use of perimeter fences, locked gates, locked equipment lockers, and the like. Electronic security measures may include video surveillance, lighting, human activity detectors, device or equipment movement alarms, and the like. In addition to generating audible and possibly visual alerts when a detectable security breach is identified (e.g., a person is detected walking in a locked area after work hours), communication of sensed conditions provides a means for ensuring that security is being provided. Intentional acts, such as disabling power and/or communication lines to a security sensor and the like may compromise security monitoring. However, embodiments of an uninterruptible PoE system as described and depicted herein, when integrated with or into security system components may provide functionality of security systems for construction sites, such as continuous power that is independent of primary power, communications independent of loss of primary communication, and the like. In embodiments, an uninterruptible PoE module configured with wireless communication capabilities may be integrated with a security device, such as a presence detector. The uninterruptible PoE module may monitor communication between the security device and a base station and the like. When the uninterruptible PoE module detects an interruption in communication that exceeds a security breach threshold, a wireless communication interface of the uninterruptible PoE module may be activated to facilitate resuming communication between the security device and a base station and the like. Likewise, when the uninterruptible PoE module detects an interruption in primary power to the security device, a backup source of power that is accessible to the uninterruptible PoE module, such as a connected battery module may be activated to provide power over Ethernet to the security device; thereby enabling the security device to continue to operate and play its role in construction site security.

In embodiments, other construction operation use of uninterruptible PoE may include providing continuous power to power equipment such as hand-held tools, portable tools, service vehicles including autonomously operated vehicles for functions such as continuous location determination, navigation, collision avoidance, and the like. Embodiments of uninterruptible PoE systems may include modules and/or modular systems and the like that may be constructed for water proof and weather proof uses in corresponding outdoor environments. In embodiments, uninterruptible PoE modules may be configured to establish a data communication network throughout a construction site, by activating a wireless networking function of the uninterruptible PoE module independent of the uninterruptible PoE module providing power to a connected device.

Each such uninterruptible PoE device that is deployed in the construction site may work cooperatively with other uninterruptible PoE devices and base stations to facilitate communication to other devices that may be equipped with radio frequency communication capabilities. In embodiments, a network of uninterruptible PoE devices in a construction site may facilitate voice over IP communication to workers on the site that may extend the reach of cellular and other wireless communication technologies onto the site. Construction on remote sites may further benefit from long range radio communication functions of an uninterruptible PoE module to provide a reliable connection outside of the construction site.

While outdoor operations, such as mining and construction are used as examples of environments in which uninterruptible PoE may be utilized, there are a range of other outdoor environments, including without limitations, tank farm security, such as for tank farms that are proximal to seaports, security infrastructure, such as the U.S. Coast Guard's Mosaic system, power sub stations, pipelines, and the like. Each of these and other outdoor environment systems demand a high degree of reliability so an uninterruptible PoE system that ensures continuous power and optionally backup communications whenever power and/or communication is lost or is unacceptably compromised may be integrated into or with deployments of these systems.

In embodiments, large scale communication systems rely on outdoor operations through wired and wireless nodes deployed in a range of environmental conditions. To the extent that these outdoor operations may be backed up with an uninterruptible PoE system, the methods and systems of uninterruptible PoE that are described herein present opportunities to develop a long distance communication system that is independent of an existing power grid. Deployment of communication and security network infrastructure components that are powered from a rechargeable uninterruptible PoE system and operate independently of availability of power from a common power grid may be of interest to services that are in demand when disaster strikes, such as the National Guard, the Federal Emergency Management Agency and the like.

In embodiments, embodiments of an uninterruptible PoE system may be combined with systems deployed in outdoor environments, construction, lighting, and the like. The uninterruptible PoE systems may be configured in many different embodiments, including without limitation, circuit board level embodiments, multi-level circuit boards, plug-in blade embodiments, rack-mountable embodiments, modular embodiments, pluggable embodiments, sealed enclosure embodiments, interconnected component embodiments, stackable embodiments, daisy-chained embodiments, and the like. Electronic systems, such as those described herein and generally known to be deployable in outdoor environments may be configured with any of the embodiments of uninterruptible PoE systems as described herein. In an example, a boring machine may be configured with an operator interface electronic system into which a circuit board embodiment uninterruptible PoE system may be integrated. In another example, a ventilation system may be configured with an electronic control system with which a daisy-chained uninterruptible PoE system may be integrated to, for example, provide greater and longer-lasting backup power that is enabled through daisy-chaining multiple uninterruptible PoE systems. In yet another example, an electronic control for outdoor environment lighting may need to be sealed from the elements. Therefore, a sealed enclosure uninterruptible PoE system may be integrated with a similarly sealed lighting module to provide backup power and optional automatic network configuration and operation throughout an outdoor site in which such light modules are deployed. Combinations of uninterruptible PoE embodiments are also possible, such as a sealed enclosure, stackable embodiment. An application, such as a pump for evacuating water from a construction area may require an uninterruptible PoE that is both sealed and provides long-lasting backup power to ensure power is provided to the pump under harsh weather conditions (e.g., rain storms and the like) that are likely to be occurring when the pump is needed. While specific combinations of outdoor mining and/or construction systems and uninterruptible PoE systems are disclosed, a product designer may select different uninterruptible PoE systems based on other factors, such as cost, weight, size, availability, power density and the like. In embodiments, a designer of a mining system may adapt a design of one or more mining-related electronic systems to more readily accept a wider range of uninterruptible PoE system embodiments.

Figure 11:
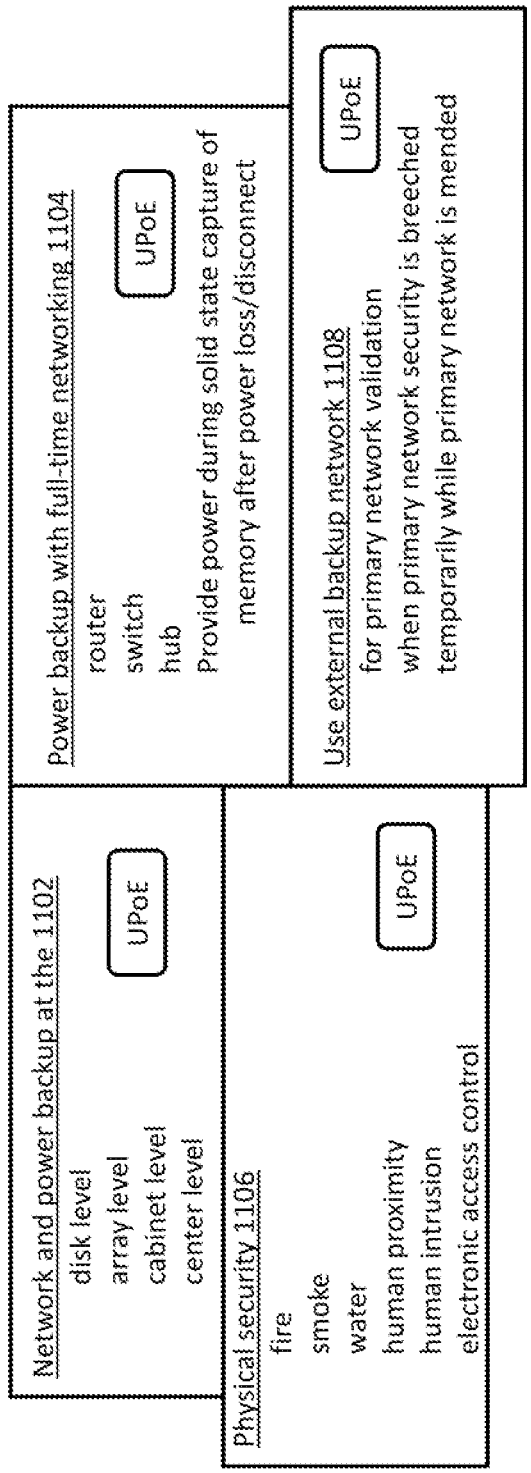
FIG. 11 depicts a block diagram of an enterprise data center environment and related electronic systems for deploying uninterruptible PoE via an injection device.

In embodiments, FIG. 11 depicts an enterprise data center environment 1100. Electronic systems in an enterprise data center environment 1100 may include backup networking and power systems 1102, full networking with backup power 1104, physical security systems 1106, and full network redundancy at a disk level, array level, cabinet/rack level, data center level and the like. Uninterruptible PoE embodiment described herein may provide backup power to data storage devices while acting as a primary source of network connectivity, such as via a mesh network established among uninterruptible PoE devices deployed in the data center. Alternatively, a primary communication system may be connected to an uninterruptible PoE system that provides at least backup power to the primary communication system. Failure of the primary communication system may be overcome through use of the uninterruptible PoE networking capability that includes router, hub, switch, mesh network and other communication functionality. By providing physical safety electronic systems 1106 with uninterruptible power, an uninterruptible PoE system may facilitate ensuring that a data center is protected from fire, smoke, water, and human incursion.

In embodiments, data centers may provide a secure facility for co-locating large data storage devices, often for use with enterprises, cloud computing, regional data access. Data centers may provide network-based (e.g., Internet and the like) access to data for users that may be located proximal to the data center (e.g., users in an adjacent building) as well as users across the world. Both physical and electronic/logical access to information stored in a data center may be restricted through electronic security means that range from perimeter monitoring, physical intrusion detection, fire and other hazard detection/prevention, multiple layers of data access authentication, physical and logical partitioning of data storage systems, and the like. Providing secure access for authenticated users, which may include computer systems that serve many individual users around the clock and year-round may be a crucial requirement of a successful data center. Therefore, ensuring that the electronic systems that provide access, facilitate external users accessing and storing data in the data center, maintaining the integrity of the data stored in the data center, and the like are properly operated under normal and highly abnormal conditions may require additional steps. One such step is to ensure that power to these crucial operating devices is maintained for at least safe shutdown purposes even when primary power is unexpectedly lost or becomes inadequate.

Another such step is to ensure that communications, including internal and external communications continue to be available with essential security measures maintained independent of unexpected disruptions in network access, such as if a physical network connection is disrupted, bandwidth is severely limited, power to networking devices is lost, and the like. This is not to say that 100% of primary power-based devices in a data center must remain operating indefinitely when primary power is lost. In embodiments, safe non-volatile storage means may be employed to capture data from volatile storage, such as computer and networking memories when primary power is lost. In such embodiments, a source of power and a command protocol for ensuring that essential services are maintained while volatile data is safely stored may be provided as part of a security and integrity program for a data center.

Individual data storage devices, groups of devices (e.g., an array or a shelf of a rack of rack-based disk drives), entire racks of devices, and the like may communicate among themselves and with non-data storage devices (e.g., hubs, switches, routers and the like that facilitate access to the individual data storage devices). Also, modularity of storage device architectures and the like, such as racks of devices and the like may be preferred for data centers, such as to facilitate ease of configuration, maintenance, and the like. In embodiments, Ethernet and the like may provide a suitable communication medium for many data center communication applications. Devices, such as the uninterruptible PoE injection type devices with wireless communication backup capabilities, such as those described and depicted herein may provide an integral data center networking function while providing an essential power backup function through its use of an Ethernet power injection architecture. In embodiments, an uninterruptible PoE system that is integrated into or with a network switch, router and the like may be configured into a data center to provide Ethernet-based communication directly to and among disk drives, data storage arrays, and the like. In embodiments, such an uninterruptible PoE system may be configured between each data storage device in a group of such devices and an external network access point; thereby providing network-based access to the devices in the group while providing at least backup power via the Ethernet interface as described herein. In embodiments, such an uninterruptible PoE device may further provide primary power, be a primary point of network switching/routing, and facilitate continuous power and network access independent of primary power to the storage devices and/or other network devices, such as an Internet hub of the data storage system. By automatically switching from a primary power source (if there is a separate power source) when primary power to the data center (or a portion thereof) is lost to the uninterruptible PoE battery packs to provide power to at least a portion of the group of data storage devices, the group of data storage devices may continue to operate properly. By automatically switching from a primary network connection (e.g., an Internet connection hub and the like of the data center) to a secondary network connection that may be activated by the uninterruptible PoE device when network and/or power loss is detected or when its performance is substantively compromised, access to the PoE powered data storage devices may continue to operate with little, if any, noticeable impact. As described herein, secondary network connections may include wireless, mesh-based, cellular, satellite and the like. Mesh-based network connections may automatically be established among uninterruptible PoE devices upon detection of a sustained disruption in primary networking connectivity. Such automatic network configurations, may facilitate establishing at least limited connectivity for performing actions such as, without limitation, completing data access actions that were in progress when the power/network disruption occurred, storing volatile data into non-volatile data storage devices, such as by sending data over the mesh network, facilitating temporary security protocol changes, such as limiting access to certain high value data files, and the like. A mesh-based network of connections among uninterruptible PoE devices may facilitate access to Internet-based external resources (e.g., web servers and the like) by including a device in the mesh that has external communication capability, such as one of the uninterruptible PoE devices that has activated a cellular data connection to external servers, and the like. In this way, any data storage device that is connected to an uninterruptible PoE device as described herein may continue to be powered for at least limited operation and continue to be accessed for user and backup purposes and the like even when power and/or primary communication capabilities of the data center are lost.

In embodiments, data center security further may include physical security, such as from human intrusion and the like. Physical security may include human proximity and/or activity monitors, audio and/or visual capture for actions such as voice and/or facial recognition, keycard access, and other such access limitations. Each of these limitations may require electrical power, communications with other resources, and the like. These and other electrically powered physical security means (e.g., electronic locks on external and internal doors, windows, and the like, facial recognition systems, and the like) may need sufficient electrical power even when a primary source of power is lost or is found to be insufficient. Embodiments of the uninterruptible PoE injection devices described herein may be utilized in data center physical security systems. In embodiments, an uninterruptible PoE device may be integrated with or into a camera system (or even an individual camera that may be configured as one of many in an array of cameras) to provide power and communications functions for the camera even when primary power that may impact the camera and a primary communication system is lost or insufficient. For each such camera system thusly configured, physical security based on the images captured with the camera can continue to be relied upon. It is possible to configure the uninterruptible PoE to ensure that there is no disruption in power to the camera system; thereby leaving open the option of continuously capturing images with the camera while primary power is restored. With little or no disruption in communications, security breaches that may be detected by the camera system can be detected and communicated even when primary power to the camera is lost.

In embodiments, physical security may include monitoring for safety concerns, such as fire, smoke, water, and the like. These types of security devices may be built with a conventional backup dry cell battery that may facilitate continued monitoring of the specific condition (e.g., smoke and the like) to generate an alert and the like. However, by itself a backup dry cell battery does nothing for disruptions in communication from the sensor to a central station or security office. Likewise, life of such dry cell batteries is generally limited to a few hours of continuous use and must be maintained at each such smoke detector. An uninterruptible PoE via an injection device that provides power and communication connectivity to several such devices may facilitate improved fire, smoke, and water safety and security for data centers while ensuring centralized control and monitoring of such devices. In embodiments, a plurality of physical safety devices, such as smoke detectors and the like, may be connected through an Ethernet cable connection that supports providing power to connected devices. An uninterruptible PoE module, such as various embodiments described herein, may be connected via the Ethernet cable with these connected devices, thereby providing power (at least when a primary source of power is lost or inadequate) and communications to the detectors and the like. An uninterruptible PoE device may be configured to source power from a primary source, such as an AC power source when it is available and provide that power to connected devices over Ethernet. This may be provided by the uninterruptible PoE in a controlled way so that when the source of primary power is lost or falls below a sufficiency voltage, the primary source is bypassed and a battery backup source, that may be integrated with or into the uninterruptible PoE device, is accessed to provide power over Ethernet to the connected devices.

In embodiments, data center external data access may be subject to breeches in integrity that may place the data in the data center at risk. By employing an uninterruptible PoE device configured with independent wireless communication functionality (e.g., WiFi, cellular, and the like), integrity of connections with external sources may be validated by establishing a connection to an external source, such as a secure server and the like, and communicating over that connection with the external source to validate the integrity of the primary network connection. By using a different radio means, such as a cellular connection, an uninterruptible PoE system configured to communicate via the cellular connection an intrusion or integrity breech of the primary external network connection may be detected so that appropriate corrective actions can be initiated. The uninterruptible PoE external connection may be utilized instead of the breeched primary connection while the primary connection is mended.

In embodiments, embodiments of an uninterruptible PoE system may be combined with systems deployed in enterprise data storage facility environments, such as data warehouses, web server farms, distributed storage facilities, and the like. The uninterruptible PoE systems may be configured in many different embodiments, including without limitation, circuit board level embodiments, multi-level circuit boards, plug-in blade embodiments, rack-mountable embodiments, modular embodiments, pluggable embodiments, sealed enclosure embodiments, interconnected component embodiments, stackable embodiments, daisy-chained embodiments, and the like. Electronic systems, such as those described herein and generally known to be deployable in enterprise data storage environments may be configured with any of the embodiments of uninterruptible PoE systems as described herein. In an example, a data storage access system may be configured with an operator interface electronic system into which a circuit board embodiment uninterruptible PoE system may be integrated. In another example, a ventilation system may be configured with an electronic control system with which a daisy-chained uninterruptible PoE system may be integrated to, for example, provide greater and longer-lasting backup power that is enabled through daisy-chaining multiple uninterruptible PoE systems. In yet another example, a rack of data storage devices (e.g., disk arrays and the like) may need to be self-sustaining during power outages. Therefore, a rack-mountable uninterruptible PoE system may be integrated into the rack to provide backup power to one or more of the storage devices of the rack. Combinations of uninterruptible PoE embodiments are also possible, such as a sealed enclosure, stackable embodiment. An application, such as a fire safety system may benefit from an uninterruptible PoE that is both sealed and provides long-lasting backup power to ensure power is provided to the fire safety system under conditions such as smoke, heat, and water. While specific combinations of enterprise data systems and uninterruptible PoE systems are disclosed, an enterprise data center designer may select different uninterruptible PoE systems based on other factors, such as cost, weight, size, availability, power density and the like. In embodiments, a designer of an enterprise data center electronic system may adapt a design of one or more data center-related electronic systems to more readily accept a wider range of uninterruptible PoE system embodiments.

In embodiments, environments for electronic surveillance, asset protection and the like may include underwater operations. Assets such oil rigs, bridges, ports and ships moored therein, and the like may be protected by electrically powered monitoring, sensing, and alert devices that may be configured as part of an overall physical security strategy for such assets. However, underwater electronic surveillance and the like present significant environment challenges to product designers and installers. Basic operations such as installing a module, replacing a battery, and the like are more complex and costly than for comparable land-based environments. Submersion in sea water presents additional challenges for products, installers, service and maintenance contractors and the like.

Providing solutions that are not only tolerant of the environment, but that provide long term operation with fewer service calls can make the difference between a successful sale and a lost opportunity. Therefore, solutions, such as submersion capable embodiments of the uninterruptible PoE systems described and depicted herein may provide a substantive advantage to underwater surveillance and security product designers and suppliers.

Figure 12:
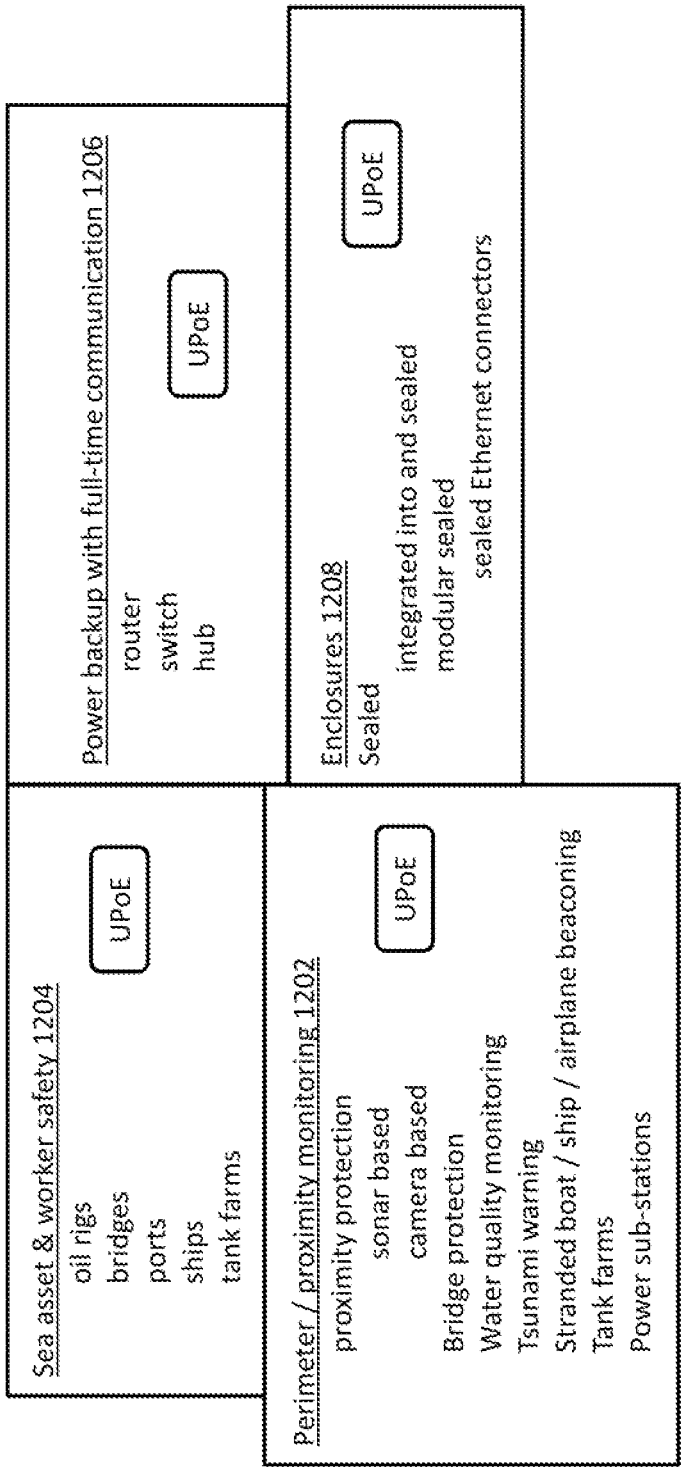
FIG. 12 depicts a block diagram of an underwater environment and related electronic systems for deploying uninterruptible PoE via an injection device.

In embodiments, FIG. 12 depicts an underwater environment 1200 for deploying electronic systems configured with an uninterruptible PoE module that provides at least backup power in the event that a primary power source (e.g., a dry cell) no longer provides sufficient primary power. Functions of an underwater environment 1200 that may benefit from the uninterruptible PoE methods and systems described herein may include perimeter monitoring 1202, sea asset worker safety 1204, full time communication with backup power 1206 and uninterruptible PoE enclosures 1208 that may be suitable for use in an underwater environment. Worker safety on sea assets 1204 may include providing safety features for workers on oil rigs, bridges, ports, ships and the like. Sea asset perimeter and proximity monitoring 1202 may include electronic systems, such as sonars, cameras, and the like. Sea assets may include rigs, bridges, water quality testing, desalination facilities, tsunami warning systems, stranded ship beaconing systems, and the like. In embodiments, the uninterruptible PoE systems configured with communication functionality such as switching, routing, and the like may be deployed to provide communication functionality among underwater systems as well as primary power backup functionality. Electronic systems deployed under water generally are sealed from water and salt incursions. An uninterruptible PoE module may be configured into one of these sealed electronic systems; thereby providing uninterruptible PoE that is independent of water conditions. Alternatively, an uninterruptible PoE module may be configured to be sea-water proof and may include waterproof interconnects for at least Ethernet connections among underwater electronic systems and the like.

In embodiments, underwater security systems may include surveillance systems based on proximity sensing, such as sonar systems, presence/motion detection in captured images (e.g., with an underwater camera and the like) and the like. Detection alone may not be sufficient. A means of communicating with a base station, such as land-based security center and the like may be necessary to ensure a proper assessment of the detected event and appropriate response. If detection or communication fails, proper physical security of an underwater asset may be compromised. Therefore, robust solutions that provide primary and backup capabilities, such as backup power and communication options are often chosen for deployment. An uninterruptible PoE system as described herein may include uninterruptible power and backup communications and may be configured to be submersible.

In an example, an underwater image capture system (e.g., camera) may monitor a hull of a ship while in port. Power to the image capture system may be provided from a primary source, such as an enclosed battery, an external source, such as a land-based source, and the like. When such a system is configured with an uninterruptible PoE as described herein, the primary source may connect to the camera system via the uninterruptible PoE. The uninterruptible PoE may be configured to monitor the primary source of power and, based for example on a measure of quality of the primary source (e.g., a measure of voltage and the like) the uninterruptible PoE may switch from the primary source to a backup source, such as one or more battery packs that may be integrated with the uninterruptible PoE system. In embodiments, the uninterruptible PoE system may be a module that is sealed against water infiltration and the like that may further be integrated with or into the image capture system so that the image capture system may continue to operate independent of the absence of a primary source of power.

In embodiments, uninterruptible PoE systems may be integrated with or into underwater devices, such as perimeter/proximity monitoring devices, devices configured to provide proximity detection and alert for bridges, off-shore platforms, sea ports, and the like. In embodiments, submersible embodiment of uninterruptible PoE systems, such as those described herein may be integrate with or into products that facilitate water quality monitoring, tsunami warning, stranded boater beaconing systems, and the like. Submersible applications that require uninterruptible power may take advantage of suitable embodiments of the uninterruptible PoE systems of the present disclosure by integrating the uninterruptible PoE system into a submersible enclosure and/or by integrating the uninterruptible PoE system in a submersible form with a submersible device and water tight Ethernet connection couplings.

In embodiments, sea-based applications of an uninterruptible PoE may include a range of worker and operations safety and monitoring systems of an oil drilling platform and the like. The harsh environment experienced on an oil drilling platform, may be endured by an embodiment of an uninterruptible PoE system adapted to be water resistant and/or water proof.

In embodiments, embodiments of an uninterruptible PoE system may be combined with systems deployed in underwater environments, such as near ports and the like. The uninterruptible PoE systems may be configured in many different embodiments, including without limitation, circuit board level embodiments, multi-level circuit boards, plug-in blade embodiments, rack-mountable embodiments, modular embodiments, pluggable embodiments, sealed enclosure embodiments, interconnected component embodiments, stackable embodiments, daisy-chained embodiments, and the like. Electronic systems, such as those described herein and generally known to be deployable in underwater environments may be configured with any of the embodiments of uninterruptible PoE systems as described herein. In an example, a proximity detection system may be configured as a water-tight sealed system into which a circuit board embodiment uninterruptible PoE system may be integrated. In another example, a beaconing system may be configured with an electronic control system with which a daisy-chained uninterruptible PoE system may be integrated to, for example, provide greater and longer-lasting backup power that is enabled through daisy-chaining multiple uninterruptible PoE systems. In yet another example, an electronic control for underwater lighting may need to be sealed from the elements. Therefore, a sealed enclosure uninterruptible PoE system may be integrated with a similarly sealed lighting module to provide backup power over Ethernet. Combinations of uninterruptible PoE embodiments are also possible, such as a sealed enclosure, stackable embodiment. An application, such as a pump for evacuating water from a drill hole under a sea-based platform may require an uninterruptible PoE that is both sealed and provides long-lasting backup power to ensure power is provided to the submersible pump. While specific combinations of underwater systems and uninterruptible PoE systems are disclosed, a product designer may select different uninterruptible PoE systems based on other factors, such as cost, weight, size, availability, power density and the like. In embodiments, a designer of an underwater electronic system may adapt a design of one or more submersible electronic systems to more readily accept a wider range of uninterruptible PoE system embodiments.

In embodiments, mobile devices and systems may operate from a portable source of power, such as a battery or other type of energy storage cell. In embodiments, an energy storage cell for a mobile device may be rechargeable, such as from a deployable solar energy collection array. This may provide an enduring source of energy for the mobile device. Mobile devices, such as land vehicles, sea and submersible vehicles, air vehicles (e.g., autonomous dirigibles, drones and the like), companion mobile devices, such as robots and the like, and wearable or mountable devices, such as smart soldier equipment and the like may be configured with primary and secondary sources of power. Multiple sources of power may be included to address primary power source failures, lack of rechargeability (e.g., in deployments where sunlight for recharging is insufficient), extending the operating life of the mobile device, and the like. Weight and size are also considerations for mobile device design.

Figure 13:
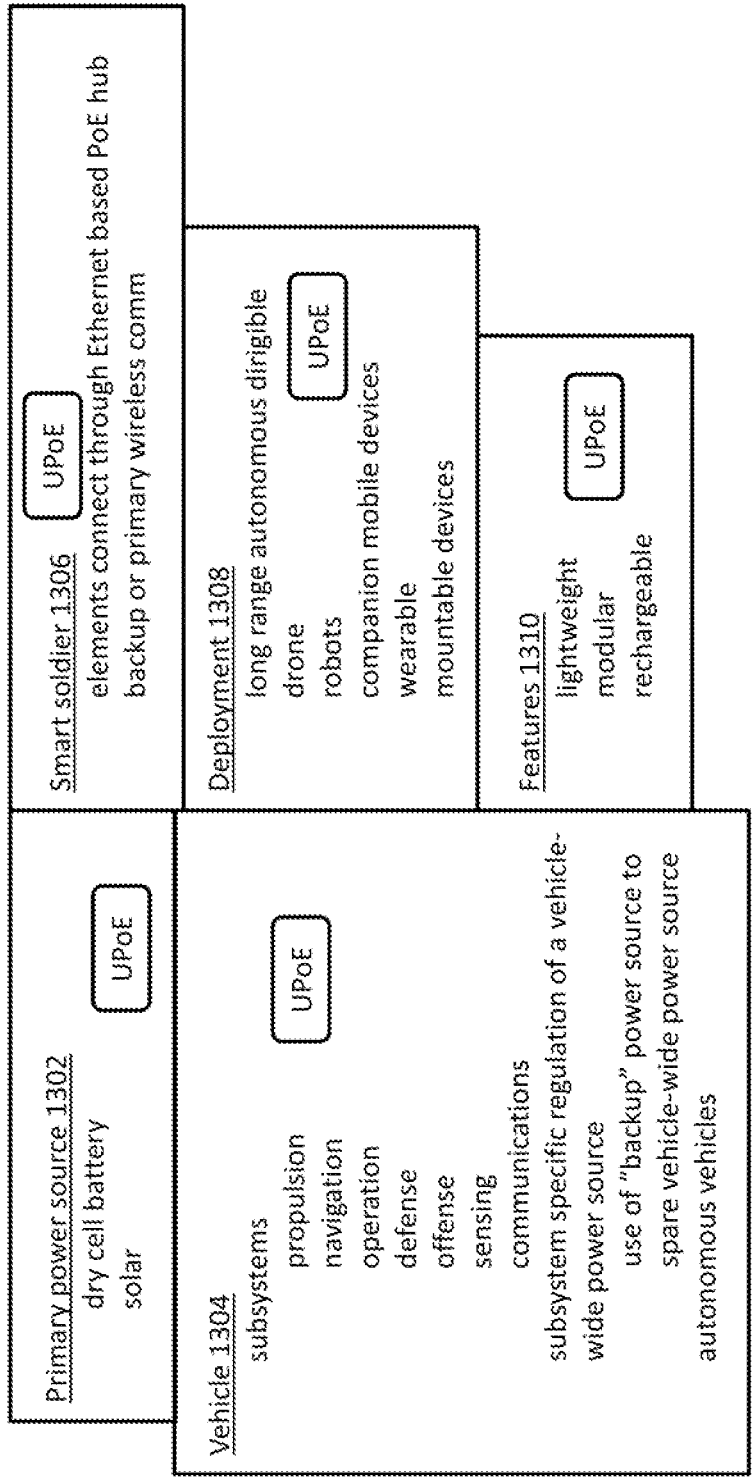
FIG. 13 depicts a block diagram of a mobile device environment and related electronic systems for deploying uninterruptible PoE via an injection device.

In embodiments, FIG. 13 depicts a mobile environment 1300 for deployment of the uninterruptible PoE methods and systems described herein. Mobile environment 1300 electronic systems may be powered from one or more types of primary power sources 1302, such as dry cell batteries, solar collector panels, and the like. Electronic powered systems in a mobile environment 1300 may include vehicles 1304, smart soldier device systems 1306, portable/moveable/transportable devices 1308 and the like. Use of uninterruptible PoE modules for mobile applications may leverage features 1310 of uninterruptible PoE modules, such as light weight systems, modularity, rechargeability and the like. Vehicles in a mobile environment 1300 may be configured with several subsystems that work cooperatively to safely operate in the environment. Each such subsystem, such as vehicle propulsion, navigation, operation, defense, offense, sensing, communication and the like may be configured with one or more uninterruptible PoE modules to facilitate reliable subsystem operation independent of a reliable vehicle-wide primary power source. Smart solder mobile systems 1306 may utilize uninterruptible PoE modules as a centralized power and communication hub for the electronic systems that make up the smart solder mobile system. Alternatively, an uninterruptible PoE module may be integrated with individual smart soldier elements and the like. In embodiments, mobile environment deployments 1308 may support a range of mobile devices including without limitation long range autonomous dirigibles, drones, robots, land-based vehicles, space vehicles, subterranean and submerged vehicles, companion mobility devices, human assist devices, cyborg-like and wearable devices, and the like. For each such deployment 1308, a configuration of an uninterruptible PoE module may be selectable for integration therewith to provide benefits such as continuous power, primary or backup communications and the like.

In embodiments, systems for providing uninterruptible PoE via an injection device with optional communications and other functionality that are described herein may be configurable with a combination of backup capacity, size, and weight that are suitable for many mobile device applications. By providing continuous power to connected devices, while offering full-time or backup communication functions, an uninterruptible PoE module as described herein may be integrated with or into mobile devices such as, without limitation autonomous long range vehicles, such as dirigibles, land-based vehicles, drones, and the like. An autonomous long range vehicle may be configured with several distinct, but operationally integrated sub-systems, such as propulsion, navigation, operation, defense, offense, environment sensing, communications, and the like. Each sub-system may be configured with its own power regulating capability, thereby reducing the need for providing a clean source of primary power throughout the vehicle under all operating conditions. An uninterruptible PoE system as described herein may provide primary power source regulation for use by a vehicle sub-system. Such an uninterruptible PoE system may further enhance power regulation for the vehicle sub-system by monitoring consumption and augmenting or replacing a primary source of power with a battery-based source of power that the uninterruptible PoE controls. In embodiments, when a propulsion system initiates movement of a vehicle, due to the large torque demands of the system, a spike in demand placed on the primary power source may cause it to temporarily drop below an acceptable level for use throughout the vehicle. However, through propulsion systems power demand monitoring and/or cooperative operation of the propulsion system and a coupled uninterruptible PoE system, a vehicle primary power source may be spared during initiation of vehicle propulsion. Instead, a backup source of power, such as from battery packs integrated with the uninterruptible PoE system may be used as a temporary primary power source, either entirely or as a supplement to the primary vehicle power source. The uninterruptible PoE system may include a controller that manages power supplied to the propulsion system, seamlessly moving demand from the primary source to the backup source. Such a controller may be configured to regulate the amount of power demand placed on the primary vehicle power source throughout operation of the propulsion system. Based on circumstances, a primary source of power may be disabled from the propulsion system when, for example that source is required for other critical functions. This may occur when the actual or anticipated demand of the propulsion system may cause the primary source to be insufficient for those other critical functions. In this way, even when a demand for propulsion does not exceed an available amount of primary source power, the vehicle operation may be improved through use of an uninterruptible PoE integrated with or into its propulsion system.

In embodiments, a smart soldier or other wearable technology application may benefit from use of an uninterruptible PoE at least as a source of backup power for the wearable technology elements. In an example, each wearable technology element may come with its own source of power, such as a dry cell battery and the like. The wearable technology elements may be configured to receive power (at least as a backup to a primary power source) over an Ethernet cable. The elements may be connected together via an Ethernet cable that facilitates providing power as well as communication signals. An uninterruptible PoE module may be connected to the Ethernet cable, thereby providing power as needed to any of the wearable elements. The uninterruptible PoE module may monitor communications from each wearable element over the Ethernet cable, detecting when an element indicates that its primary power source is nearing depletion or otherwise cannot provide sufficient power. When such a condition is detected, the uninterruptible PoE module may activate one or more battery modules and route power from them to an Ethernet port to which the affected element is connected. In embodiments, an uninterruptible PoE module connected via an Ethernet cable to the wearable elements may provide communication functions, such as switching, routing, and optional wireless communications functions that the wearable elements may use to communicate externally. In embodiments, one of the wearable elements may be a radio communication device that provides primary wireless communication for the collection of wearable elements. The uninterruptible PoE module may act as a hub that facilitates access by the wearable elements to the radio communication device through the Ethernet cable that connects the uninterruptible PoE module and the wearable elements. In embodiments, the uninterruptible PoE module may be configured with cellular, satellite, and other long-range communication capabilities that may be maintained in a ready state to replace the primary wireless communication functionality in the event that that functionality is compromised or faulty. Such a configured uninterruptible PoE module may automatically route wearable element communication to its backup wireless communication circuits when the primary wireless communication channel is determined to be disabled, faulty, compromised, and/or insufficient for the communication demands of the wearable elements.

In embodiments, embodiments of an uninterruptible PoE system may be combined with systems deployed in mobile environments, such as autonomous vehicles, smart soldier applications and the like. The uninterruptible PoE systems may be configured in many different embodiments, including without limitation, circuit board level embodiments, multi-level circuit boards, plug-in blade embodiments, rack-mountable embodiments, modular embodiments, pluggable embodiments, sealed enclosure embodiments, interconnected component embodiments, stackable embodiments, daisy-chained embodiments, and the like. Electronic systems, such as those described herein and generally known to be deployable in mobile environments may be configured with any of the embodiments of uninterruptible PoE systems as described herein. In an example, a proximity detection system for, example collision avoidance in an autonomous vehicle may be configured as a set of autonomous networked sensors disposed about the perimeter of the vehicle. A circuit board uninterruptible PoE system may be selected to be integrated into or with each sensor, such as to reduce weight while providing essential uninterruptible power to its host sensor. In another example, a beaconing system may be configured into a smart soldier solution with which a daisy-chained uninterruptible PoE system may be integrated to, for example, provide greater and longer-lasting backup power that is enabled through daisy-chaining multiple uninterruptible PoE systems. The beaconing system may be one of a plurality of smart soldier systems connected via Ethernet; thereby potentially receiving uninterruptible PoE from the daisy-chained uninterruptible PoE system. Combinations of uninterruptible PoE embodiments are also possible, such as a sealed enclosure, stackable embodiment. An application, such as a smart soldier air purification apparatus may require an uninterruptible PoE that is both sealed and provides long-lasting backup power to ensure power is provided to the purification apparatus independent of the weather conditions present during use. While specific combinations of mobile systems and uninterruptible PoE systems are disclosed, a product designer may select different uninterruptible PoE systems based on other factors, such as cost, weight, size, availability, power density and the like. In embodiments, a designer of an autonomous vehicle may adapt a design of one or more autonomous vehicle-related electronic systems to more readily accept a wider range of uninterruptible PoE system embodiments.

In embodiments, a system for supplying uninterruptible Power over Ethernet (PoE) via, for example, an injection device may comprise a rechargeable power supply that automatically provides power to connected devices, such as on the DC side, in the event of a loss of primary power to the system. The system for supplying uninterruptible PoE may be integrated with or into a range of products serving industries such as building controls, grid automation, street lighting, networking, power regulation and management, wireless communication via antennas, life and building safety, physical and logical access control, land, sea, and air vehicles including autonomous vehicles, image capture, mapping, voice over IP, automated conversational agents, large scale electrical grid controls and management, electricity generation and others. Uninterruptible PoE solutions for these industries may include modular systems, rack-mountable systems, expandable systems, integrated system, environmentally sealed system, submersible system, and the like including, without limitation, exemplary embodiments of these and other uninterruptible PoE systems described herein. Exemplary suppliers serving these and related commercial and consumer needs include Schneider, Eaton, Cisco, Tripp Lite, Ubiquiti, Tyco-Johnson Controls, Dome Camera, AdTran, Telrad, Alpha Technologies and others.

In embodiments, a system for supplying uninterruptible Power over Ethernet (PoE) via, for example, an injection device may comprise a rechargeable power supply that automatically provides power to connected devices, such as on the DC side, in the event of a loss of primary power to the system may be integrated into or with products from Scheinder serving residential home and outdoor electrical control and comfort needs, building controls, critical power systems (e.g., life support, emergency response, safety, defense, and the like), cooling (e.g., commercial, residential, refrigeration, material stabilization, and the like), industrial automation, grid automation, and the like.

In embodiments, a system for supplying uninterruptible Power over Ethernet (PoE) via, for example, an injection device may comprise a rechargeable power supply that automatically provides power to connected devices, such as on the DC side, in the event of a loss of primary power to the system may be integrated into or with products from Eaton including lighting products, such as the CIMCON line of street, roadway, and utility lighting, wireless Internet of Things (IoT) lights and the like.

In embodiments, a system for supplying uninterruptible Power over Ethernet (PoE) via, for example, an injection device may comprise a rechargeable power supply that automatically provides power to connected devices, such as on the DC side, in the event of a loss of primary power to the system may be integrated into or with products from Cisco including networking data center products such as switches, routers, firewalls and the like and wireless product such as access points, wireless LAN controllers and the like.

In embodiments, a system for supplying uninterruptible Power over Ethernet (PoE) via, for example, an injection device may comprise a rechargeable power supply that automatically provides power to connected devices, such as on the DC side, in the event of a loss of primary power to the system may be integrated into or with products from Trip Lite including, without limitation products that provide uninterruptible power (e.g., Uninterruptible Power Supply (UPS) systems and the like), power distribution systems, surge protectors, KVM branded switches for remote access, console servers, network switches and the like.

In embodiments, a system for supplying uninterruptible Power over Ethernet (PoE) via, for example, an injection device may comprise a rechargeable power supply that automatically provides power to connected devices, such as on the DC side, in the event of a loss of primary power to the system may be integrated into or with products from Ubiquiti including, without limitation, networking products such as mesh routers, teleport devices, dual radio access points, in-wall AC powered WiFi access points, network video cameras, LED panels powered by PoE and the like, powered antennas, legacy routers, legacy switches, and the like.

In embodiments, a system for supplying uninterruptible Power over Ethernet (PoE) via, for example, an injection device may comprise a rechargeable power supply that automatically provides power to connected devices, such as on the DC side, in the event of a loss of primary power to the system may be integrated into or with products from Tyco-Johnson Controls including data center-related products such as Johnson fire suppression systems, HVAC systems, building controls, security and access controls, and Tyco fire safety systems, such as mechanical valves, security systems and the like.

In embodiments, a system for supplying uninterruptible Power over Ethernet (PoE) via, for example, an injection device may comprise a rechargeable power supply that automatically provides power to connected devices, such as on the DC side, in the event of a loss of primary power to the system may be integrated into or with products from Dome Camera including powered camera heads, adapters, such as BNC to HDMI adapters and the like, signal splitters, Ethernet power injectors and the like.

In embodiments, a system for supplying uninterruptible Power over Ethernet (PoE) via, for example, an injection device may comprise a rechargeable power supply that automatically provides power to connected devices, such as on the DC side, in the event of a loss of primary power to the system may be integrated into or with products from AdTran including, without limitation integrated access devices, such as voice products including switch boards, dial plan products, number substation solutions, video products, Internet direct-connect products and the like. Other products from AdTran include fiber network aggregation switches, Optical Network Terminals (ONT), Optical Line Terminals (OLT) including passive and/or active versions for use with Ethernet, AdTran's FFTX line including fiber-to-home, fiber-to-business, fiber-to-desk, fiber-to-tower products, Optical Network Unit (ONU) solutions for home and small business and the like.

In embodiments, a system for supplying uninterruptible Power over Ethernet (PoE) via, for example, an injection device may comprise a rechargeable power supply that automatically provides power to connected devices, such as on the DC side, in the event of a loss of primary power to the system may be integrated into or with products from Telrad including a range of LTE solutions such as LTE base stations (e.g., outdoor mountable enclosed products), LTE network evolved packet core products (e.g., rack mount and outdoor enclosed products), LTE customer presence equipment (e.g., WiMax to TD-LTE and WiFi, and the like).

In embodiments, a system for supplying uninterruptible Power over Ethernet (PoE) via, for example, an injection device may comprise a rechargeable power supply that automatically provides power to connected devices, such as on the DC side, in the event of a loss of primary power to the system may be integrated into or with products from Alpha Technologies for data center power control and distribution including, without limitation DC rack power solutions, indoor seismic tolerant racks, line powering solutions, UPS systems, inverter solutions, and the like.

In embodiments, systems for supplying uninterruptible Power over Ethernet (PoE) via, for example, an injection device may comprise a rechargeable power supply that automatically provides power to connected devices, such as on the DC side, in the event of a loss of primary power to the system may be integrated into or with products that provide access control and security, including combinations thereof. The uninterruptible PoE systems may be integrated into or with systems that perform access control and/or security functions including facial recognition, access control, magnetic locking, intrusion detection, bio-metrics authentication, and the like. An uninterruptible PoE system thusly integrated may ensure uninterrupted power is provided to electronic control systems performing these and other access control and/or security functions independent of primary power availability or suitability.

In embodiments, systems for supplying uninterruptible Power over Ethernet (PoE) via, for example, an injection device may comprise a rechargeable power supply that automatically provides power to connected devices, such as on the DC side, in the event of a loss of primary power to the system may be integrated into or with products in a range of form factors including, without limitation PoE injector, network switch (e.g., a 24 port fully managed layer 3 Ethernet switch and the like), network traffic router, converged bridge/router (e.g., a product that has a powerful processor capable of doing router and bridge/switch functions), rack mountable forms including 19 inch, 22 inch, 40 inch and the like, blade-based for insertion of rack or chassis blade compatible systems, chassis-based forms such as bladed chassis, mountable to portions of a rack including a back bar, integrated with lithium ion batteries, and the like. An uninterruptible PoE system thusly integrated may ensure uninterrupted power is provided to products requiring these and other form factors independent of primary power availability or suitability.

In embodiments, systems for supplying uninterruptible Power over Ethernet (PoE) via, for example, an injection device may comprise a rechargeable power supply that automatically provides power to connected devices, such as on the DC side, in the event of a loss of primary power to the system may be integrated into or with switch products and may provide features including copper ports, ports for Gigabit Interface Converter (CBIC) for use with fiber optics with fully manageable layer 3 and higher capabilities, lithium ion battery power, auto negotiating connections, auto sensing connections to devices, surge protection and regulation and the like. In embodiments, the uninterruptible PoE system may provide injector functions, switch functions or a combination thereof. In embodiments, an integrated uninterruptible PoE system with injector and/or switch functionality and features as described herein may replace rack mount configurations with easily mountable configurations thereby saving costs and environmental demands of a rack system. An uninterruptible PoE system configured with switch features may ensure uninterrupted power is provided to devices connected over Ethernet independent of primary power availability or suitability.

In embodiments, systems for supplying uninterruptible Power over Ethernet (PoE) via, for example, an injection device may comprise a rechargeable power supply that automatically provides power to connected devices, such as on the DC side, in the event of a loss of primary power to the system may be integrated into or with backup power sources including a range of battery types (aluminum-ion, flow battery (e.g., vanadium redox, zinc-bromine, zinc-cerium), lead-acid battery (e.g., deep cycle, VRLA, AGM, gel), glass, lithium air, lithium-ion batteries (e.g., lithium ion lithium cobalt oxide battery (ICR), lithium ion manganese oxide battery (IMR), lithium ion polymer, lithium iron phosphate, lithium-sulfur, lithium-titanate, thin film lithium-ion), magnesium-ion, molten salt, nickel-cadmium, nickel-cadmium battery vented cell type, nickel hydrogen, nickel-iron, nickel metal hydride, low self-discharge nimh, nickel-zinc, organic radical, polymer-based, polysulfide bromide, potassium-ion, rechargeable alkaline, rechargeable fuel, silicon air, silver-zinc, silver calcium, sodium-ion, sodium-sulfur, super iron, ultrabattery, zinc ion, and the like. An uninterruptible PoE system configured with one or more of these battery types may ensure uninterrupted power is provided to devices connected over Ethernet independent of primary power availability or suitability.

In embodiments, systems for supplying uninterruptible Power over Ethernet (PoE) via, for example, an injection device may comprise a rechargeable power supply that automatically provides power to connected devices, such as on the DC side, in the event of a loss of primary power to the system may be integrated into or with backup power sources including a range of clean energy sources including solar, wind power, hydroelectric, biomass, hydrogen, fuel cells, geothermal and the like. Backup power sources may be combined with a rechargeable element, such as a battery and the like to enable use of large scale clean energy sources, such as those listed herein and generally known in the industry, while maintaining a small form factor.

An uninterruptible PoE system configured with one or more of these clean energy backup sources may ensure uninterrupted power is provided to devices connected over Ethernet independent of primary power availability or suitability.

In embodiments, systems for supplying uninterruptible Power over Ethernet (PoE) via, for example, an injection device may comprise a rechargeable power supply that automatically provides power to connected devices, such as on the DC side, in the event of a loss of primary power to the system may be use in a range of applications including without limitation, backup power for electronic systems, meeting clean power needs (e.g., no exhaust or waste from energy production and the like), high reliability power demand uses, powering and backup power for collections of devices, such as a local Ethernet-based network of devices, wearable sensors, and the like, remote power backup of low cost devices that may not justify having built-in backup power, any application of power over Ethernet, wireless (e.g., mobile) applications and the like. Other applications for use of products and technologies for providing uninterruptible PoE may include surveillance sensors and cameras that must operate through primary power outages, such as to provide continuous recording of captured video and/or data backup when a primary network connection to the camera is unavailable. An example of an application of surveillance includes medical marijuana facilities, including without limitation compliance with EDS-MEDSCAN regulations such as ESD-MEDSCAN-072918A and the like.

In embodiments, systems for supplying uninterruptible Power over Ethernet (PoE) via, for example, an injection device may comprise a rechargeable power supply that automatically provides power to connected devices, such as on the DC side, in the event of a loss of primary power to the system may be use in a range of applications including without limitation, security applications. Uninterruptible PoE technology may be applicable for use in emergency communication systems, distributed recipient mass notification systems, mass notification & emergency communications, risk mitigation, aggression detection, predictive prevention, emergency operations procedures, threat & vulnerability assessment/mitigation, Clery Act compliance (e.g., ability to mitigate, record and publicly report acts of violence on school grounds), National Fire Protection Agency—NFPA Compliance (for constant & redundant power for fire detection and alert systems including video, sprinklers, fire detectors, smoke detectors, and the like), Unified Facilities Criteria—UFC Compliance (e.g., for constant & redundant power to facilities systems and the like), International Building Code—IBC Compliance, World Building Design Group —WBDG Compliance, Department of Health code compliance, and the like. An uninterruptible PoE system applied to one or more of these applications may ensure uninterrupted power and, where applicable, backup communications is provided to devices connected over Ethernet independent of primary power availability or suitability.

In embodiments, systems for supplying uninterruptible Power over Ethernet (PoE) via, for example, an injection device may comprise a rechargeable power supply that automatically provides power to connected devices, such as on the DC side, in the event of a loss of primary power to the system may be applied to life safety applications including ensuring that life safety-related systems that generate signals are prioritized to continue to be powered to provide life safety signals. In embodiments, life safety signals may be replicated by an uninterruptible PoE configured to do so, such as by replicating a signal that alerts a third party that primary power to one or more devices has been lost. In embodiments, an uninterruptible PoE system in a life safety application may be configured to provide power to building systems (e.g., elevators, a/c, and the like) independently of power to life safety systems (e.g., emergency lighting and the like). In embodiments, an uninterruptible PoE system in a life safety application may be integrated into life safety systems or may be integrated with a life safety system. In embodiments, an uninterruptible PoE system configured in a life safety application may be configured to be aware of an installation location to facilitate generating a signal when the system is moved from the installation location.

An uninterruptible PoE system configured with one or more of these clean energy backup sources may ensure uninterrupted power is provided to devices connected over Ethernet independent of primary power availability or suitability.

In embodiments, systems for supplying uninterruptible Power over Ethernet (PoE) via, for example, an injection device may comprise a rechargeable power supply that automatically provides power to connected devices, such as on the DC side, in the event of a loss of primary power to the system may be used in mission critical edge device applications including traffic lights, safe city systems, smart city systems, public safety systems, public address systems (e.g., speakers and the like), perimeter devices, on-ship "man overboard" detection and alert systems and the like. An uninterruptible PoE system operating in one or more mission critical edge device deployments may ensure uninterrupted power is provided to devices connected over Ethernet independent of primary power availability or suitability.

In embodiments, systems for supplying uninterruptible Power over Ethernet (PoE) via, for example, an injection device may comprise a rechargeable power supply that automatically provides power to connected devices, such as on the DC side, in the event of a loss of primary power to the system may be used in lighting applications, such as without limitation egress lighting control and/or illumination systems, emergency lighting systems, Power over Ethernet lighting systems, and the like. An uninterruptible PoE system operating in one or more of these lighting deployments may ensure uninterrupted power is provided to devices connected over Ethernet independent of primary power availability or suitability.

In embodiments, systems for supplying uninterruptible Power over Ethernet (PoE) via, for example, an injection device may comprise a rechargeable power supply that automatically provides power to connected devices, such as on the DC side, in the event of a loss of primary power to the system may be applied to entertainment applications including without limitation video production networks (e.g., including those that may be powered over Ethernet), loud speakers, smart speakers (e.g., interactive speakers that can listen and respond), edge network entertainment devices, such as video capture and delivery devices, gaming devices with or without networking. An uninterruptible PoE system operating in one or more entertainment deployments may ensure uninterrupted power is provided to devices connected over Ethernet independent of primary power availability or suitability.

In embodiments, systems for supplying uninterruptible Power over Ethernet (PoE) via, for example, an injection device may comprise a rechargeable power supply that automatically provides power to connected devices, such as on the DC side, in the event of a loss of primary power to the system may be combined with other functionality such as, network switches, radio frequency communications, satellite service, navigation systems, lighting systems and the like. In embodiments, an uninterruptible PoE system may provide backup power over Ethernet and Ethernet traffic switching functionality. In embodiments, an uninterruptible PoE system may provide backup power over Ethernet and RF communications as primary or backup. In embodiments, an uninterruptible PoE system may provide backup power over Ethernet and satellite communication functionality. In embodiments, an uninterruptible PoE system may provide backup power over Ethernet and navigation functionality. In embodiments, an uninterruptible PoE system may provide backup power over Ethernet and lighting functionality, such as by powering an illumination device (e.g., an LED flood light and the like) via Ethernet. An uninterruptible PoE system configured with one or more of a backup battery system and an auxiliary functional sub-system such as a switch, RF communications, satellite, navigation, and lighting functionality may ensure uninterrupted power is used to power the auxiliary functional sub-system independent of primary power availability or suitability.

In embodiments, systems for supplying uninterruptible Power over Ethernet (PoE) via, for example, an injection device may comprise a rechargeable power supply that automatically provides power to connected devices, such as on the DC side, in the event of a loss of primary power to the system may be deployed in environments including airports (e.g., main lobby areas, ground level elevator lobby areas, cashier offices, cashiers locations in food service area, vaults, stairwell exits, computer server room doors, corridors connecting buildings, building entrances and exits, service elevator lobbies, loading docks and dock dumpster areas, all parking lot areas, ground floor mechanical rooms (exterior), and the like).

In embodiments, systems for supplying uninterruptible Power over Ethernet (PoE) via, for example, an injection device may comprise a rechargeable power supply that automatically provides power to connected devices, such as on the DC side, in the event of a loss of primary power to the system may be deployed in environments including hospitals (e.g., pharmacy dispensing windows and waiting areas, inpatient behavioral health outdoor areas, stairwells, exits from floors, units, surgical suites, neo-natal units, behavioral health units, emergency and acute illness observation areas, and the like.

In embodiments, systems for supplying uninterruptible Power over Ethernet (PoE) via, for example, an injection device may comprise a rechargeable power supply that automatically provides power to connected devices, such as on the DC side, in the event of a loss of primary power to the system may be deployed in environments manufacturing, entertainment, public utilities, correctional facilities, military installations, border patrol, local exchange carriers (LEC's), wireless internet service providers (wisp's), multi service offering companies (MSO's), subway stations, arenas/sports complexes, ports, cruise ships, oil rigs/platforms, pharmaceutical manufactures/dispensaries and the like.

Detailed embodiments of the present disclosure are disclosed herein; however, it is to be understood that the disclosed embodiments are merely exemplary of the disclosure, which may be embodied in various forms. Therefore, specific structural and functional details disclosed herein are not to be interpreted as limiting, but merely as a basis for the claims and as a representative basis for teaching one skilled in the art to variously employ the present disclosure in virtually any appropriately detailed structure.

The terms "a" or "an," as used herein, are defined as one or more than one. The term "another," as used herein, is defined as at least a second or more. The terms "including" and/or "having", as used herein, are defined as comprising (i.e., open transition).

While only a few embodiments of the present disclosure have been shown and described, it will be obvious to those skilled in the art that many changes and modifications may be made thereunto without departing from the spirit and scope of the present disclosure as described in the following claims. All patent applications and patents, both foreign and domestic, and all other publications referenced herein are incorporated herein in their entireties to the full extent permitted by law.

The methods and systems described herein may be deployed in part or in whole through a machine that executes computer software, program codes, and/or instructions on a processor. The present disclosure may be implemented as a method on the machine, as a system or apparatus as part of or in relation to the machine, or as a computer program product embodied in a computer readable medium executing on one or more of the machines. In embodiments, the processor may be part of a server, cloud server, client, network infrastructure, mobile computing platform, stationary computing platform, or other computing platform. A processor may be any kind of computational or processing device capable of executing program instructions, codes, binary instructions and the like. The processor may be or may include a signal processor, digital processor, embedded processor, microprocessor or any variant such as a co-processor (math co-processor, graphic co-processor, communication co-processor and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more thread. The thread may spawn other threads that may have assigned priorities associated with them; the processor may execute these threads based on priority or any other order based on instructions provided in the program code. The processor, or any machine utilizing one, may include non-transitory memory that stores methods, codes, instructions and programs as described herein and elsewhere. The processor may access a non-transitory storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer software on a server, client, firewall, gateway, hub, router, or other such computer and/or networking hardware. The software program may be associated with a server that may include a file server, print server, domain server, internet server, intranet server, cloud server, and other variants such as secondary server, host server, distributed server and the like. The server may include one or more of memories, processors, computer readable media, storage media, ports (physical and virtual), communication devices, and interfaces capable of accessing other servers, clients, machines, and devices through a wired or a wireless medium, and the like. The methods, programs, or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers, social networks, and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable media, storage media, ports (physical and virtual), communication devices, and interfaces capable of accessing other clients, servers, machines, and devices through a wired or a wireless medium, and the like. The methods, programs, or codes as described herein and elsewhere may be executed by the client. In addition, other devices required for execution of methods as described in this application may be considered as a part of the infrastructure associated with the client.

The client may provide an interface to other devices including, without limitation, servers, other clients, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements. The methods and systems described herein may be adapted for use with any kind of private, community, or hybrid cloud computing network or cloud computing environment, including those which involve features of software as a service (SaaS), platform as a service (PaaS), and/or infrastructure as a service (IaaS).

The methods, program codes, and instructions described herein and elsewhere may be implemented on a cellular network having multiple cells. The cellular network may either be frequency division multiple access (FDMA) network or code division multiple access (CDMA) network. The cellular network may include mobile devices, cell sites, base stations, repeaters, antennas, towers, and the like. The cell network may be a GSM, GPRS, 3G, EVDO, mesh, or other networks types.

The methods, program codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer-to-peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g. USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or intangible items from one state to another. The methods and systems described herein may also transform data representing physical and/or intangible items from one state to another.

The elements described and depicted herein, including in flowcharts and block diagrams throughout the figures, imply logical boundaries between the elements. However, according to software or hardware engineering practices, the depicted elements and the functions thereof may be implemented on machines through computer executable media having a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers and the like. Furthermore, the elements depicted in the flowchart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps associated therewith, may be realized in hardware, software or any combination of hardware and software suitable for a particular application. The hardware may include a general-purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine-readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, methods described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While the disclosure has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law.

The use of the terms "a" and "an" and "the" and similar referents in the context of describing the disclosure (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiment, method, and examples, but by all embodiments and methods within the scope and spirit of the disclosure.

Any element in a claim that does not explicitly state "means for" performing a specified function, or "step for" performing a specified function, is not to be interpreted as a "means" or "step" clause as specified in 35 U.S.C. § 112(f). In particular, any use of "step of" in the claims is not intended to invoke the provision of 35 U.S.C. § 112(f).\

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

The foregoing disclosure and description of the invention is illustrative and explanatory thereof. Various changes in the details of the illustrated structures, construction and method can be made without departing from the true spirit of the invention.

We claim:

1. A system, comprising:
a primary power supply;
a rechargeable power supply;
a power over Ethernet injector attached to said primary power supply and said rechargeable power supply;

a plurality of electronic premises security system devices connected to the injector so as to power the premises security system devices;

at least one wireless connectivity device of a plurality of wireless connectivity devices that provides Internet connectivity to the plurality of electronic premises security system devices, said at least one wireless connectivity device connected to the injector so as to power said at least one wireless connectivity device;

a primary power monitoring circuit that detects variation in primary power voltage from said primary power supply and generates a primary power fault signal when the variation exceeds a primary power validity voltage range;

a power source control circuit that redirects power provided to the premises security system devices and said at least one wireless connectivity device from primary power to the rechargeable power supply based on the primary power fault signal so as to prevent loss of data;

an Internet connectivity monitoring circuit that detects variation in Internet connectivity of the premises security system devices and generates an Internet connectivity fault signal when the variation in Internet connectivity exceeds a connection fault threshold; and an Internet wireless connectivity control circuit that redirects Internet connectivity provided to the premises security system devices from said at least one wireless connectivity device and another wireless connectivity device of said plurality of wireless connectivity devices responsive to at least one of the primary power fault signal and the Internet connectivity fault signal.

2. The system, according to claim 1, wherein the Internet connectivity monitoring circuit monitors Internet activity over a Local Area Network Internet connection.

3. The system, according to claim 1, wherein the Internet connectivity monitoring circuit monitors Internet activity over a Metropolitan Area Network Internet connection.

4. The system, according to claim 1, wherein the Internet connectivity monitoring circuit monitors Internet activity over a Wide Area Network Internet connection.

5. The system, according to claim 1, wherein said another wireless connectivity device of said plurality of wireless connectivity devices is comprised of a satellite communication interface that is activated responsive to at least one of the primary power fault signal and the Internet connectivity fault signal.

6. The system, according to claim 1, wherein said another wireless connectivity device of said plurality of wireless connectivity devices is comprised of a cellular communication interface that is activated responsive to at least one of the primary power fault signal and the Internet connectivity fault signal.

7. The system, according to claim 1, wherein said at least one wireless connectivity device provides network connectivity by at least one of a cellular network, a Bluetooth™ network, an 802.11 WiFi network, and an orbital satellite.

8. The system, according to claim 1, wherein said at least one wireless connectivity device is comprised of a removable internal card and a pluggable external adapter.

9. The system, according to claim 1, further comprising:
a network switch that facilitates routing at least a portion of the premises security system devices of the plurality of premises security system devices to at least one of other premises security system devices of the plurality of premises security system devices, the wireless connectivity device, and a primary wired external network port.

10. The system, according to claim 1, further comprising:
an interface connected to the injector.

11. The system, according to claim 1, further comprising:
a pluggable transceiver port.

12. The system, according to claim 1, further comprising:
a pluggable transceiver port that comprises at least one of compact SFP, SFP, SFP+, and SFP28.

13. The system, according to claim 1, further comprising:
an Optical Network Terminal interface.

14. The system, according to claim 1, further comprising:
a processor operated by system firmware and connected to the injector, wherein the system firmware is programmable without interrupting automatically providing power to the plurality of premises security system devices.

15. The system, according to claim 1, further comprising:
a daisy-chain interface that facilitates synchronizing power maintenance and shutdown modes systems connected to the daisy-chain.

16. The system, according to claim 14, further comprising:
an interface connected to the processor that facilitates connecting a plurality of processor-controlled power capsules that provide a user-configurable amount of backup power available to the connected devices.

\* \* \* \* \*